(12) United States Patent
Lee et al.

(10) Patent No.: US 12,193,295 B2
(45) Date of Patent: Jan. 7, 2025

(54) DISPLAY APPARATUS AND MULTI-SCREEN DISPLAY APPARATUS INCLUDING THE SAME

(71) Applicant: LG Display Co., Ltd., Seoul (KR)

(72) Inventors: KwonHyung Lee, Paju-si (KR); DaeYun Han, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 456 days.

(21) Appl. No.: 17/562,252

(22) Filed: Dec. 27, 2021

(65) Prior Publication Data

US 2022/0208945 A1 Jun. 30, 2022

(30) Foreign Application Priority Data

Dec. 31, 2020 (KR) .................. 10-2020-0189728

(51) Int. Cl.
*H10K 59/131* (2023.01)

(52) U.S. Cl.
CPC .............................. *H10K 59/1315* (2023.02)

(58) Field of Classification Search
CPC .. H10K 59/1315; H10K 59/18; H01L 27/124; H01L 27/156; G09F 9/3023
See application file for complete search history.

(56) References Cited

U.S. PATENT DOCUMENTS

| | | | |
|---|---|---|---|
| 4,183,629 A | 1/1980 | Nishimura et al. | |
| 10,935,828 B2 | 3/2021 | Jeong et al. | |
| 2011/0157039 A1 | 6/2011 | Shin et al. | |
| 2016/0013436 A1 | 1/2016 | Im et al. | |
| 2017/0288010 A1 | 10/2017 | Han et al. | |
| 2018/0114820 A1 | 4/2018 | Shim et al. | |
| 2018/0269269 A1 | 9/2018 | Kim et al. | |
| 2019/0006335 A1* | 1/2019 | Lee | H01L 25/162 |
| 2020/0091446 A1 | 3/2020 | Seo et al. | |
| 2020/0203235 A1 | 6/2020 | Jung et al. | |

FOREIGN PATENT DOCUMENTS

| | | |
|---|---|---|
| KR | 10-2013-0059375 A | 6/2013 |
| KR | 10-2013-0109350 A | 10/2013 |
| KR | 10-2016-0093179 A | 8/2016 |
| KR | 10-2017-0054654 A | 5/2017 |
| KR | 10-2018-0002099 A | 1/2018 |
| KR | 10-2018-0079080 A | 7/2018 |
| KR | 10-2019-0044015 A | 4/2019 |
| TW | 201841105 A | 11/2018 |

\* cited by examiner

*Primary Examiner* — Nelson Garces
(74) *Attorney, Agent, or Firm* — Seed IP Law Group LLP

(57) ABSTRACT

A display apparatus comprises a display area including a plurality of pixels arranged at a first substrate along a first direction and a second direction crossing the first direction, a plurality of pixel driving lines disposed in the display area and coupled to the plurality of pixels, an insulation layer covering the plurality of pixel driving lines, and a first pad part disposed over the insulation layer and electrically coupled to the plurality of pixel driving lines, wherein the first pad part comprises a plurality of first pads electrically coupled to each of the plurality of pixel driving lines through a contact hole formed at the insulation layer, and a plurality of secondary pads respectively covering the plurality of first pads.

20 Claims, 15 Drawing Sheets

DISPLAY APPARATUS AND MULTI-SCREEN DISPLAY APPARATUS INCLUDING THE SAME

CROSS-REFERENCE TO RELATED APPLICATIONS

This application claims the benefit of the Korean Patent Application No. 10-2020-0189728 filed on Dec. 31, 2020, which is hereby incorporated by reference as if fully set forth herein.

BACKGROUND

Technical Field

The present disclosure relates to a display apparatus and a multi-screen display apparatus including the same.

Description of the Related Art

Recently, with the advancement of multimedia, the importance of display apparatuses is increasing. Therefore, display apparatuses such as liquid crystal display (LCD) apparatuses, organic light emitting display apparatuses, and light emitting diode display apparatuses are being commercialized.

Display apparatuses have good characteristics such as thinness, lightness, and low power consumption, and thus, are being widely used as a display screen for televisions (TVs), notebook computers, and monitors as well as portable electronic devices such as electronic notebooks, e-books, portable multimedia players (PMPs), navigation devices, ultra-mobile personal computers (PCs), mobile phones, smartphones, smartwatches, tablet personal computers (PCs), watch phones, and mobile communication terminals.

Display apparatuses may include a display panel which includes a plurality of pixels including a thin film transistor (TFT) coupled to a data line and a gate line, a data driving circuit for supplying a data voltage to the data line, and a gate driving circuit for supplying a scan signal to the gate line. The display panel may include a display area which includes the plurality of pixels for displaying an image and a bezel area which surrounds the display area.

A display apparatus of the related art may need a bezel (or a mechanism) for covering a bezel area disposed at a border (or a periphery portion) of a display panel, and due to this, a width of the bezel may increase.

Recently, multi-display apparatuses have been commercialized where a large screen is implemented by arranging a plurality of display apparatuses as a lattice type.

However, in a multi-display apparatus of the related art, a boundary portion such as a seam is formed between adjacent display apparatuses due to a bezel area or a bezel of each of a plurality of display apparatuses. The boundary portion causes a sense of disconnection (or discontinuity) of an image when one image is being displayed on a total screen of the multi-display apparatus, and due to this, the immersion of a viewer watching the image is reduced.

BRIEF SUMMARY

Accordingly, the present disclosure is directed to providing a display apparatus and a multi-screen display apparatus including the same that substantially obviate one or more problems due to limitations and disadvantages of the related art.

An aspect of the present disclosure is directed to providing a display apparatus and a multi-screen display apparatus including the same, which have a width of a zero bezel.

Additional advantages and features of the disclosure will be set forth in part in the description which follows and in part will become apparent to those having ordinary skill in the art upon examination of the following or may be learned from practice of the disclosure.

The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, a display apparatus comprises a display area including a plurality of pixels arranged at a first substrate along a first direction and a second direction that is different from the first direction, a plurality of pixel driving lines disposed in the display area and coupled respectively to the plurality of pixels, an insulation layer covering the plurality of pixel driving lines, and a first pad part disposed over the insulation layer and electrically coupled to the plurality of pixel driving lines, respectively, wherein the first pad part comprises a plurality of first pads electrically coupled to each respective pixel driving line of the plurality of pixel driving lines through respective contact holes formed in the insulation layer, and a plurality of secondary pads respectively covering the plurality of first pads.

In another aspect of the present disclosure, a multi-screen display apparatus comprises a plurality of display devices disposed along at least one direction of a first direction and a second direction that is different from the first direction, each of the plurality of display devices comprises a display apparatus, the display apparatus comprises a display area including a plurality of pixels arranged at a first substrate along the first direction and/or the second direction, a plurality of pixel driving lines disposed in the display area and coupled respectively to the plurality of pixels, an insulation layer covering the plurality of pixel driving lines, and a first pad part disposed over the insulation layer and electrically coupled to the plurality of pixel driving lines, respectively, wherein the first pad part comprises a plurality of first pads electrically coupled to each respective pixel driving line of the plurality of pixel driving lines through respective contact holes formed in the insulation layer, and a plurality of secondary pads respectively covering the plurality of first pads.

Some embodiments of the present disclosure may provide a display apparatus, having a no bezel width, a minimized bezel width or an air bezel structure, and a multi-screen display apparatus including the display apparatus.

According to some embodiments of the present disclosure, because the display apparatus includes a secondary pad electrically coupled to a first pad, a substantial length or area of each of first pads may extend through the secondary pad, and thus, a contact area between the first pad and a routing line may increase in the air bezel structure, thereby preventing a contact defect between the first pad and the routing line.

Some embodiments of the present disclosure may provide a display apparatus and a multi-screen display apparatus including the same, which may display an image without a sense of discontinuity in displaying one image on a whole screen.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

DETAILED DESCRIPTION

Figure 1:
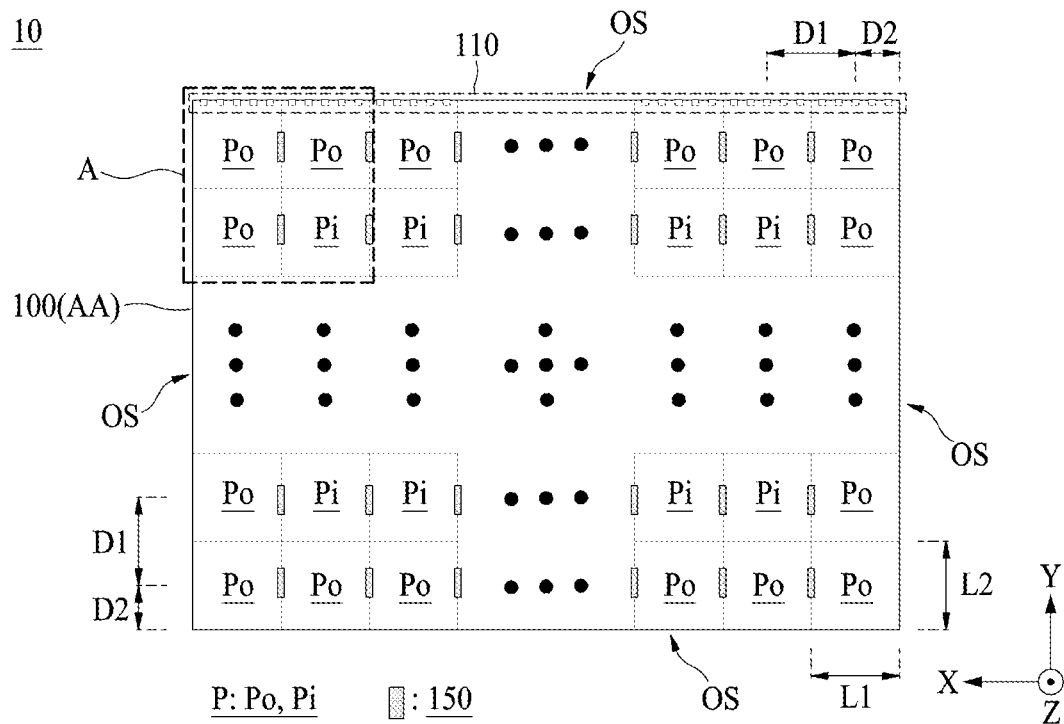
FIG. 1 is a plan view illustrating a display apparatus according to an embodiment of the present disclosure.

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the embodiments of the present disclosure are not limited to the illustrated details. Same reference numerals refer to same elements throughout. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case which is not continuous may be included unless a more limiting term, such as "just," "immediate(ly)," or "direct(ly)" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "coupled to" another element or layer, it may be directly on or directly coupled to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

The term "surround" as used herein includes at least partially surrounding as well as entirely surrounding one or more of the associated elements. Similarly, the term "cover" as used herein includes at least partially covering as well as entirely covering one or more of the associated elements. For example, if an encapsulation layer surrounds a dam portion, this may be construed as the encapsulation layer at least partially surrounding the dam portion. However, in some embodiments, the encapsulation layer may entirely surround the dam portion. The meaning in which the term "surround" is used herein may be further specified based on the associated drawings and embodiments. In the present disclosure, the terms "surround," "at least partially surround," "completely surround" or the like is used. In accordance with the definition of "surround" as set forth above, when only the term "surround" is used in an embodiment, it may mean either at least partially surrounding or entirely surrounding one or more of the associated elements. The same applies for the term "cover."

Features of various embodiments of the present disclosure may be partially or overall coupled to or combined with each other, and may be variously inter-operated with each other and driven technically as those skilled in the art may sufficiently understand. The embodiments of the present disclosure may be carried out independently from each other, or may be carried out together with in co-dependent relationship.

Hereinafter, embodiments of the present disclosure will be described in detail with reference to the accompanying drawings. In adding reference numerals to elements of each of the drawings, although the same elements are illustrated in other drawings, like reference numerals may refer to like elements. Also, for convenience of description, a scale of each of elements illustrated in the accompanying drawings differs from a real scale, and thus, is not limited to a scale illustrated in the drawings.

FIG. 1 is a plan view illustrating a display apparatus according to an embodiment of the present disclosure.

Referring to FIG. 1, the display apparatus (or a display panel) 10 according to an embodiment of the present disclosure may include a first substrate 100 including a display area AA, a plurality of pixels P in the display area AA of the first substrate 100, and a first pad part 110. The first substrate 100 may be referred to as a display substrate, a base substrate, or a pixel array substrate. The first substrate 100 may include a glass material or a plastic material. For example, the first substrate 100 may be a glass substrate, or may be a thin glass substrate or a plastic substrate, which is bendable or flexible.

The display area AA of the first substrate 100 may be an area which displays an image and may be referred to as an active portion, an active area, a display portion, or a display screen. A size of the display area AA may be the same as or substantially the same as the first substrate 100 (or the display apparatus or the display panel). For example, the size of the display area AA may be the same as the total size of the first surface of the first substrate 100. The size can be considered in one embodiment an area that is defined in terms of the length and the width of an structure, such as the display area or the substrate. Therefore, the display area AA may be implemented (or disposed) on the whole front surface of the first substrate 100, even to the very edges, and thus, the first substrate 100 will not include an opaque non-display area along a periphery portion (or an edge portion) of the first surface that would otherwise surround all of the display area AA. Accordingly, a whole front surface of the display apparatus may implement the display area AA. In this embodiment, the display area and the substrate area are the same size and shape. Namely, they have the same width and length as each other.

An end portion (or an outermost portion) of the display area AA may overlap or may be substantially aligned with the outer surface OS of the first substrate 100. For example, with respect to a thickness direction Z of the display apparatus, a lateral surface (or an end line) of the display area AA may be substantially aligned at a vertical extension line VL (see FIG. 7) vertically extending from the outer surface OS of the first substrate 100. In one embodiment, the lateral surface of the display area AA may not be surrounded by a separate mechanism and may only be abutting ambient air. For example, all lateral surfaces of the display area AA may be provided in a structure which directly contacts air without being surrounded by a separate structure or mechanism. Therefore, the outer surface OS of the first substrate 100 corresponding to the end portion of the display area AA may be surrounded by only air (or abutting ambient air), and thus, the display apparatus according to an embodiment of the present disclosure may have no bezel at all, or what might be called an air-bezel structure or a non-bezel structure where the end portion (or lateral surface) of the display area AA is surrounded by air and there is no opaque non-display area surrounding the display AA.

The plurality of pixels P may be arranged (or disposed) at the display area AA of the first substrate 100 to have the first interval D1 along a first direction X and a second direction Y. For example, the first direction X may be traverse to (or intersect or cross) the second direction Y. The first direction X may be a widthwise direction, a horizontal direction, or a first length direction (for example, a widthwise length direction) of the first substrate 100 or the display apparatus. The second direction Y may be a heightwise, a lengthwise direction, a vertical direction, or a second length direction (for example, a lengthwise length direction) of the first substrate 100 or the display apparatus.

Each of the plurality of pixels P may be implemented on a plurality of pixel areas defined on the display area AA of the first substrate 100. Each of the plurality of pixels P may have a first length L1 parallel to the first direction X and a second length L2 parallel to the second direction Y. The first length L1 may be the same as the second length L2 or the first interval D1. The first length L1 and the second length L2 may be the same as the first interval D1. Therefore, the plurality of pixels (or pixel areas) P may all have the same size. For example, the first length L1 can be referred to as a first width, a widthwise length, or a widthwise width. The second length L2 can be referred to as a second width, a height, a lengthwise length, or a lengthwise width.

Two pixels P adjacent to each other along the first direction X and the second direction Y may have the same first interval D1 within an error range of a manufacturing process. The first interval D1 may be a pitch (or a pixel pitch) between two adjacent pixels P. For example, the first length L1 or the second length L2 of the pixel P may be referred to as the pixel pitch. For example, the first interval (or the pixel pitch) D1 may be a distance (or a length) between center portions of two adjacent pixels P. For example, the first interval (or the pixel pitch) D1 may be a shortest distance (or a shortest length) between center portions of two adjacent pixels P.

Each of the plurality of pixels P according to an embodiment may be include a circuit layer including a pixel circuit implemented in the pixel area of the first substrate 100, and a light emitting device layer disposed at the circuit layer and coupled to the pixel circuit. The pixel circuit outputs a data current corresponding to the data signal in response to the data signal and the scan signal supplied from the pixel driving lines disposed in the pixel area. The light emitting device layer may include a light emitting layer that emits light by the data current supplied from the pixel circuit. The pixel driving lines, the pixel circuit, and the light emitting device layer will be described below.

The plurality of pixels P may be grouped (or classified) as outermost pixels Po and internal pixels (or inner pixels) Pi.

The outermost pixels Po may be pixels disposed closest to the outer surface OS of the first substrate 100 among the plurality of pixels P.

A second interval D2 between a center portion of each of the outermost pixels Po and the outer surface OS of the first substrate 100 may be half or less of the first interval D1. For example, the second interval D2 may be a distance (or a length) between a center portion of the outermost pixel area PAo (see FIG. 3) and the outer surface OS of the first substrate 100. For example, the second interval D2 may be a shortest distance (or a shortest length) between a center portion of the outermost pixel area PAo and the outer surface OS of the first substrate 100.

When the second interval D2 is greater than half of the first interval D1, the first substrate 100 may have a greater size than the display area AA by a difference area between half of the first interval D1 and the second interval D2, and thus, an area between the end of the outermost pixel Po and the outer surface OS of the first substrate 100 may be configured as a non-display area surrounding all of the display area AA. For example, when the second interval D2 is greater than half of the first interval D1, the first substrate 100 may necessarily include a bezel area based on a non-display area surrounding all of the display area AA. On the other hand, when the second interval D2 is half or less of the first interval D1, the end of each of the outermost pixels Po may be aligned (or disposed) with the outer surface OS of the first substrate 100, or the end portion of the display area AA may be aligned (or disposed) with the outer surface OS of the first substrate 100, and thus, the display area AA may be implemented (or disposed) on the whole front surface of the first substrate 100.

The internal pixels Pi may be pixels other than the outermost pixels Po among the plurality of pixels P, or may be pixels surrounding by the outermost pixels Po among the plurality of pixels P. The internal pixels (or second pixels) Pi may be implemented to have a configuration or a structure, which differs from the outermost pixels (or first pixels) Po.

The first pad part 110 may be a first pad part or a front pad part. The first pad part 110 may include a plurality of pads to receive a data signal, a gate control signal, a pixel driving power, a reference voltage, and a pixel common voltage, or the like from the driving circuit part.

The first pad part 110 may be included within an area that also includes the outmost pixels Po disposed at a first periphery portion of the first surface of the first substrate 100 parallel to the first direction X. Each of the pixels Po is therefore considered an outermost pixel since within their respective row and/or column of pixels, they are the outmost of the pixels. The outermost pixels Po disposed at the first periphery portion of the first substrate 100 may include at least one of the plurality of pads within their pixel area. Therefore, the plurality of pads may be disposed or included within the display area AA, and thus, a non-display area (sometimes called a bezel area) based on the first pad part 110 may not be formed or may not be on the first substrate 100. Therefore, the outermost pixel (or first pixels) Po may include the first pad part 110, and thus, may be implemented to have a configuration or a structure, which differs from the internal pixel (or second pixels) Pi which include no the first pad part 110.

According to a different embodiment, when the first pad part 110 is not provided within the outermost pixels Po and is disposed between the outermost pixels Po and the outer surface OS of the first substrate 100, the first substrate 100 may include a non-display area (or a non-display portion) corresponding to an area where the first pad part 110 is provided, and due to the non-display area, the second interval D2 between the outermost pixels Po and the outer surface OS of the first substrate 100 may be greater than half of the first interval D1, all of the first substrate 100 may not be implemented as the display area AA, and a separate bezel (or a separate structure) for covering the non-display area may be present. On the other hand, the first pad part 110 according to at least one embodiment of the present disclosure may be implemented to be included within the outermost pixels Po, and thus, a non-display area based on the first pad part 110 is not formed or may not be between the outermost pixels Po and the outer surface OS of the first substrate 100. Therefore, the display apparatus according to an embodiment of the present disclosure may have no bezel at all, or what might be termed an air-bezel structure where a whole first substrate 100 including the first pad part 110 is implemented as the display area AA, and thus, all outer surfaces (or outer surfaces of the display panel) OS of the first substrate 100 aligned with an end of the display area AA are surrounded by air.

The first pad part 110 according to an embodiment may include first pixel driving power pads, first data pads, first reference voltage pads, first gate pads, and first pixel common voltage pads, but embodiments of the present disclosure are not limited thereto.

The display apparatus according to an embodiment may further include a gate driving circuit 150 which is disposed in the display area AA.

The gate driving circuit 150 may be disposed in the display area AA to supply a scan signal (or a gate signal) to the each respective pixel P disposed on the first substrate 100. The gate driving circuit 150 may simultaneously supply the scan signal to all pixels P disposed in a horizontal line parallel to the first direction X. For example, the gate driving circuit 150 may supply at least one scan signal to all pixels P disposed in one horizontal line through at least one gate line GL (see FIG. 3).

The gate driving circuit 150 according to an embodiment may be implemented with a shift register including a plurality of stage circuit units. That is, the display apparatus according to an embodiment of the present disclosure may include a shift register which is disposed at the display area AA of the first substrate 100 to supply the scan signal to the pixel P.

Each of the plurality of stage circuit units may include a plurality of branch circuits which are arranged spaced apart from one another in each horizontal line of the first substrate 100 in a first direction X. Each of the plurality of branch circuits may include at least one thin film transistor (TFT) (or branch TFT) and may be disposed between two adjacent pixels of one or more pixels P (or a pixel area) in one horizontal line in the first direction X. Each of the plurality of stage circuit units may generate a scan signal through driving of the plurality of branch circuits based on a gate control signal supplied through gate control lines disposed spaced apart from one another between a plurality of pixels P in the display area AA and may supply the scan signal to pixels P arranged in a corresponding horizontal line.

Figure 2A:
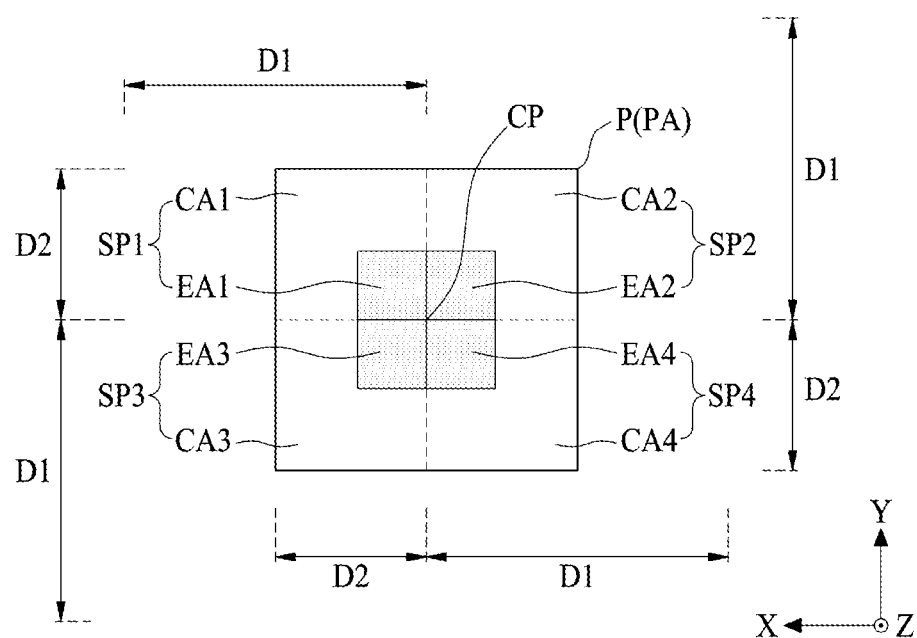
FIG. 2A is a diagram illustrating one pixel according to an embodiment of the present disclosure illustrated in FIG. 1.
Figure 2B:
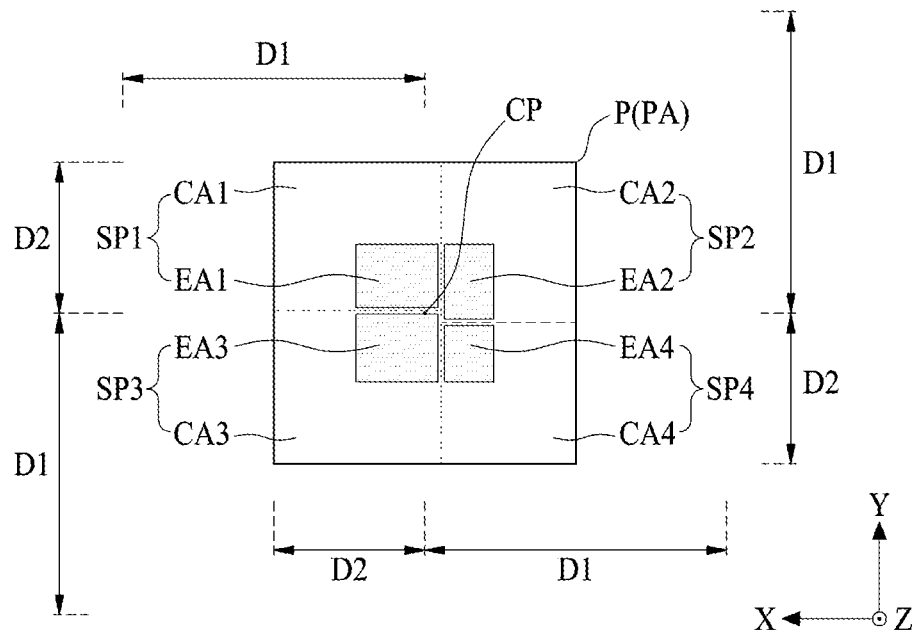
FIG. 2B is a diagram illustrating one pixel according to another embodiment of the present disclosure illustrated in FIG. 1.
Figure 2C:
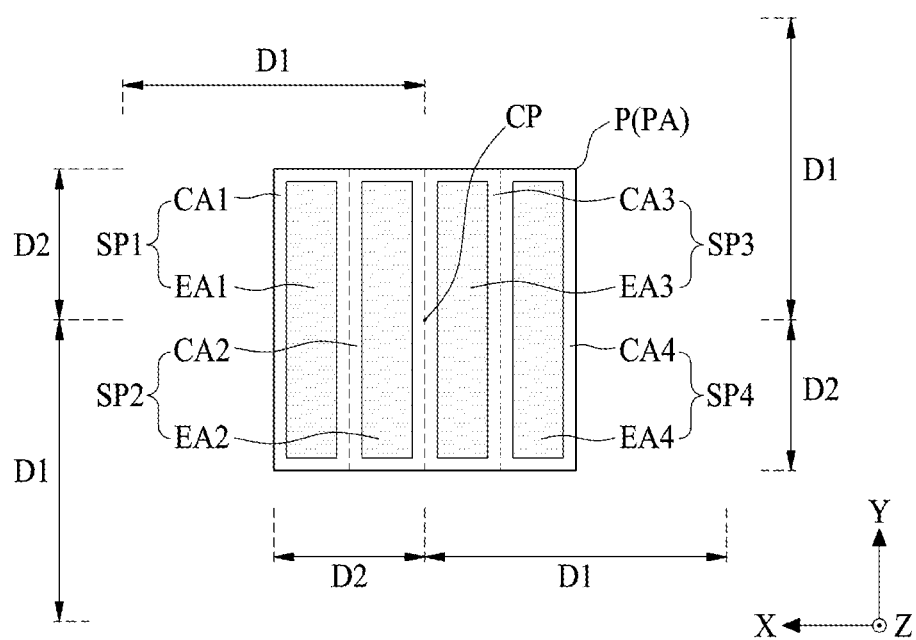
FIG. 2C is a diagram illustrating one pixel according to another embodiment of the present disclosure illustrated in FIG. 1.

FIG. 2A is a diagram illustrating one pixel according to an embodiment of the present disclosure illustrated in FIG. 1, FIG. 2B is a diagram illustrating one pixel according to another embodiment of the present disclosure illustrated in FIG. 1, and FIG. 2C is a diagram illustrating one pixel according to another embodiment of the present disclosure illustrated in FIG. 1.

Referring to FIGS. 1 and 2A, one pixel (or a unit pixel) P according to an embodiment of the present disclosure may include first to fourth subpixels SP1 to SP4.

The first subpixel SP1 may be disposed in a first subpixel area of the pixel area PA, the second subpixel SP2 may be disposed in a second subpixel area of the pixel area PA, the third subpixel SP3 may be disposed in a third subpixel area of the pixel area PA, and the fourth subpixel SP4 may be disposed in a fourth subpixel area of the pixel area PA.

The first to fourth subpixels SP1 to SP4 according to an embodiment may be disposed in a 2×2 form or a quad structure. The first to fourth subpixels SP1 to SP4 may each include a plurality of emission areas EA1 to EA4 and a plurality of circuit areas CA1 to CA4. For example, the emission areas EA1 to EA4 may be referred to as an opening area, an opening portion, or an emission portion.

The emission areas EA1 to EA4 of each of the first to fourth subpixels SP1 to SP4 may have a uniform quad structure to have a square shape having the same size (or same area). According to an embodiment, each of the emission areas EA1 to EA4 having a uniform quad structure may be disposed close to a center portion CP of the pixel P within a corresponding subpixel area to have a size which is less than each of four equal division regions of the pixel P or may be disposed to be concentrated at the center portion CP of the pixel P. According to another embodiment, each of the emission areas EA1 to EA4 having a uniform quad structure may be disposed at the center portion CP of the corresponding subpixel area to have a size which is less than each of four equal division regions of the pixel P.

Referring to FIGS. 1 and 2B, each of the first to fourth subpixels SP1 to SP4 according to another embodiment may have a non-uniform quad structure having different sizes. For example, each of the emission areas EA1 to EA4 of each of the first to fourth subpixels SP1 to SP4 may have a non-uniform quad structure having different sizes.

A size of each of the first to fourth subpixels SP1 to SP4 having a non-uniform quad structure may be set based on a resolution, emission efficiency, or image quality. According to another embodiment, when the emission areas EA1 to EA4 have a non-uniform quad structure, among the emission areas EA1 to EA4 of the first to fourth subpixels SP1 to SP4, the emission area EA4 of the fourth subpixel SP4 may have a smallest size, and the emission area EA3 of the third subpixel SP3 may have a largest size. For example, each of the emission areas EA1 to EA4 of each of the first to fourth subpixels SP1 to SP4 having a non-uniform quad structure may be disposed to be concentrated around (or near) the center portion CP of the pixel P.

Referring to FIGS. 1 and 2C, each of the first to fourth subpixels SP1 to SP4 according to another embodiment may have a 1×4 form or a uniform stripe structure. For example, the emission areas EA1 to EA4 of the first to fourth subpixels SP1 to SP4 may have a 1×4 form or a uniform stripe structure.

The emission areas EA1 to EA4 of the first to fourth subpixels SP1 to SP4 having the uniform stripe structure may each have a rectangular shape which includes a short side parallel to the first direction X and a long side parallel to the second direction Y.

According to an embodiment, each of the emission areas EA1 to EA4 having the uniform stripe structure may be disposed close to a center portion CP of the pixel P within a corresponding subpixel area to have a size which is less than each of four equal division regions of the pixel P or may be disposed to be concentrated at the center portion of the pixel P.

According to another embodiment, each of the emission areas EA1 to EA4 having the uniform stripe structure may be disposed at center portion CP of the corresponding subpixel area to have a size which is less than each of four equal division regions of the pixel P.

According to another embodiment, each of the emission areas EA1 to EA4 having the uniform stripe structure may be disposed at the whole corresponding subpixel area to have the same size as each of four equal division regions of the pixel P.

Alternatively, each of the emission areas EA1 to EA4 of each of the first to fourth subpixels SP1 to SP4 may have a non-uniform stripe structure having different sizes. According to an embodiment, when the emission areas EA1 to EA4 have a non-uniform stripe structure, among the emission areas EA1 to EA4 of the first to fourth subpixels SP1 to SP4, the emission area EA4 of the fourth subpixel SP4 may have a smallest size, and the emission area EA3 of the third subpixel SP3 may have a largest size, but embodiments of the present disclosure are not limited thereto.

Referring to FIGS. 2A and 2B, the circuit areas CA1 to CA4 of each of the first to fourth subpixels SP1 to SP4 may be disposed around (or near) a corresponding emission area of the emission areas EA1 to EA4. Each of the circuit areas CA1 to CA4 may include a pixel circuit and pixel driving lines for emitting a corresponding subpixel of the first to fourth subpixels SP1 to SP4. For example, the circuit areas CA1 to CA4 may be referred to as a non-emission area, a non-opening area, a non-emission portion, a non-opening portion, or a periphery portion.

Alternatively, in order to increase an aperture ratio of the subpixels SP1 to SP4 corresponding to sizes of the emission areas EA1 to EA4 or decrease the pixel pitch D1 as a resolution of the pixel P is higher, the emission areas EA1 to EA4 of the first to fourth subpixels SP1 to SP4 may extend to the circuit areas CA1 to CA4 to overlap some or all of the circuit areas CA1 to CA4. For example, since the emission areas EA1 to EA4 of the first to fourth subpixels SP1 to SP4 have a top emission structure, each of the emission areas EA1 to EA4 may be arranged to overlap the corresponding circuit areas of the circuit areas CA1 to CA4. For example, each of the circuit areas CA1 to CA4 of the first to fourth subpixels SP1 to SP4 may be disposed under (or below) the corresponding emission areas EA1 to EA4. In this case, each of the emission areas EA1 to EA4 may have a size which is equal to or greater than the corresponding circuit areas CA1 to CA4.

In FIGS. 2A to 2C, the first subpixel SP1 may be implemented to emit light of a first color, the second subpixel SP2 may be implemented to emit light of a second color, the third subpixel SP3 may be implemented to emit light of a third color, and the fourth subpixel SP4 may be implemented to emit light of a fourth color. For example, each of the first to fourth colors may be different. As an embodiment, the first color may be red, the second color may be blue, the third color may be white, and the fourth color may be green. As another embodiment, some of the first to fourth colors may be the same. For example, the first color may be red, the second color may be first green, the third color may be second green, and the fourth color may be blue.

Optionally, a white subpixel implemented to emit white light of the first to fourth subpixels SP1 to SP4 having a uniform stripe structure or a non-uniform stripe structure may be omitted.

Figure 3:
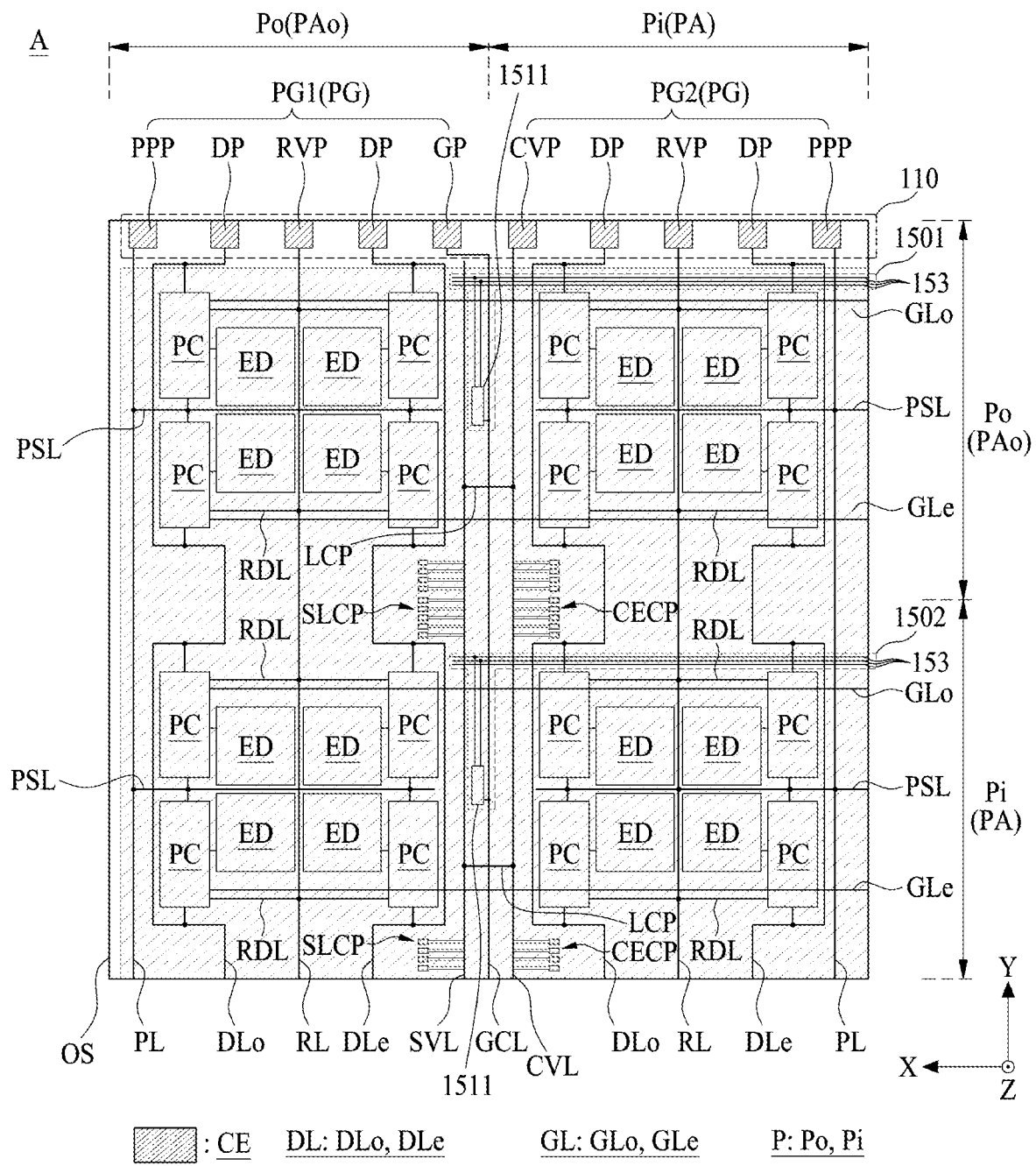
FIG. 3 is an enlarged view of a region 'A' illustrated in FIG. 1.
Figure 4:
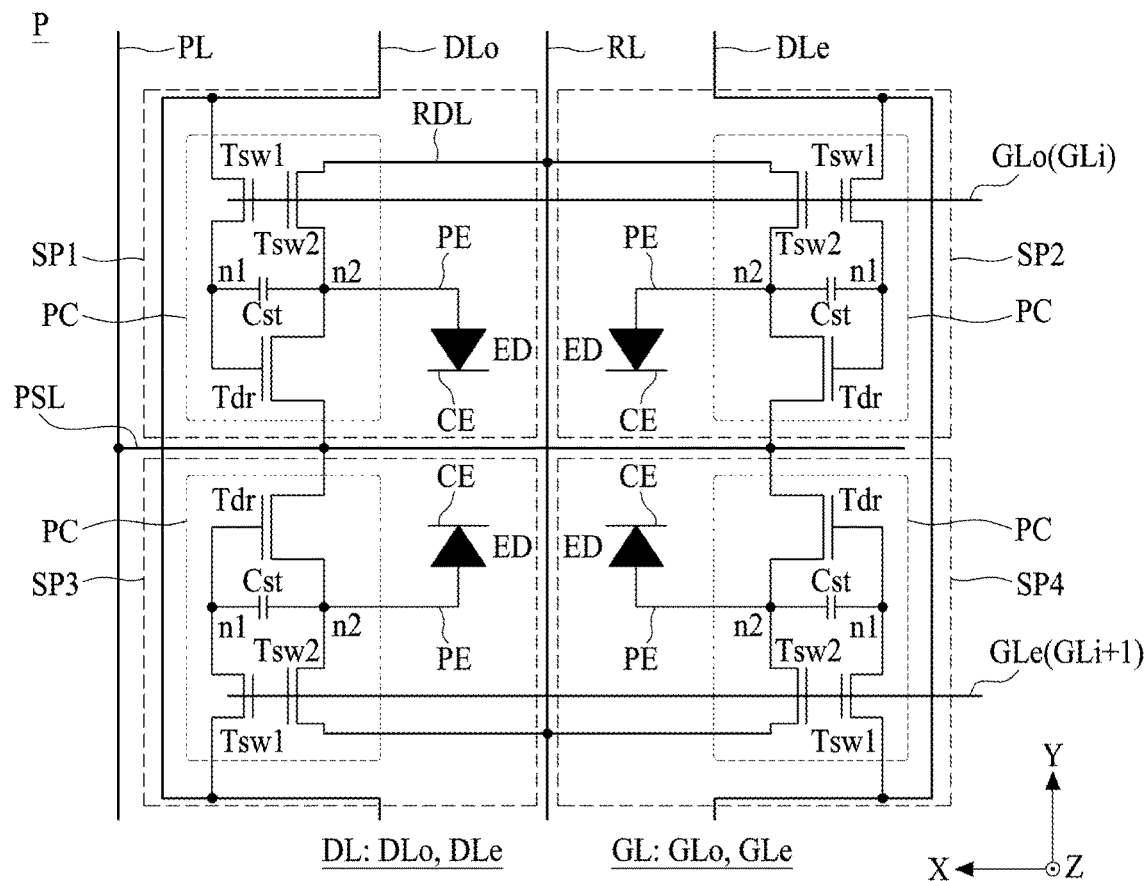
FIG. 4 is an equivalent circuit diagram illustrating one pixel having four subpixels as illustrated in FIGS. 1 and 3.

FIG. 3 is an enlarged view of a region 'A' illustrated in FIG. 1, and FIG. 4 is an equivalent circuit diagram illustrating one subpixel illustrated in FIGS. 1 and 3.

Referring to FIGS. 1, 3, and 4, a first substrate 100 according to an embodiment of the present disclosure may include pixel driving lines DL, GL, PL, CVL, RL, and GCL, a plurality of pixels P, a common electrode CE, a plurality of common electrode connection portions CECP, and a first pad part 110.

The pixel driving lines DL, GL, PL, CVL, RL, and GCL may include a plurality of data lines DL, a plurality of gate lines GL, a plurality of pixel driving power lines PL, a plurality of pixel common voltage lines CVL, a plurality of reference voltage lines RL, and gate control lines GCL.

The plurality of data lines DL may extend long in a second direction Y and may be disposed spaced apart from one another by a predetermined interval in a display area AA of the first substrate 100 along the first direction X. For example, in the plurality of data lines DL, an odd-numbered data line DLo may be disposed at a first periphery portion of each of a plurality of pixel areas PA arranged at the first substrate 100 along the second direction Y, and an even-numbered data line DLe may be disposed at a second periphery portion of each of the plurality of pixel areas PA arranged at the first substrate 100 along the second direction Y, but embodiments of the present disclosure are not limited thereto.

The plurality of gate lines GL may extend long in the first direction X and may be disposed spaced apart from one another by a predetermined interval in the display area AA of the first substrate 100 along the second direction Y. For example, an odd-numbered gate line GLo of the plurality of gate lines GL may be disposed at a third periphery portion of each of the plurality of pixel areas PA arranged on the first substrate 100 along the first direction X. An even-numbered gate line GLe of the plurality of gate lines GL may be disposed at a fourth periphery portion of each of the plurality of pixel areas PA arranged at the first substrate 100 along the first direction X, but embodiments of the present disclosure are not limited thereto.

The plurality of pixel driving power lines PL may extend long in the second direction Y and may be disposed spaced apart from one another by a predetermined interval in the display area AA of the first substrate 100 along the first direction X. For example, in the plurality of pixel driving power lines PL, an odd-numbered pixel driving power line PL may be disposed at a first periphery portion of an odd-numbered pixel area PA with respect to the first direction X, and an even-numbered pixel driving power line PL may be disposed at a second periphery portion of an even-numbered pixel area PA with respect to the first direction X, but embodiments of the present disclosure are not limited thereto.

Two adjacent pixel driving power lines PL of the plurality of pixel driving power lines PL may be coupled to a plurality of power sharing lines PSL disposed in each of pixel areas PA arranged in the second direction Y. For example, the plurality of pixel driving power lines PL may be electrically coupled to one another by the plurality of power sharing lines PSL, and thus, may have a ladder structure or a mesh structure. The plurality of pixel driving power lines PL may have a ladder structure or a mesh structure, and thus, the voltage drop (IR drop) of the pixel driving power caused by a line resistance of each of the plurality of pixel driving power lines PL may be prevented or minimized. Accordingly, the display apparatus according to an embodiment of the present disclosure may prevent or minimize the degradation in image quality caused by a deviation of the pixel driving power supplied to each of the pixels P arranged at the display area AA.

Each of the plurality of power sharing lines PSL may branch from an adjacent pixel driving power line PL in parallel with the first direction X and may be disposed in a middle region of each pixel area PA, but embodiments of the present disclosure are not limited thereto.

The plurality of pixel common voltage lines CVL may extend long in the second direction Y and may be disposed spaced apart from one another by a predetermined interval in the display area AA of the first substrate 100 along the first direction X. For example, each of the plurality of pixel common voltage lines CVL may be disposed at a first periphery portion of an even-numbered pixel area PA with respect to the first direction X.

The plurality of reference voltage lines RL may extend long in the second direction Y and may be disposed spaced apart from one another by a predetermined interval in the display area AA of the first substrate 100 in the first direction X. Each of the plurality of reference voltage lines RL may be disposed in a center region of each of the pixel areas PA arranged in the second direction Y.

Each of the plurality of reference voltage lines RL may be shared by two adjacent subpixels ((SP1, SP2) (SP3, SP4)) in the first direction X in each pixel area PA. To this end, each of the plurality of reference voltage lines RL may include a reference branch line RDL. The reference branch line RDL may branch (or protrude) to the two adjacent subpixels ((SP1, SP2) (SP3, SP4)) in the first direction X in each pixel area PA and may be electrically coupled to the two adjacent subpixels ((SP1, SP2) (SP3, SP4)).

Each of the plurality of gate control lines GCL may extend long in the second direction Y and may be disposed spaced apart from one another by a predetermined interval in the display area AA of the first substrate 100 in the first direction X. For example, each of the plurality of gate control lines GCL may be disposed at between the plurality of pixel areas PA or a boundary region between two adjacent pixel areas PA with respect to the first direction X.

Each of the plurality of pixels P may include at least three subpixels. For example, each of the plurality of pixels P may include first to fourth subpixels SP1 to SP4.

Each of the first to fourth subpixels SP1 to SP4 may include a pixel circuit PC and a light emitting device layer.

The pixel circuit PC according to an embodiment may be disposed in a circuit area of the pixel area PA and may be coupled to a gate line GLo or GLe adjacent thereto, a data line DLo or DLe adjacent thereto, and the pixel driving power line PL. For example, a pixel circuit PC disposed in a first subpixel SP1 may be coupled to an odd-numbered data line DLo and an odd-numbered gate line GLo, a pixel circuit PC disposed in a second subpixel SP2 may be coupled to an even-numbered data line DLe and an odd-numbered gate line GLo, a pixel circuit PC disposed in a third subpixel SP3 may be coupled to an odd-numbered data line DLo and an even-numbered gate line GLe, and a pixel circuit PC disposed in a fourth subpixel SP4 may be coupled to an even-numbered data line DLe and an even-numbered gate line GLe.

The pixel circuit PC of each of the first to fourth subpixels SP1 to SP4 may sample a data signal supplied from a corresponding data line DLo or DLe in response to a scan signal supplied from a corresponding gate line GLo or GLe and may control a current flowing from the pixel driving power line PL to the light emitting device layer based on a sampled data signal.

The pixel circuit PC according to an embodiment may include a first switching thin film transistor Tsw1, a second switching thin film transistor Tsw2, a driving thin film transistor Tdr, and a storage capacitor Cst, but embodiments of the present disclosure are not limited thereto. In the following description, a thin film transistor may be referred to as a TFT.

The first switching TFT Tsw1 may include a gate electrode coupled to a corresponding gate line GL (GLo or GLe) a first source/drain electrode coupled to a corresponding data line DL (DLo or DLe), and a second source/drain electrode coupled to a gate node n1 of the driving TFT Tdr. The first switching TFT Tsw1 may be turned on by a scan signal supplied through corresponding gate line GL (GLo or GLe) and may transfer a data signal, supplied through corresponding data line DL (DLo or DLe), to the gate electrode n1 of the driving TFT Tdr.

The second switching TFT Tsw2 may include a gate electrode coupled to a corresponding gate line GL (GLo or GLe) a first source/drain electrode coupled to a source node n2 of the driving TFT Tdr, and a second source/drain electrode coupled to a corresponding reference voltage line RL. The second switching TFT Tsw2 may be turned on by a scan signal supplied through the corresponding gate line GL (GLo or GLe) and may transfer a reference voltage, supplied through the corresponding reference line RL, to the source node n2 of the driving TFT Tdr. For example, the second switching TFT Tsw2 may be turned on simultaneously with the first switching TFT Tsw1.

The storage capacitor Cst may be formed between the gate node n1 and the source node n2 of the driving TFT Tdr. The storage capacitor Cst according to an embodiment may include a first capacitor electrode coupled to the gate node n1 of the driving TFT Tdr, a second capacitor electrode coupled to the source node n2 of the driving TFT Tdr, and a dielectric layer formed in an overlap region between the first capacitor electrode and the second capacitor electrode.

The storage capacitor Cst may be charged with a difference voltage between the gate node n1 and the source node n2 of the driving TFT Tdr, and then, may turn on or off the driving TFT Tdr based on a charged voltage thereof.

The driving TFT Tdr may include a gate electrode (or the gate node n1) coupled to the second source/drain electrode of the first switching TFT Tsw1 and the first capacitor electrode of the storage capacitor Cst in common, a first source/drain electrode (or the source node n2) coupled to the first source/drain electrode of the second switching TFT Tsw2, the second capacitor electrode of the storage capacitor Cst, and a pixel electrode PE of the light emitting device layer in common, and a second source/drain electrode (or a drain node) coupled to a corresponding pixel driving power line PL. The driving TFT Tdr may be turned on based on a voltage of the storage capacitor Cst and may control the amount of current flowing from the pixel driving power line PL to the light emitting device layer.

The pixel circuit PC of each of the first to fourth subpixels SP1 to SP4 according to another embodiment of the present disclosure may be implemented as a pixel driving chip through a semiconductor manufacturing process, disposed in a circuit area CA of a corresponding pixel area PA, and coupled to a corresponding gate line GL (GLo or GLe), a corresponding data line DL (DLo or DLe), and a corresponding pixel driving power line PL. For example, the pixel driving chip may be a minimum-unit microchip or one chipset and may be a semiconductor packaging device which includes two or more transistors and one or more capacitors and has a fine size. Such a pixel driving chip may sample a data signal supplied from the corresponding data line DL (DLo or DLe) in response to a scan signal supplied from the corresponding gate line GL (GLo or GLe) and may control a current flowing from the corresponding pixel driving power line PL to the light emitting device layer based on a sampled data signal.

The light emitting device layer may be disposed in an emission area EA of the pixel area PA and electrically coupled to the pixel circuit PC.

The light emitting device layer according to an embodiment of the present disclosure may include a pixel electrode PE electrically coupled to the pixel circuit PC, a common electrode CE electrically coupled to the pixel common voltage line CVL, and a self-emitting device ED interposed between the pixel electrode PE and the common electrode CE.

Each of the plurality of common electrode connection portions CECP may be disposed between the plurality of pixels P respectively overlapping the plurality of pixel common voltage lines CVL and may electrically couple the common electrode CE to each of the plurality of pixel common voltage lines CVL. With respect to the second direction Y, each of the plurality of common electrode connection portions CECP according to an embodiment of the present disclosure may be electrically coupled to a corresponding pixel common voltage line CVL among the plurality of pixel common voltage lines CVL at a portion between the plurality of pixels P or at a boundary portion between the plurality of pixels P and may be electrically coupled to a portion of the common electrode CE, and thus, may electrically couple the common electrode CE to each of the plurality of pixel common voltage lines CVL.

Each of the plurality of common electrode connection portions CECP may be disposed between at least two pixels among the plurality of pixels P to electrically couple the common electrode CE to each of the plurality of pixel common voltage lines CVL, and thus, may prevent or minimize the voltage drop (IR drop) of the pixel common voltage caused by a surface resistance of the common electrode CE. Accordingly, the display apparatus according to an embodiment of the present disclosure may prevent or minimize the degradation in image quality caused by a deviation of the pixel common voltage supplied to each of the pixels P arranged in the display area AA.

According to an embodiment of the present disclosure, each of the plurality of common electrode connection portions CECP may be formed along with a pixel electrode PE having at least two-layer structure so as to be electrically coupled to each of the plurality of pixel common voltage lines CVL. Each of the plurality of common electrode connection portions CECP may be coupled to the common electrode CE through a side contact structure having a "("-shaped cross-sectional structure or a "⟨"-shaped cross-sectional structure. For example, when each of the plurality of common electrode connection portions CECP is formed of first and second metal layers, each of the plurality of common electrode connection portions CECP may include a side contact structure corresponding to an undercut structure or a tapered structure formed on the lateral surface of the first metal layer by an etching speed difference between the first metal layer and the second metal layer. For example, when each of the plurality of common electrode connection portions CECP is formed of first to third metal layers, each of the plurality of common electrode connection portions CECP may include a side contact structure corresponding to an undercut structure or a tapered structure formed at the lateral surface of the first metal layer and/or the second metal layer by an etching speed difference between the first and second metal layers.

The first pad part 110 may be disposed at a first periphery portion of the first surface of the first substrate 100 parallel to the first direction X. The first pad part 110 may be disposed at a third periphery portion of each of outermost pixel areas PAo disposed at the first periphery portion of the first substrate 100. With respect to the second direction Y, an end portion of the first pad part 110 may overlap or may be aligned with an end portion of each of the outermost pixel areas PAo. Therefore, the first pad part 110 may be included (or disposed) in each of the outermost pixel areas PAo disposed at the first periphery portion of the first substrate 100, and thus, a non-display area (or a bezel area) based on the first pad part 110 may not be formed or may not be in the first substrate 100.

The first pad part 110 may include a plurality of first pads (or a first pad electrodes) which are disposed in parallel with one another along the first direction X at the first periphery portion of the first substrate 100. The plurality of first pads may be grouped (or classified) into a first data pads DP, a first gate pads GP, a first pixel driving power pads PPP, a first reference voltage pads RVP, and a first pixel common voltage pads CVP.

Each of the first data pads DP may be individually (or a one-to-one relationship) coupled to one side end of each of the plurality of data lines DLo and DLe disposed at the first substrate 100.

Each of the first gate pads GP may be individually (or a one-to-one relationship) coupled to one side end of each of the gate control lines GCL disposed at the first substrate 100. The first gate pads GP according to an embodiment may be grouped (or classified) into a first start signal pad, a plurality of first shift clock pads, a plurality of first carry clock pads, at least one first gate driving power pad, and at least one first gate common power pad.

Each of the first pixel driving power pads PPP may be individually (or a one-to-one relationship) coupled to one side end of each of the plurality of pixel driving power lines PL disposed at the first substrate 100.

Each of the first reference voltage pads RVP may be individually (or a one-to-one relationship) coupled to one side end of each of the plurality of reference voltage lines RL disposed at the first substrate 100.

Each of the first pixel common voltage pads CVP may be individually (or a one-to-one relationship) coupled to one side end of each of the plurality of pixel common voltage lines CVL disposed at the first substrate 100.

The first pad part 110 according to an embodiment may include a plurality of pad groups PG which are arranged in the order of a first pixel driving power pad PPP, a first data pad DP, a first reference voltage pad RVP, a first data pad DP, a first gate pad GP, a first pixel common voltage pad CVP, a first data pad DP, a first reference voltage pad RVP, a first data pad DP, and a first pixel driving power pad PPP along the first direction X. Each of the plurality of pad groups PG may be coupled to two adjacent pixels P disposed along the first direction X. For example, the plurality of pad groups PG may include a first pad group PG1 including one first pixel driving power pad PPP, one first data pad DP, one first reference voltage pad RVP, one first data pad DP, and one first gate pad GP continuously disposed in an odd-numbered pixel area PA along the first direction X, and a second pad group PG2 including one first pixel common voltage pad CVP, one first data pad DP, one first reference voltage pad RVP, one first data pad DP, and one first pixel driving power pad PPP continuously disposed in an even-numbered pixel area PA along the first direction X. It is to be noted in the Figures, where a reference number or letter is provided after which another reference number or letter is provided in parenthesis, this has the meaning that the number and/or letter in parenthesis is the general category or group of the item and the first number prior to it is a specific example of that item within the group. For example, the indication in FIG. 3 of PG1(PG) indicates that PG1, the first pad group, is a specific item within the broad pad group, PG. Similarly, in FIG. 5, the notation 150m(150) indicates that each of the circuits 1501, 1502, . . . 1511, 1512 etc. is driving circuit within the broad group of driving circuits 150. In addition, the notation 111(110) in FIGS. 13A-13D indicates that item 111 is one specific first pad within the group of first pads 110. Similar meanings apply to similar notations in the Figures and these are provided as examples to illustrate the meaning.

In a somewhat similar fashion, the legend below a particular figure provides a general group and is followed by a colon and then a list of items in that group as shown in the figure. For example, the notation P: Po, Pi below FIG. 1 indicates that P is the general group of a pixel and Po and Pi are specific items within that group of Pixels P. Also, below FIG. 3, the notations DL: DLo and DLe and GL: GLo and GLe indicate that each of these are specific items within the general group of data lines DL and gate lines GL, respectively. The first substrate 100 according to an embodiment of the present disclosure may further include a plurality of secondary voltage lines SVL and a plurality of secondary line connection portions SLCP. For example, the secondary voltage lines may be referred to as an additional voltage lines or an auxiliary voltage lines, or the like.

Each of the plurality of secondary voltage lines SVL may extend long along the second direction Y and may be disposed adjacent to a corresponding pixel common voltage line CVL of the plurality of pixel common voltage lines CVL. Each of the plurality of secondary voltage lines SVL may be electrically coupled to an adjacent pixel common voltage line CVL without being electrically coupled to the pixel common voltage pad CVP and may be supplied with a pixel common voltage through the adjacent pixel common voltage line CVL. To this end, the first substrate 100 according to an embodiment of the present disclosure may further include a plurality of line connection patterns LCP which electrically couple a pixel common voltage line CVL and a secondary voltage lines SVL adjacent to each other.

Each of the plurality of line connection patterns LCP may be disposed at the first substrate 100 so that the line connection pattern LCP and a pixel common voltage line CVL and a secondary voltage lines SVL adjacent to each other intersect with each other and may electrically couple a pixel common voltage line CVL and a secondary voltage lines SVL adjacent to each other by using a line jumping structure. For example, one side of each of the plurality of line connection patterns LCP may be electrically coupled to a portion of the secondary voltage lines SVL through a first line contact hole formed in an insulation layer over the secondary voltage lines SVL, and the other side of each of the plurality of line connection patterns LCP may be electrically coupled to a portion of the pixel common voltage line CVL through a second line contact hole formed in the insulation layer over the pixel common voltage line CVL.

Each of the plurality of secondary line connection portions SLCP may electrically couple the common electrode CE to each of the plurality of secondary voltage lines SVL at between the plurality of pixels P overlapping each of the plurality of secondary voltage lines SVL. With respect to the second direction Y, each of the plurality of secondary line connection portions SLCP according to an embodiment may be electrically coupled to each of the plurality of secondary voltage lines SVL at a portion between the plurality of pixels P or a boundary region between the plurality of pixels P, and may be electrically coupled to a portion of the common electrode CE, and thus, may electrically couple the common electrode CE to each of the plurality of secondary voltage lines SVL. Therefore, the common electrode CE may be additionally coupled to each of the plurality of secondary voltage lines SVL through the secondary line connection portions SLCP. Accordingly, the display apparatus according to an embodiment of the present disclosure may prevent or minimize the degradation in image quality caused by a deviation of the pixel common voltage supplied to each of the pixels P arranged in the display area AA. Also, in the display apparatus according to an embodiment of the present disclosure, although the pixel common voltage pad CVP coupled to each of the plurality of secondary voltage lines SVL is not additionally disposed (or formed), the pixel common voltage may be supplied to each of the plurality of secondary voltage lines SVL through each of the pixel common voltage lines CVL and the plurality of line connection patterns LCP.

Figure 5:
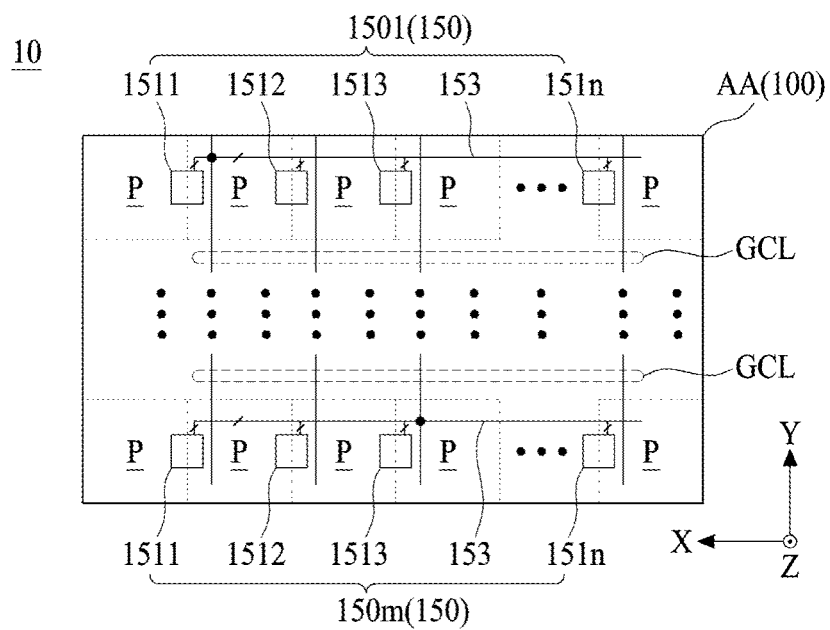
FIG. 5 is a diagram illustrating a gate driving circuit illustrated in FIGS. 1 and 3.

FIG. 5 is a diagram illustrating a gate driving circuit illustrated in FIGS. 1 and 3.

Referring to FIGS. 1, 3, and 5, the gate driving circuit 150 according to another embodiment of the present disclosure may be implemented (or embedded) within the display area AA of the first substrate 100. The gate driving circuit 150 may generate a scan signal based on gate control signals supplied through the first pad part 110 and the gate control lines GCL, and sequentially supply the scan signal to the plurality of gate lines GL.

The gate control lines GCL may include a start signal line, a plurality of shift clock lines, at least one gate driving voltage line, and at least one gate common voltage line. The gate control lines GCL may extend long along a second direction Y and may be disposed spaced apart from one another by a predetermined interval in a display area AA of the first substrate 100 along the first direction X. For example, the gate control lines GCL may be disposed between at least one or more pixels P along the first direction X.

The gate driving circuit 150 according to an embodiment of the present disclosure may be implemented with a shift register including a plurality of stage circuit portions 1501 to 150$m$, where m is an integer of 2 or more.

Each of the plurality of stage circuit portions 1501 to 150$m$ may be individually disposed in each horizontal line of a first surface of the first substrate 100 along the first direction X and may be dependently coupled to one another along the second direction Y. Each of the plurality of stage circuit portions 1501 to 150$m$ may generate a scan signal in a predetermined order in response to gate control signals supplied through the first pad part 110 and the gate control lines GCL and may supply the scan signal to a corresponding gate line GL.

Each of the plurality of stage circuit portions 1501 to 150$m$ according to an embodiment may include a plurality of branch circuits 1511 to 151$n$ and a branch network 153.

The plurality of branch circuits 1511 to 151$n$ may be selectively coupled to the gate control lines of the gate control lines GCL through the branch network 153 and may be electrically coupled to one another through the branch network 153. Each of the plurality of branch circuits 1511 to 151$n$ may generate the scan signal based on a gate control signal supplied through the gate control lines GCL and a voltage of the branch network 153, and may supply the scan signal to a corresponding gate line GL.

Each of the plurality of branch circuits 1511 to 151$n$ may include at least one TFT (or branch TFT) of a plurality of TFTs configuring one stage circuit portion of the stage circuit portions 1501 to 150$m$. Any one branch circuit of the plurality of branch circuits 1511 to 151$n$ may include a pull-up TFT coupled to the gate line GL. The other branch circuit of the plurality of branch circuits 1511 to 151$n$ may include a pull-down TFT coupled to the gate line GL.

Each of the plurality of branch circuits 1511 to 151$n$ according to an embodiment of the present disclosure may be disposed at a circuit area between two adjacent pixels P or at a circuit area between at least two adjacent pixels P, in each horizontal line of the first substrate 100, but embodiments of the present disclosure are not limited thereto. For example, each of the plurality of branch circuits 1511 to 151$n$ may be disposed at a circuit area (or a boundary region) between at least one or more adjacent pixels P according to the number of TFTs configuring each of the stage circuit portions 1501 to 150$m$ and the number of pixels P disposed one horizontal line.

The branch network 153 may be disposed at each horizontal line of the first substrate 100 and may electrically couple the plurality of branch circuits 1511 to 151$n$ to each other. The branch network 153 according to an embodiment of the present disclosure may include a plurality of control node lines and a plurality of network line.

The plurality of control node lines may be disposed at each horizontal line of the first substrate 100 and may be selectively coupled to the plurality of branch circuits 1511 to 151$n$ in one horizontal line. For example, the plurality of control node lines may be disposed at an upper edge region (or a lower edge region) among pixel areas arranged at each horizontal line of the first substrate 100.

The plurality of network line may be selectively coupled to the gate control lines GCL disposed at the first substrate 100 and may be selectively coupled to the plurality of branch circuits 1511 to 151n. For example, the plurality of network line may transfer the gate control signal supplied from the gate control lines GCL to corresponding branch circuits 1511 to 151n and may transfer a signal between the plurality of branch circuits 1511 to 151n.

Each of the plurality of stage circuit portions 1501 to 150m according to an embodiment of the present disclosure may include a first control node, a second control node, a node control circuit, an inverter circuit, and an output buffer circuit. The node control circuit may be configured to control the voltage of each of the first and second control nodes. The inverter circuit may be configured to control the voltage of the second control node based on the voltage of the first control node. The output buffer circuit may be configured to output a scan signal corresponding to the scan clock and a carry signal corresponding to the carry clock based on the voltage of the first control node, and a scan signal and a carry signal corresponding to the gate-off voltage level based on the voltage of the second control node. For example, the node control circuit, the inverter circuit, and the output buffer circuit may respectively include two or more of the plurality of branch circuits 1511 to 151n. For example, the plurality of branch circuits 1511 to 151n may be grouped (or classified) into the node control circuit, the inverter circuit, and the output buffer circuit, respectively.

As described above, according to an embodiment of the present embodiment, because the gate driving circuit 150 is disposed within the display area AA of the first substrate 100, a second interval D2 between a center portion of the outermost pixel area PAo and the outer surfaces OS of the first substrate 100 may be equal to or less than half of a first interval (or a pixel pitch) D1 between adjacent pixel areas PA. For example, when the gate driving circuit 150 is not disposed in the display area AA of the first substrate 100 and is disposed at a periphery portion of the first substrate 100, the second interval D2 may not be equal to or less than half of the first interval D1. Accordingly, in the display apparatus according to an embodiment of the present disclosure, the gate driving circuit 150 may be disposed in the display area AA of the first substrate 100, and thus, the second interval D2 may be implemented to be equal to or less than half of the first interval D1, and moreover, the display apparatus may be implemented to have an air bezel structure which has a zeroized bezel or where a bezel area is not provided.

Figure 6:
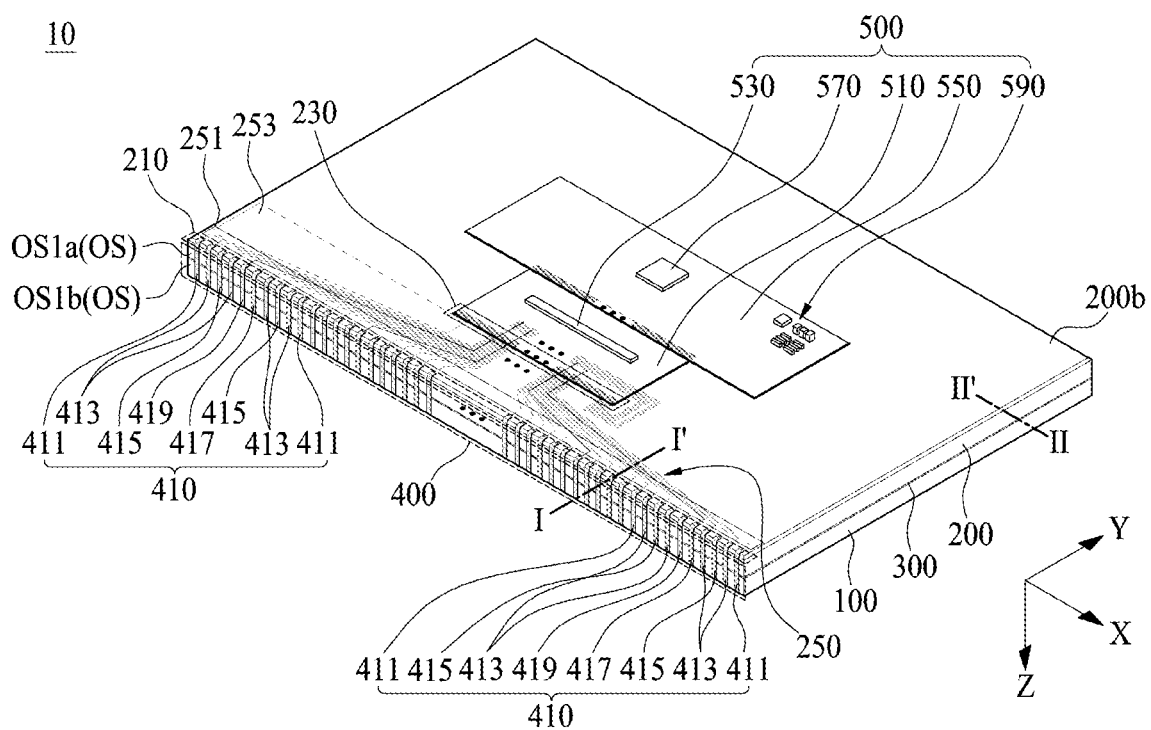
FIG. 6 is a diagram illustrating a rear surface of a display apparatus according to an embodiment of the present disclosure.
Figure 7:
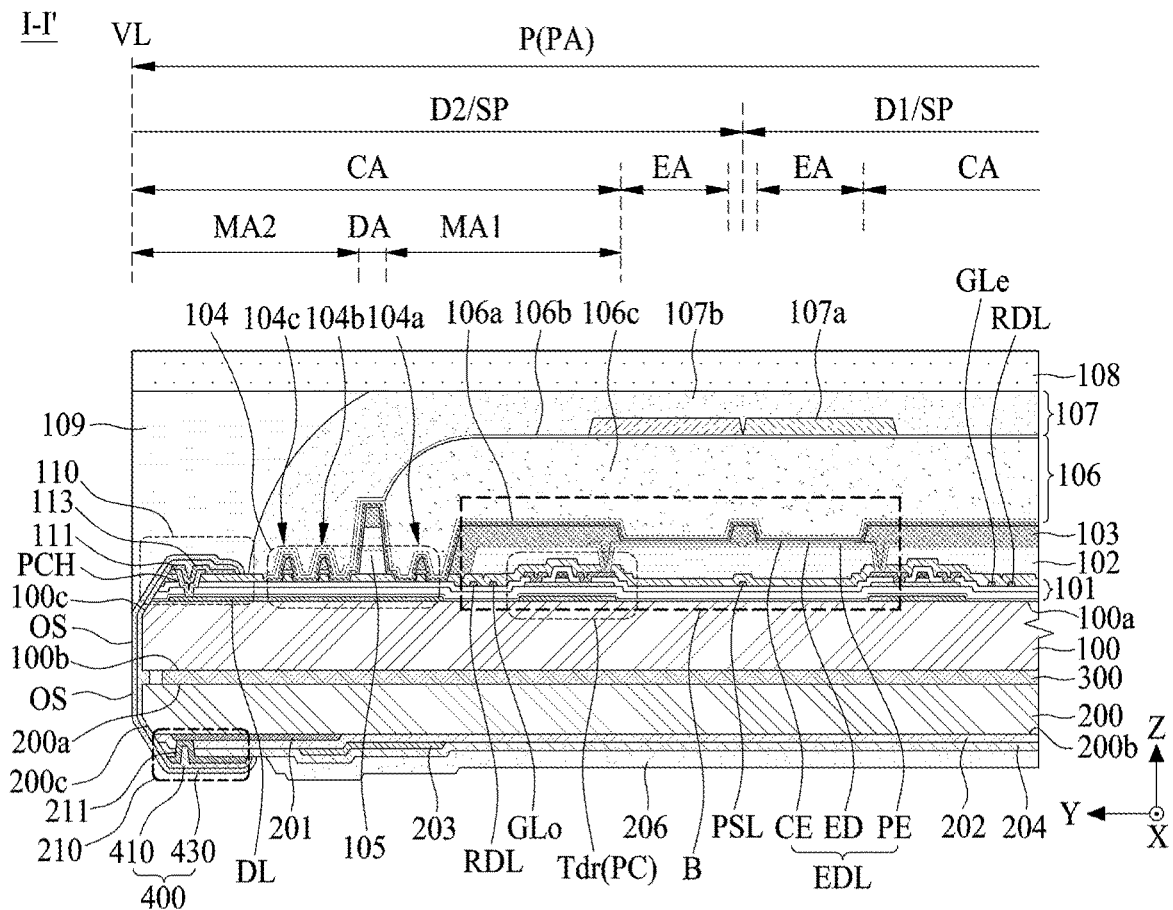
FIG. 7 is a cross-sectional view taken along line I-I' illustrated in FIG. 6.
Figure 8:
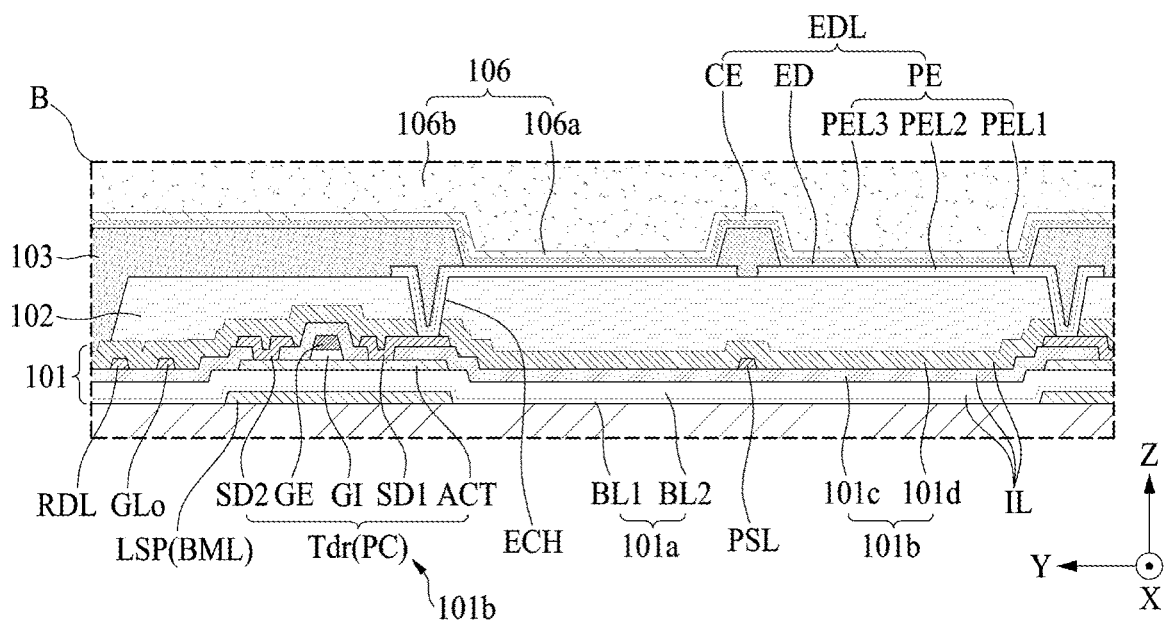
FIG. 8 is an enlarged view of a region 'B' illustrated in FIG. 7.
Figure 9:
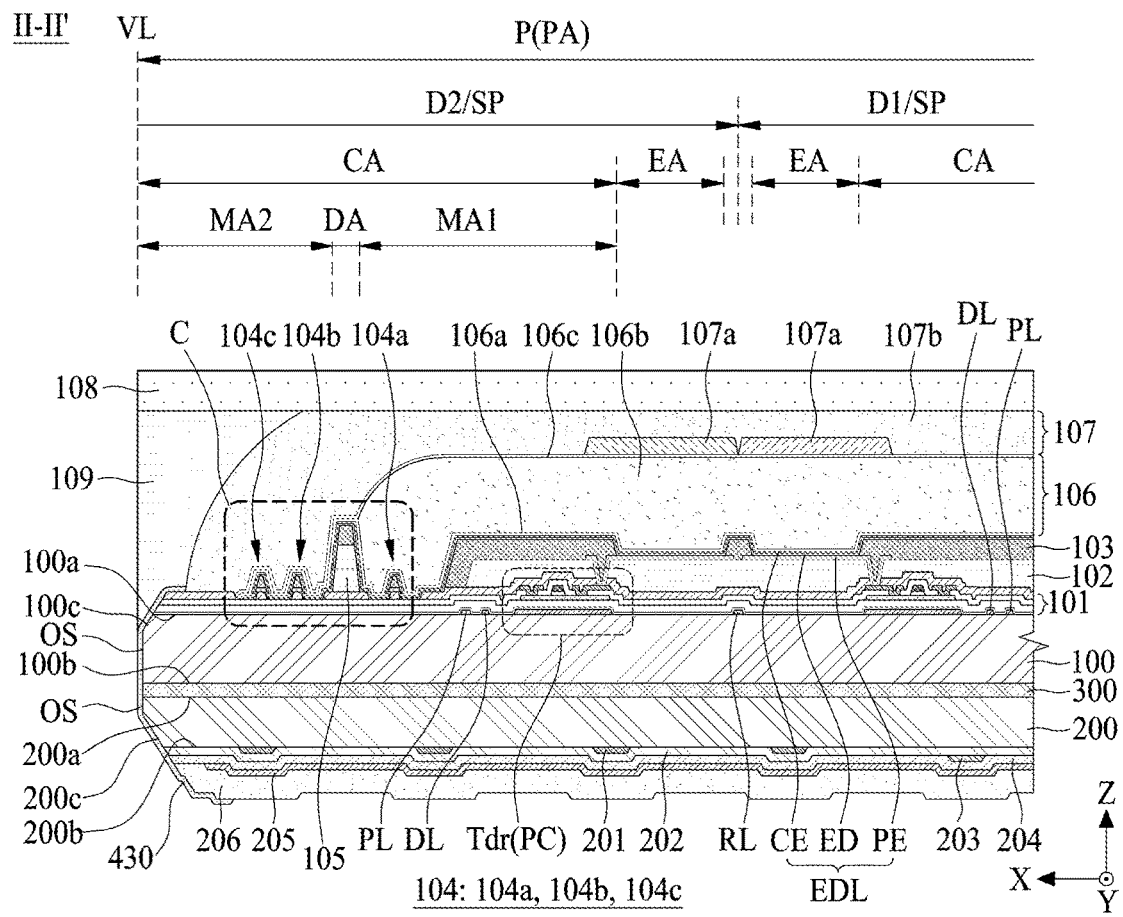
FIG. 9 is a cross-sectional view taken along line II-II' illustrated in FIG. 6.
Figure 10:
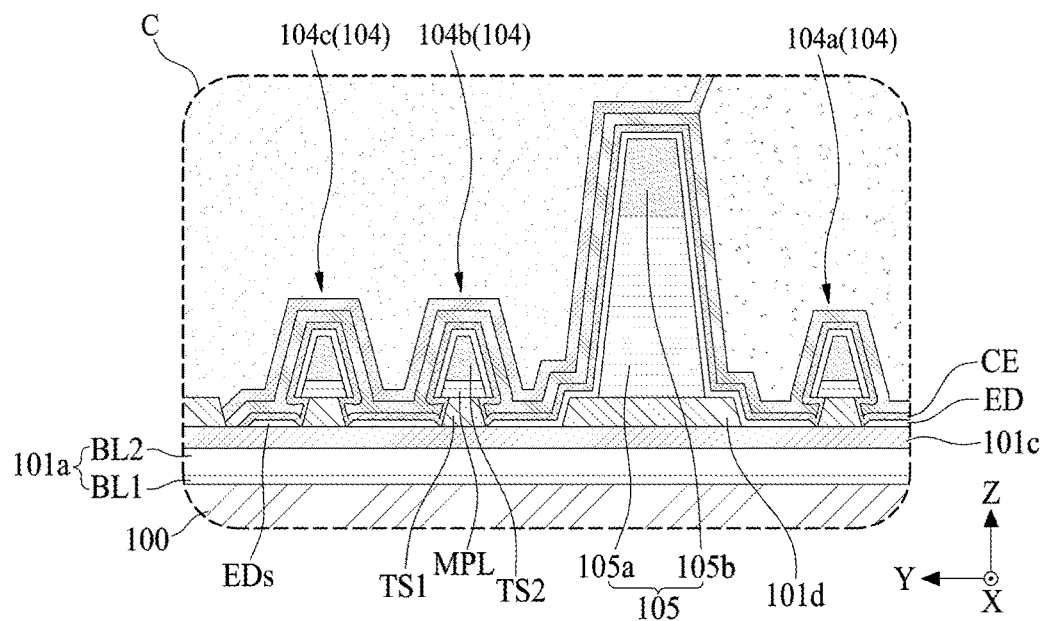
FIG. 10 is an enlarged view of a region 'C' illustrated in FIG. 9.

FIG. 6 is a diagram illustrating a rear surface of a display apparatus according to another embodiment of the present disclosure, FIG. 7 is a cross-sectional view taken along line I-I' illustrated in FIG. 6, FIG. 8 is an enlarged view of a region 'B' illustrated in FIG. 7, FIG. 9 is a cross-sectional view taken along line II-II' illustrated in FIG. 6, and FIG. 10 is an enlarged view of a region 'C' illustrated in FIG. 9.

Referring to FIGS. 3 and 6 to 9, a display apparatus according to an embodiment of the present disclosure may include a first substrate 100, a second substrate 200, a coupling member 300, and a routing portion 400.

The first substrate 100 according to an embodiment of the present disclosure may include a circuit layer 101, a planarization layer 102, a light emitting device layer EDL, a bank 103, and a first pad part 110.

The circuit layer 101 may be disposed over the first substrate 100. The circuit layer 101 may be referred to as a pixel array layer or a TFT array layer.

The circuit layer 101 according to an embodiment of the present disclosure may include a buffer layer 101a and a circuit array layer 101b.

The buffer layer 101a may prevent materials, such as hydrogen included in the first substrate 100, from being diffused to the circuit array layer 101b in a high temperature process of a process of manufacturing a TFT. Also, the buffer layer 101a may prevent external water or moisture from penetrating into the light emitting device layer EDL. The buffer layer 101a according to an embodiment may include silicon oxide (SiOx), silicon nitride (SiNx), silicon oxynitride (SiON), or a multilayer thereof, but embodiments of the present disclosure are not limited thereto. For example, the buffer layer 101a may include a first buffer layer BL1 which includes SiNx and is disposed on the first substrate 100 and a second buffer layer BL2 which includes SiOx and is disposed on the first buffer layer BL1.

The circuit array layer 101b may include a pixel circuit PC which includes a driving TFT Tdr disposed in each of a plurality of pixel areas PA over the buffer layer 101a.

The driving TFT Tdr disposed in a circuit area of the each pixel area PA may include an active layer ACT, a gate insulation layer GI, a gate electrode GE, an interlayer insulation layer 101c, a first source/drain electrode SD1, a second source/drain electrode SD2, and a passivation layer 101d. The combination of each of the layers 101a, 101c and 101d can be considered an insulation layer, which can be referred to in the singular, as an insulation layer, or can also be referred to as an insulation layer having a plurality of sublayers.

The active layer ACT may be disposed on the buffer layer 101a in each pixel area PA. The active layer ACT may include a channel area, overlapping the gate electrode GE, and a first source/drain area and a second source/drain area parallel to each other between adjacent channel areas. The active layer ACT may have conductivity in a conductivity process, and thus, may be used as a bridge line of a jumping structure which directly connects lines in the display area AA or electrically connects lines disposed on different layers.

The gate insulation layer GI may be disposed on the channel area of the active layer ACT. The gate insulation layer GI may insulate the active layer ACT from the gate electrode GE.

The gate electrode GE may be disposed on the gate insulation layer GI and connected to the gate line. The gate electrode GE may overlap the channel area of the active layer ACT with the gate insulation layer GI therebetween.

The interlayer insulation layer 101c may be disposed at the first substrate 100 to cover the gate electrode GE and the active layer ACT. The interlayer insulation layer 101c may electrically insulate (or isolate) the gate electrode GE and the source/drain electrodes SD1 and SD2.

The first source/drain electrode SD1 may be disposed on the interlayer insulation layer 101c overlapping the first source/drain area of the active layer ACT and may be electrically connected to the first source/drain area of the active layer ACT through a first source/drain contact hole disposed in the interlayer insulation layer 101c. For example, the first source/drain electrode SD1 may be a source electrode of the driving TFT Tdr, and the first source/drain area of the active layer ACT may be a source area.

The second source/drain electrode SD2 may be disposed on the interlayer insulation layer 101c overlapping the second source/drain area of the active layer ACT and may be electrically connected to the second source/drain area of the active layer ACT through a second source/drain contact hole disposed in the interlayer insulation layer 101c. For example, the second source/drain electrode SD2 may be a drain electrode of the driving TFT Tdr, and the second source/drain area of the active layer ACT may be a drain area.

The passivation layer 101d may be disposed over the first substrate 100 to cover the pixel circuit PC including the driving TFT Tdr. The passivation layer 11d may support the dam portion 105.

According to an embodiment, when the interlayer insulation layer 101c is not disposed at the periphery portion of the first substrate 100, the passivation layer 101d disposed at the periphery portion of the first substrate 100 may directly contact the buffer layer 101a. The passivation layer 101d according to an embodiment may include silicon oxide (SiOx), silicon nitride (SiNx), silicon oxynitride (SiON), or a multilayer thereof, but embodiments of the present disclosure are not limited thereto. For example, the passivation layer 101d may be referred to as a protection layer, a circuit protection layer, an insulation layer, a circuit insulation layer, or the like.

Each of first and second switching TFT Tsw1 and Tsw2 configuring the pixel circuit PC may be formed together with the driving TFT Tdr, and thus, their detailed descriptions are omitted.

The circuit layer 101 according to an embodiment may further include a lower metal layer BML, which is disposed between the first substrate 100 and the buffer layer 101a.

The lower metal layer BML may further include a light blocking pattern (or a light blocking layer) LSP which is disposed under (or below) the active layer ACT of each of the TFTs Tdr, Tsw1, and Tsw2 configuring the pixel circuit PC.

The light blocking pattern LSP may be disposed in an island shape between the first substrate 100 and the active layer ACT. The light blocking pattern LSP may block light which is incident on the active layer ACT through the first substrate 100, thereby preventing or minimizing a threshold voltage variation of each TFT caused by external light. Optionally, the light blocking pattern LSP may be electrically connected to the first source/drain electrode SD1 of a corresponding TFT and thus may act as a lower gate electrode of the corresponding TFT, and in this case, a characteristic variation of each TFT caused by light and a threshold voltage variation of each TFT caused by a bias voltage may be minimized or prevented.

The lower metal layer BML may be used as a line disposed in parallel with each other of the gate line GL, the data line DL, the pixel driving power line PL, the pixel common voltage line CVL, and the reference voltage line RL. For example, the lower metal layer BML may be used as a metal layer (or a line) disposed in parallel to the second direction Y of the pixel driving lines DL, GL, PL, CVL, RL, and GCL disposed at the first substrate 100. Each of the lines that provide signals and/or a voltage to a pixel is consider a pixel driving line. This includes the lines DL, GL, PL, CVL, RL, and GCL.

The planarization layer 102 may be disposed over the first substrate 100 and may provide a flat surface over the circuit layer 101. The planarization layer 102 may cover the circuit layer 101 including the driving TFT Tdr disposed at each of the plurality of pixel areas PA. The planarization layer 102 according to an embodiment may be formed of an organic insulating material, but embodiments of the present disclosure are not limited thereto. The planarization layer 102 according to an embodiment may be formed to cover the remaining circuit layer 101 except a periphery portion of the passivation layer 101d disposed at the first substrate 100. For example, the planarization layer 102 may be disposed between the passivation layer 101d and the light emitting device layer EDL or disposed under the light emitting device layer EDL.

The light emitting device layer EDL may be disposed over the planarization layer 102. The light emitting device layer EDL according to an embodiment may include a pixel electrode PE, a self-emitting device ED, and a common electrode CE.

The pixel electrode PE may be referred to as an anode electrode, a reflective electrode, a lower electrode, an anode, or a first electrode of the self-emitting device ED.

The pixel electrode PE may be disposed over the planarization layer 102 overlapping an emission area EA of each of the plurality of subpixel SP in the first substrate 100. The pixel electrode PE may be patterned in an island shape and disposed in each subpixel SP, and may be electrically coupled to the first source/drain electrode SD1 of the driving TFT Tdr of a corresponding pixel circuit PC. For example, one side of the pixel electrode PE may extend onto the first source/drain electrode SD1 of the driving TFT Tdr and may be electrically coupled to the first source/drain electrode SD1 of the driving TFT Tdr through an electrode contact hole ECH provided in the planarization layer 102.

The pixel electrode PE may include a metal material which is low in work function and is good in reflective efficiency.

The pixel electrode PE according to an embodiment of the present disclosure may have a two-layer structure including a first pixel electrode layer (or a first metal layer) PEL1 and a second pixel electrode layer (or a second metal layer) PEL2. The first and second pixel electrode layers PEL1 and PEL2 may be sequentially deposited over the planarization layer 102 and then simultaneously patterned, but embodiments of the present disclosure are not limited thereto.

The first pixel electrode layer PEL1 may disposed over the planarization layer 102. The second pixel electrode layer PEL2 may disposed (or stacked) on the first pixel electrode layer PEL1. For example, the first pixel electrode layer PEL1 may act as an adhesive layer corresponding to the planarization layer 102 and may act as a secondary electrode of the self-emitting device ED, and moreover, may include indium tin oxide (ITO) or indium zinc oxide (IZO), but embodiments of the present disclosure are not limited thereto. For example, the second pixel electrode layer PEL2 may act as a reflector and may perform a function of decreasing a resistance of the pixel electrode PE, and moreover, may include one or more material of aluminum (Al), silver (Ag), molybdenum (Mo), titanium (Ti), and a Mo—Ti alloy (MoTi), but embodiments of the present disclosure are not limited thereto. For example, the pixel electrode PE may be formed in a two-layer structure of ITO/MoTi or IZO/MoTi.

The pixel electrode PE according to another embodiment may have a three-layer structure including a first pixel electrode layer PEL1, a second pixel electrode layer PEL2 on the first pixel electrode layer PEL1, and a third pixel electrode layer (or a third metal layer) PEL3 on the second pixel electrode layer PEL2. The first pixel electrode layer PEL1, the second pixel electrode layer PEL2, and the third pixel electrode layer PEL3 may be sequentially deposited over the planarization layer 102 and then simultaneously patterned, but embodiments of the present disclosure are not limited thereto.

The third pixel electrode layer PEL3 may act as an electrode of the self-emitting device ED and may include ITO or IZO. For example, the pixel electrode PE according to another embodiment may be formed in a three-layer structure of IZO/MoTi/ITO or ITO/MoTi/ITO.

The pixel electrode PE according to another embodiment may have a four-layer structure including a first pixel electrode layer PEL1, a second pixel electrode layer PEL2 on the first pixel electrode layer PEL1, a third pixel electrode layer (or a third metal layer) PEL3 on the second pixel electrode layer PEL2, and a fourth pixel electrode layer (or a fourth metal layer) on the third pixel electrode layer PEL3. The first to fourth pixel electrode layers may be sequentially deposited over the planarization layer 102 and then simultaneously patterned, but embodiments of the present disclosure are not limited thereto.

In the pixel electrode PE of the four-layer structure, the first pixel electrode layer may act as the adhesive layer corresponding to the planarization layer 102 and may act as the secondary electrode of the self-emitting device ED, and moreover, may include one or more material of ITO, Mo, and MoTi. The second pixel electrode layer may act a function of decreasing a resistance of the pixel electrode PE and may include Cu. The third pixel electrode layer may act as a reflector and may include one or more material of Al, Ag, Mo, Ti, and MoTi. The fourth pixel electrode layer may act as an electrode of the self-emitting device ED and may include ITO or IZO. For example, the pixel electrode PE according to another embodiment may be formed in a four-layer structure of ITO/Cu/MoTi/ITO.

The pixel electrode PE according to another embodiment may have a five-layer structure including a first pixel electrode layer made of ITO, a second pixel electrode layer made of MoTi, a third pixel electrode layer made of ITO, a fourth pixel electrode layer made of Ag, and a fifth pixel electrode layer made of ITO.

The self-emitting device ED may be disposed over the first substrate 100. The self-emitting device ED may be formed over the pixel electrode PE and may directly contact the pixel electrode PE. The pixel electrode PE may be disposed under (or below) the self-emitting device ED. For example, the pixel electrode PE may be disposed between the planarization layer 102 and the self-emitting device ED.

The self-emitting device ED according to an embodiment may be a common layer which is formed in common in each of a plurality of subpixels SP so as not to be distinguished by subpixel SP units. The self-emitting device ED may react on a current flowing between the pixel electrode PE and the common electrode CE to emit white light (or blue light). The self-emitting device ED according to an embodiment may include an organic light emitting device or an inorganic light emitting device, or may include a stacked or a combination structure of an organic light emitting device (or an inorganic light emitting device) and a quantum dot light emitting device. For example the self-emitting device ED according to another embodiment may include an organic light emitting layer or an inorganic light emitting layer, or may include a stacked or a combination structure of an organic light emitting layer (or an inorganic light emitting layer) and a quantum dot light emitting layer.

The organic light emitting device according to an embodiment may include two or more organic light emitting parts for emitting white light. For example, the organic light emitting device may include a first organic light emitting part and a second organic light emitting part for emitting white light based on a combination of first light and second light. For example, the first organic light emitting part may include at least one or more of a blue light emitting layer, a green light emitting layer, a red light emitting layer, a yellow light emitting layer, and a yellow-green light emitting layer. The second organic light emitting part may include at least one or more of a blue light emitting layer, a green light emitting layer, a red light emitting layer, a yellow light emitting layer, and a yellow-green light emitting layer for emitting second light which is combined with first light from the first organic light emitting part to generate white light.

The organic light emitting device according to an embodiment may further include at least one or more function layers for enhancing emission efficiency and/or lifetime. For example, the function layer may be disposed upper and/or under a light emitting layer.

The inorganic light emitting device according to an embodiment may include a semiconductor light emitting diode, a micro light emitting diode, or a quantum dot light emitting diode. For example, when the self-emitting device ED is the inorganic light emitting device, the self-emitting device ED may have a scale of 1 μm or 100 μm, but embodiments of the present disclosure are not limited thereto.

The common electrode CE may be disposed over the display area AA of the first substrate 100 and may be electrically coupled to the self-emitting device ED of each of the plurality of pixels P. For example, the common electrode CE may be disposed over the remaining display area AA of the first substrate 100 except for the first pad part 110 of the first substrate 100.

The common electrode CE may be referred to as a cathode electrode, a transparent electrode, an upper electrode, a cathode, or a second electrode of the self-emitting device ED. The common electrode CE may be formed over the self-emitting device ED and may directly contact the self-emitting device ED or may electrically and directly contact the self-emitting device ED. The common electrode CE can include a transparent conductive material which transmits light emitted from the self-emitting device ED.

The common electrode CE according to an embodiment of the present disclosure may be formed in a single-layer structure or a multi-layer structure, which includes at least one material of graphene and a transparent conductive material which is relatively high in work function. For example, the common electrode CE may include metal oxide such as ITO or IZO, or may include a combination of oxide and metal such as ZnO:Al or SnO2:Sb.

Additionally, the light emitting device layer EDL may further include a capping layer disposed over the common electrode CE. The capping layer may be disposed over the common electrode CE and may improve the emission efficiency of light by adjusting a refractive index of light emitted from the light emitting device layer EDL.

The bank 103 may be disposed over the planarization layer 102 to define the pixel areas PA over the first substrate 100. The bank 103 may be disposed over the planarization layer 102 to cover a periphery portion of the pixel electrode PE. The bank 103 may define the emission area EA (or an opening portion) of each of the plurality of subpixels SP and may electrically isolate the pixel electrodes PE disposed in adjacent subpixels SP. The bank 103 may be formed to cover the electrode contact hole ECH disposed in each of the plurality of pixel areas PA. The bank 103 may be covered by the self-emitting device ED of the light emitting device layer EDL. For example, the self-emitting device ED may be disposed over the bank 103 as well as over the pixel electrode PE of each of the plurality of subpixels SP.

The bank 103 according to an embodiment of present disclosure may be a transparent bank including a transparent material or a black bank (or an opaque bank) including a black pigment.

The first pad part 110 may be disposed at one periphery portion of the first substrate 100 and may be electrically coupled to the pixel driving lines DL, GL, PL, CVL, RL, and GCL in a one-to-one relationship. An insulation layer IL, as shown in FIG. 8 is present over the respective pixel driving lines. The insulation layer IL can be comprised of one or more sublayers that are each electrical insulating layers. For example, as seen in FIGS. 7 and 8, the insulation layer IL may be comprised of passivation layer 101d, the interlayer insulation layer 101c, and the buffer layers 101a.

The first pad part 110 according to an embodiment of the present disclosure may include a plurality of first pads 111.

The plurality of first pads 111 may be group (or classified) into first data pads DP, first gate pads GP, first pixel driving power pads PPP, first reference voltage pads RVP, and first pixel common voltage pads CVP.

Each of the plurality of first pads 111 may be electrically coupled to a corresponding line of the respective pixel driving lines DL, GL, PL, CVL, RL, and GCL through a pad contact hole PCH passing through the insulation layer IL, which in the embodiment shown in FIGS. 7 and 8, includes passivation layer 101d, the interlayer insulation layer 101c, and the buffer layer 101a. Each of the plurality of first pads 111 according to an embodiment may include the same material as the pixel electrode PE and may be formed together with the pixel electrode PE. According to another embodiment, each of the plurality of first pads 111 may include the same material as a source/drain electrode of a TFT and may be formed together along with the source/drain electrode of the TFT.

An end of each of the plurality of first pads 111 according to an embodiment may be aligned or disposed at an outer surface OS of the first substrate 100. For example, an end of each of the plurality of first pads 111 may be aligned or disposed at a virtual vertical line VL extending from the outer surface OS of the first substrate 100 along a thickness direction Z of the display apparatus. For example, each of the plurality of first pads 111 may have a width (or a length) of 100 µm or less. For example, with respect to a second direction Y, a width between one end and the other end of each of the plurality of first pads 111 or a length of each of the plurality of first pads 111 may be 100 µm or less.

The first pad part 110 according to an embodiment of the present disclosure may further include a plurality of secondary pads 113.

Each of the plurality of secondary pads 113 may be disposed at the first pad part 110 so as to be electrically coupled to each of the plurality of first pads 111 in a one-to-one relationship. Each of the plurality of secondary pads 113 may be disposed over the passivation layer 101d of the first pad part 110 to cover each of the plurality of first pads 111. Each of the plurality of secondary pads 113 may be disposed over a corresponding first pad 111 of the plurality of first pads 111 and the passivation layer 101d and may have a length which is longer than the first pad 111. One side of each of the plurality of secondary pads 113 may be electrically and directly coupled to a corresponding first pad 111. Each of the plurality of secondary pads 113 according to an embodiment may include a single-layer structure including at least one of molybdenum (Mo), titanium (Ti), MoTi, copper (Cu), and silver (Ag).

The plurality of secondary pads 113 may be grouped (or classified) into data secondary pads, gate secondary pads, pixel driving power secondary pads, reference voltage secondary pads, and pixel common voltage secondary pads.

Each of the plurality of secondary pads 113 according to an embodiment may have a line shape where the plurality of secondary pads 113 extend long along the second direction Y and are disposed spaced apart from one another along the first direction X or electrically separated from one another. For example, each of the plurality of secondary pads 113 may extend toward an inner portion of the display area AA from the outer surface OS of the first substrate 100 along the second direction Y.

Each of the plurality of secondary pads 113 according to an embodiment may have a second length (or a second width) which is relatively longer than a first length (or a first width) of a corresponding first pad 111. Each of the plurality of secondary pads 113 may have a length of tens µm with respect to a lengthwise direction thereof or the second direction Y. For example, with respect to the lengthwise direction or the second direction Y, when each of the plurality of first pads 111 has a length of 50 µm or less, each of the plurality of secondary pads 113 may have a length of 50 µm to 150 µm. For example, each of the plurality of secondary pads 113 may have a length which is greater than or equal to at least half (or 1.5 times) than a corresponding first pad 111.

Additionally, the first pad part 110 according to an embodiment may further include a pad cover layer (or a clad layer) disposed between each of the plurality of first pads 111 and a corresponding secondary pad 113 of the plurality of secondary pads 113. The pad cover layer may perform a function of preventing the corrosion of the first pad 111. For example, the pad cover layer may include the same material as an uppermost metal layer of the pixel electrode PE. For example, the uppermost metal layer of the pixel electrode PE may be used as the pad cover layer.

As described above, each of the plurality of secondary pads 113 may be electrically and directly connected (or coupled) to a corresponding first pad 111, and thus, may extend a length of the corresponding first pad 111 to a length of tens µm and/or may increase a contact area between the first pad 111 and the routing portion 400. Therefore, the secondary pad 113 may be referred to as a secondary pad electrode, an extension pad, a connection pad, a pad extension electrode, a pad extension line, a pad connection electrode, a pad connection line, an additional pad, or an auxiliary pad, or the like.

The display apparatus or the first substrate 100 according to an embodiment of the present disclosure may further include a device isolation portion 104, a dam portion 105, and an encapsulation layer 106.

Referring to FIGS. 7, 9, and 10, the device isolation portion 104 according to an embodiment of the present disclosure may be disposed at a periphery portion of the first substrate 100 or a periphery portion of an outermost pixel. For example, the outermost pixels disposed at the periphery portion of the first substrate 100 may include the device isolation portion 104, and thus may be implemented to have a configuration or a structure which differs from an inner pixel. In the following description, the device isolation portion 104 may be referred to as an isolation portion 104.

The isolation portion 104 may be implemented to isolate (or separate) the self-emitting device ED. The isolation portion 104 may be implemented to prevent the penetration of water or moisture in a lateral direction of the first substrate 100 to prevent the self-emitting device ED from being degraded by the lateral penetration of water or moisture. The isolation portion 104 may isolate (or separate) the self-emitting device ED of the light emitting device layer EDL at least once, at a position near the dam portion 105, and thus, may prevent the lateral penetration of water or moisture. For example, the isolation portion 104 may be defined as an isolation region, an isolation line, a disconnection region, or a disconnection line, of the self-emitting device ED.

The isolation portion 104 may be implemented over the interlayer insulation layer 101*c* in the first substrate 100 to surround the display area AA. For example, the isolation portion 104 may be implemented in a closed loop line shape on the interlayer insulation layer 101*c* to surround the display area AA in one-dimensionally.

The isolation portion 104 according to an embodiment may include a plurality of device isolation patterns 104*a*, 104*b*, and 104*c* disposed over the interlayer insulation layer 101*c* in the outermost pixels. For example, the isolation portion 104 may include first to third device isolation patterns 104*a*, 104*b*, and 104*c* implemented in parallel to each other to have a closed loop line shape. In the following description, the device isolation pattern may be referred to as an isolation pattern.

Each of the first to third isolation patterns 104*a*, 104*b*, and 104*c* according to an embodiment may include a first trench structure TS1, a metal pattern layer MPL, and a second trench structure TS2.

The first trench structure TS1 may be implemented by the passivation layer 101*d*. The first trench structure TS1 may be formed by a patterning process performed on the passivation layer 101*d* disposed at the outermost pixels. For example, the first trench structure TS1 may be formed by a patterning process performed on the passivation layer 101*d* using an etching process. For example, the first trench structure TS1 may be referred to as a first isolation structure, a first taper structure, or the like.

A lateral surface (or side surface) of the first trench structure TS1 according to an embodiment may be implemented in an inclined structure or a forward tapered structure. For example, a cross-sectional surface of the first trench structure TS1 taken along a width direction may have a cross-sectional structure having a trapezoid shape where an upper side is narrower than a lower side.

The metal pattern layer MPL may be disposed over the first trench structure TS1. The metal pattern layer MPL may have at least two-layer structure which is the same as the pixel electrode PE. For example, the metal pattern layer MPL may include a first metal layer which is formed together with a first pixel electrode layer PEL1 of a pixel electrode PE and directly contacts the top surface of the first trench structure TS1, and a second metal layer which is formed together with a second pixel electrode layer PEL2 of the pixel electrode PE and is disposed (or stacked) over the first metal layer.

The metal pattern layer MPL may have a width which is wider than the top surface of the first trench structure TS1. A lateral surface of the metal pattern layer MPL may be implemented in an inclined structure or a forward tapered structure. For example, a cross-sectional surface of the metal pattern layer MPL taken along a width direction may have a cross-sectional structure having the same trapezoid shape as the first trench structure TS1. With respect to the width direction, each of one side periphery portion and the other side periphery portion of the metal pattern layer MPL may protrude to the outside of the lateral surface of the first trench structure TS1.

The lateral surface of the first trench structure TS1 may have an undercut structure with respect to the metal pattern layer MPL. For example, a boundary portion between the first trench structure TS1 and the metal pattern layer MPL or an upper lateral surface (or upper side surface) of the first trench structure TS1 may have an undercut structure with respect to the metal pattern layer MPL. Accordingly, the metal pattern layer MPL may have an eaves structure with respect to the first trench structure TS1.

The second trench structure TS2 may be disposed over the metal pattern layer MPL. For example, the second trench structure TS2 may be referred to as a second isolation structure, a second tapered structure, or the like.

The second trench structure TS2 may include an organic insulating material. The second trench structure TS2 according to an embodiment may include the same material as the bank 103, but embodiments of the present disclosure are not limited thereto.

A lower surface of the second trench structure TS2 may have the same width as a top surface of the metal pattern layer MPL. In the second trench structure TS2, the top surface may have the same width as the lower surface or may have a narrower width. For example, a side surface of the second trench structure TS2 may be implemented in an inclined structure or a forward tapered structure.

As described above, the isolation portion 104 including the first to third isolation patterns 104*a*, 104*b*, and 104*c* may isolate (or separate) the self-emitting device ED, or may isolate (or separate) the self-emitting device ED and the common electrode CE. For example, the self-emitting device ED formed (or deposited) over the isolation portion 104 may be automatically isolated (or separated) in performing a deposition process by the undercut structure (or the eaves structure) of each of the first to third isolation patterns 104*a*, 104*b*, and 104*c*, without a separate isolation process. Accordingly, the self-emitting device ED may include an isolation region isolated by the isolation portion 104.

According to an embodiment of the present disclosure, a deposition material of the self-emitting device ED made of the organic light emitting device may have linearity, and thus, may not be deposited at the lateral surface of the first trench structure TS1 covered by the metal pattern layer MPL based on the undercut structure (or the eaves structure) of each of the first to third isolation patterns 104*a*, 104*b*, and 104*c*. Therefore, the self-emitting device ED formed (or deposited) over the isolation portion 104 may be isolated (or separated) between the first trench structure TS1 and the metal pattern layer MPL of each of the first to third isolation patterns 104*a*, 104*b*, and 104*c*. Thus, the self-emitting device ED may be automatically isolated (or separated) by the first to third isolation patterns 104*a*, 104*b*, and 104*c* of the isolation portion 104 in performing a deposition process, and thus, a separate patterning process of isolating (or separating) the self-emitting device ED may be omitted. Accordingly, the self-emitting device ED disposed over the first substrate 100 may be isolated (or separated) at a periphery portion of the first substrate 100, and thus, a lateral water penetration path of the first substrate 100 may be blocked by the first to third isolation patterns 104*a*, 104*b*, and 104*c* of the isolation portion 104.

Optionally, the common electrode CE disposed over the self-emitting device ED may be automatically isolated (or separated) by the first to third isolation patterns 104*a*, 104*b*, and 104*c* of the isolation portion 104 in performing a deposition process based on deposition, or may be formed to surround all of the isolated island-shaped self-emitting devices EDs and the first to third isolation patterns 104*a*, 104*b*, and 104*c* of the isolation portion 104 in performing a deposition process based on deposition.

Referring to FIGS. 7, 9, and 10, the dam portion 105 according to an embodiment of the present disclosure may be disposed at the periphery portion of the first substrate 100 or the periphery portion of an outermost pixel. For example, the outermost pixels disposed at the periphery portion of the first substrate 100 may further include the dam portion 105, and thus may be implemented to have a configuration or a structure which differs from an inner pixel.

The dam portion 105 may be disposed over the circuit layer 101 of the periphery portion of the first substrate 100 or the periphery portion of an outermost pixel to have a closed loop line shape. For example, the dam portion 105 may be disposed over the passivation layer 101*d* of the circuit layer 101 to have a closed loop line shape which surrounds the display area AA. The dam portion 105 may prevent the spread or overflow of the encapsulation layer 106 disposed over the first substrate 100 to cover the display area AA.

The dam portion 105 may be disposed between two adjacent isolation patterns of the plurality of isolation patterns 104*a*, 104*b*, and 104*c*. For example, the dam portion 105 may be implemented in a closed loop line shape to surround the first isolation pattern 104*a* and may be implemented to be surrounded by the second and third isolation patterns 104*b* and 104*c*. For example, the dam portion 105 may be disposed between the first isolation pattern 104*a* and the second isolation pattern 104*b* of the isolation portion 104.

The dam portion 105 according to an embodiment may include the same material and be formed together with the planarization layer 102. The dam portion 105 may have the same height (or thickness) as the planarization layer 102, or may have a height which is higher than the planarization layer 102. For example, a height (or thickness) of the dam portion 105 may be twice a height (or thickness) of the planarization layer 102.

The dam portion 105 according to another embodiment may include a first dam pattern (or a lower dam) 105*a* which is formed of the same material and be formed together with the planarization layer 102, and a second dam pattern (or an upper dam) 105*b* which is stacked on the first dam pattern 105*a* and includes the same material as the bank 103. The first dam pattern 105*a* may have the same height (or thickness) as the planarization layer 102, or may have a height which is higher than the planarization layer 102. For example, a height (or thickness) of the first dam pattern 105*a* may be twice a height (or thickness) of the planarization layer 102.

Referring to FIGS. 7 to 10, the encapsulation layer 106 according to an embodiment of the present disclosure may be disposed over a remaining portion, other than an outermost periphery portion including the first pad part 110, of the first substrate 100 and may be implemented to cover the light emitting device layer EDL. For example, the encapsulation layer 106 may be implemented to surround all of the front surface and lateral surfaces of the light emitting device layer EDL, and thus, may prevent oxygen or water (or moisture) from penetrating into the light emitting device layer EDL, thereby improving the reliability of the light emitting device layer EDL by oxygen or water (or moisture).

The encapsulation layer 106 according to an embodiment of the present disclosure may include first to third encapsulation layers 106*a* to 106*c*.

The first encapsulation layer 106*a* may be implemented to prevent oxygen or water from penetrating into the light emitting device layer EDL. The first encapsulation layer 106*a* may be disposed over the common electrode CE and may surround the light emitting device layer EDL. Therefore, all of a front surface and lateral surfaces of the light emitting device layer EDL may be surrounded by the first encapsulation layer 106*a*. The first encapsulation layer 106*a* according to an embodiment may include an inorganic material.

When the self-emitting device ED and the common electrode CE are isolated by the isolation portion 104, the first encapsulation layer 106*a* may surround an isolation surface (or a separation surface) of the self-emitting device ED and the common electrode CE isolated by the isolation portion 104. For example, the first encapsulation layer 106*a* may be filled (or buried) into an isolation space of the self-emitting device ED and the common electrode CE formed by an isolation structure (or an undercut structure) of the isolation portion 104 to seal or fully surround the isolation portion 104, and thus, may fully surround or cover each of the isolated self-emitting device ED and common electrode CE, thereby fundamentally (or completely) preventing the lateral penetration of water (or moisture).

The second encapsulation layer 106*b* may be implemented on the first encapsulation layer 106*a* to have a thickness which is relatively thicker than the first encapsulation layer 106*a*. The second encapsulation layer 106*b* may have a thickness for fully cover particles (or an undesired material or an undesired structure element) which is or may be on the first encapsulation layer 106*a*. The second encapsulation layer 106*b* may spread to the periphery portion of the first substrate 100 due to a relatively thick thickness, but the spread of the second encapsulation layer 106*b* may be blocked by the dam portion 105. The second encapsulation layer 106*b* may be referred to as a particle cover layer. The second encapsulation layer 106*b* according to an embodiment of the present disclosure may include an organic insulating material or a liquid organic material.

The third encapsulation layer 106*c* may be implemented to primarily prevent oxygen or water from penetrating into the light emitting device layer EDL. The third encapsulation layer 106*c* may be implemented to surround all of the second encapsulation layer 106*b* disposed inside from the dam portion 105 and the first encapsulation layer 106*a* disposed outside from the dam portion 105. The third encapsulation layer 106*c* according to an embodiment may include an inorganic material which is the same as or different from the first encapsulation layer 106*a*.

The display apparatus or the first substrate 100 according to an embodiment of the present disclosure may further include a first margin area MA1, a second margin area MA2, and a dam area DA.

The first margin area MA1 may be disposed between an emission area EA of the outermost pixel Po and the dam portion 105. The first margin area MA1 may be configured to have a first width between an end of the emission area EA (or the bank 103) of the outermost pixel Po and the dam portion 105 based on the reliability margin of the light emitting device layer EDL caused by lateral water penetration of water or moisture. Accordingly, the dam portion 105 may be implemented to be spaced apart from the end of the emission area EA by the first width of the first margin area MA1 with respect to the first direction X.

The second margin area MA2 may be disposed between the outer surface OS of the first substrate 100 and the dam portion 105. The second margin area MA2 may be configured to have a second width between the outer surface OS of the first substrate 100 and the dam portion 105 based on the reliability margin of the light emitting device layer EDL caused by lateral water penetration of water or moisture. Accordingly, the dam portion 105 may be implemented to be spaced apart from the outer surface OS of the first substrate 100 by the second width of the second margin area MA2 with respect to the first direction X. For example, the second margin area MA2 may be an area including the first pad part 110 and the second and third isolation patterns 104b and 104c.

The dam area DA may be disposed between the first margin area MA1 and the second margin area MA2. The dam area DA may be configured to have a third width corresponding to a width of a lowermost bottom surface (or a bottom surface) of the dam portion 105. For example, the dam area DA may be an area including the dam portion 105.

With respect to the first direction X, a width of each of the first margin area MA1, the second margin area MA2, and the dam area DA may be implemented so that a second interval D2 between a center portion of the outermost pixel and the outer surface OS of the first substrate 100 is half or less of a pixel pitch (a first interval D1) between two adjacent pixel areas PA.

Referring again to FIGS. 7 to 9, the display apparatus or the first substrate 100 according to an embodiment of the present disclosure may further include a wavelength conversion layer 107 disposed over the encapsulation layer 106.

The wavelength conversion layer 107 may convert a wavelength of light which is incident thereon from an emission area of each pixel area PA. For example, the wavelength conversion layer 107 may convert white light (or blue light), which is incident thereon from the emission area, into color light corresponding to the subpixel SP or may transmit only color light corresponding to the subpixel SP. For example, the wavelength conversion layer 107 may include at least one of a wavelength conversion member and a color filter layer.

The wavelength conversion layer 107 according to an embodiment may include a plurality of wavelength conversion members 107a and a protection layer 107b.

The plurality of wavelength conversion members 107a may be disposed over the encapsulation layer 106 disposed at the emission area EA of each of the plurality of subpixel areas. For example, each of the plurality of wavelength conversion members 107a may be implemented to have the same size as or wider than the emission area EA of each subpixel area.

The plurality of wavelength conversion members 107a according to an embodiment may be grouped (or classified) into a red light filter which converts white light into red light, a green light filter which converts white light into green light, and a blue light filter which converts white light into blue light. For example, the red light filter (or a first light filter) may be disposed over the encapsulation layer 106 in the emission area EA of the red subpixel SP, the green light filter (or a second light filter) may be disposed over the encapsulation layer 106 in the emission area EA of the green subpixel SP, and the blue light filter (or a third light filter) may be disposed over the encapsulation layer 106 in the emission area EA of the blue subpixel SP.

The plurality of wavelength conversion members 107a according to another embodiment may be disposed over the encapsulation layer 106 of each subpixel area. For example, each of the plurality of wavelength conversion members 107a may be disposed over the encapsulation layer 106 to overlap the entire corresponding subpixel area.

The plurality of wavelength conversion members 107a according to another embodiment may be implemented to overlap each other at the encapsulation layer 106 overlapped with the circuit area CA (or the non-emission area) except for the emission area EA of each subpixel areas. For example, two or more wavelength conversion members 107a having different colors are disposed at the encapsulation layer 106 overlapping the circuit area CA (or non-emission area) except for the emission area EA of each subpixel areas. The two or more wavelength conversion members 107a disposed at the encapsulation layer 106 overlapping the circuit area CA (or non-emission area) may act as a function of a light blocking pattern which prevents color mixture between adjacent subpixels SP or between adjacent pixels P.

The protection layer 107b may be implemented to cover the wavelength conversion members 107a and to provide a flat surface over the wavelength conversion members 107a. The protection layer 107b may be disposed to cover the wavelength conversion members 107a and the encapsulation layer 106 where the wavelength conversion members 107a are not disposed. The protection layer 107b according to an embodiment may include an organic insulating material. Alternatively, the protection layer 107b may further include a getter material for adsorbing water and/or oxygen.

Optionally, the wavelength conversion layer 107 according to another embodiment may include two or more layers wavelength conversion members 107a disposed over the encapsulation layer 106 overlapping the circuit area CA (or non-emission area) except for the emission area EA in each subpixel areas. The two or more layers wavelength conversion members 107a may act as a function of the light blocking pattern.

Alternatively, the wavelength conversion layer 107 may be changed to a wavelength conversion sheet having a sheet form and may be disposed over the encapsulation layer 106. In this case, the wavelength conversion sheet (or a quantum dot sheet) may include the wavelength conversion members 107a disposed between a pair of films. For example, when the wavelength conversion layer 107 includes a quantum dot which re-emits colored light set in a subpixel, the light emitting device layer EDL of a subpixel may be implemented to emit white light or blue light.

Referring to FIGS. 7 to 9, the display apparatus or the first substrate 100 according to an embodiment of the present disclosure may further include a functional film 108 disposed over the first substrate 100.

The functional film 108 may be disposed over the wavelength conversion layer 107. For example, the functional film 108 may be coupled to the wavelength conversion layer 107 by a transparent adhesive member. The functional film 108 according to an embodiment may include at least one of an anti-reflection layer (or an anti-reflection film), a barrier layer (or a barrier film), a touch sensing layer, and a light path control layer (or a light path control film).

The anti-reflection layer may include a circular polarization layer (or a circular polarization film) which prevents external light, reflected by TFTs and/or the pixel driving lines disposed at the substrate 100, from traveling to the outside.

The barrier layer may include a material (for example, a polymer material) which is low in water transmission rate, and may primarily prevent the penetration of water or oxygen.

The touch sensing layer may include a touch electrode layer based on a mutual capacitance method or a self-capacitance method, and may output touch data corresponding to a user's touch through the touch electrode layer.

The light path control layer may include a stacked structure where a high refraction layer and a low refraction layer are alternately stacked and may change a path of light incident from each pixel P to minimize a color shift based on a viewing angle.

Referring to FIGS. 7 to 9, the display apparatus or the first substrate 100 according to an embodiment of the present disclosure may further include a side sealing member 109.

The side sealing member 109 may be formed between the first substrate 100 and the functional film 108 and may cover all of lateral surfaces of the circuit layer 101 and the wavelength conversion layer 107. For example, the side sealing member 109 may cover all of lateral surfaces of each of the circuit layer 101 and the wavelength conversion layer 107 exposed at the outside of the display apparatus, between the functional film 108 and the first substrate 100. Also, the side sealing member 109 may cover a portion of the routing portion 400 coupled to the first pad part 110 of the first substrate 100. The side sealing member 109 may prevent lateral light leakage by light, traveling from an inner portion of the wavelength conversion layer 107 to an outer surface thereof, of light emitted from the self-emitting device ED of each subpixel SP. Particularly, the side sealing member 109 overlapping the first pad part 110 of the first substrate 100 may prevent or minimize the reflection of external light caused by the secondary pads 113 disposed in the first pad part 110.

Optionally, the side sealing member 109 may further include a getter material for adsorbing water and/or oxygen.

The display apparatus or the first substrate 100 according to an embodiment of the present disclosure may further include a first chamfer 100c which is provided at a corner portion between the first surface 100a and the outer surface OS. The first chamfer 100c may reduce or minimize the damage of the corner portion of the first substrate 100 caused by a physical impact applied from the outside and may prevent a disconnection of the routing portion 400 caused by the corner portion of the first substrate 100. For example, the first chamfer 100c may have a 45-degree angle, but embodiments of the present disclosure are not limited thereto. The first chamfer 100c may be implemented by a chamfer process using a cutting wheel, a polishing wheel, a laser, or the like. Accordingly, each of outer surfaces of the pad electrodes 111 of the first pad part 110 disposed to contact the first chamfer 100c may include an inclined surface which is inclined by an angle corresponding to an angle of the first chamfer 100c by removing or polishing a corresponding portion thereof along with the corner portion of the first substrate 100 through the chamfer process. For example, when the first chamfer 100c is formed at an angle of 45 degrees between the outer surface OS and the first surface 100a of the first substrate 100, the outer surfaces (or one ends) of the pad electrodes 111 of the first pad part 110 may be formed at an angle of 45 degrees.

Referring to FIG. 6, the second substrate 200 according to an embodiment of the present disclosure may be referred to as a wiring substrate, a line substrate, a link substrate, a lower substrate, a rear substrate, or link glass.

The second substrate 200 may be a glass substrate, or may be a thin glass substrate or a plastic substrate, which is bendable or flexible. For example, the second substrate 200 may include the same material as the first substrate 100. A size of the second substrate 200 may be the same as or substantially the same as the first substrate 100, but embodiments of the present disclosure are not limited thereto, the size of the second substrate 200 may be less than the first substrate 100. For example, the second substrate 200 may be configured to have the same size as the first substrate 100 in order to maintain or secure the stiffness of the first substrate 100.

The second substrate 200 according to an embodiment of the present disclosure may include a second pad part 210.

The second pad part 210 may be disposed at one periphery portion (or a first rear edge portion) of a rear surface 200b of the second substrate 200 aligned with the first pad part 110 disposed at a front surface of the first substrate 100. The second pad part 210 may include a plurality of second pads (or routing pads) which are arranged at a certain interval along the first direction X to respectively overlap the pads of the first pad part 110.

The plurality of second pads may be grouped (or classified) into second pixel driving power pads aligned with each of the first pixel driving power pads PPP, second data pads aligned with each of the first data pads DP, second reference voltage pads aligned with each of the first reference voltage pads RVP, second gate pads aligned with each of the first gate pads GP, and second pixel common voltage pads aligned with each of the first pixel common voltage pads CVP.

Each of the plurality of second pads may have a length which is longer than the first pad 111 of the first pad part 110, with respect to a lengthwise direction thereof or the second direction Y. For example, with respect to the lengthwise direction thereof or the second direction Y, each of the plurality of second pads may have the same length as the secondary pad 113 of the first pad part 110, or may have a length which is relatively longer than the first pad 111 of the first pad part 110.

The second substrate 200 according to an embodiment of the present disclosure may further include at least one third pad part 230 and a link line part 250.

The at least one third pad part 230 (or an input pad part) may be disposed at the rear surface 200b of the second substrate 200. For example, the at least one third pad part 230 may be disposed at a middle portion adjacent to the first periphery portion of the rear surface 200b of the second substrate 200. The at least one third pad part 230 according to an embodiment may include a plurality of third pads (or input pads) which are spaced apart from one another by a certain interval. For example, the at least one third pad part 230 may include third pixel driving power pads, third data pads, third reference voltage pads, third gate pads, and third pixel common voltage pads.

The link line part 250 may be disposed between the second pad part 210 and the at least one third pad part 230 of the rear surface 200b of the second substrate 200. For example, the link line part 250 may include a plurality of link lines disposed between the second pad part 210 and the at least one third pad part 230.

The link line part 250 according to an embodiment of the present disclosure may include a plurality of pixel driving power link lines which individually (or a one-to-one relationship) couple the second pixel driving power pads to the third pixel driving power pads, a plurality of data link lines which individually (or a one-to-one relationship) couple the second data pads to the third data pads, a plurality of reference voltage link lines which individually (or a one-to-one relationship) couple the second reference voltage pads to the third reference voltage pads, a plurality of gate link lines which individually (or a one-to-one relationship) couple the second gate pads to the third gate pads, and a plurality of pixel common voltage link lines which individually (or a one-to-one relationship) couple the second pixel common voltage pads to the third pixel common voltage pads.

Each of the plurality of pixel common voltage link lines may include a first common link line 251 and a second common link line 253. The first common link line 251 may be disposed between the second pad part 210 and the at least one third pad part 230 and commonly coupled to the plurality of second pixel common voltage pads. The second common link line 253 may be commonly coupled to the plurality of third pixel common voltage pads and electrically coupled to the first common link line 251. The second common link line 253 may be disposed on a different layer from the first common link line 251 and may be electrically connected to the first common link line 251 through a via hole. A size of the second common link line 253 may progressively increase in a direction from the third pad part 230 to the periphery portion of the second substrate 200 in order to minimize (or reduce) the voltage drop of the pixel common voltage.

Referring to FIGS. 7 and 9, the second substrate 200 according to an embodiment of present disclosure may include a metal pattern layer and an insulation layer which insulates the metal pattern layer.

The metal pattern layer (or a conductive pattern layer) may include a plurality of metal layers. The metal pattern layer according to an embodiment may include a first metal layer 201, a second metal layer 203, and a third metal layer 205. The insulation layer may include a plurality of insulation layers. For example, the insulation layer may include a first insulation layer 202, a second insulation layer 204, and a third insulation layer 206. The insulation layer may be referred to as a rear insulation layer or a pattern insulation layer.

The first metal layer 201 may be implemented over a rear surface 200*b* of a second substrate 200. The first metal layer 201 according to an embodiment may include a first metal pattern. For example, the first metal layer 201 may be referred to as a first link layer or a link line layer.

The first metal pattern according to an embodiment may have a two-layer structure (Cu/MoTi) of Cu and MoTi. The first metal pattern may be used as a link line of the link line part 250, and thus, their repetitive descriptions are omitted.

The first insulation layer 202 may be implemented over the rear surface 200*b* of the second substrate 200 to cover the first metal layer 201. The first insulation layer 202 according to an embodiment may include an inorganic insulating material.

The second metal layer 203 may be implemented over the first insulation layer 202. The second metal layer 203 according to an embodiment may include a second metal pattern. For example, the second metal layer 203 may be referred to as a second link layer, a jumping line layer, or a bridge line layer.

The second metal pattern according to an embodiment may have a two-layer structure (Cu/MoTi) of Cu and MoTi. The second metal pattern may be used as a plurality of gate link lines of a plurality of link lines in the link line part 250, but embodiments of the present disclosure are not limited thereto. For example, the second metal layer 203 may be used as a jumping line (or a bridge line) for electrically connecting the link lines which are formed of different metal materials on different layers in the link line part 250.

Optionally, a link line (for example, a plurality of first link lines) disposed at the second metal layer 203 may be modified to be disposed at the first metal layer 201, and a link line (for example, a plurality of second link lines) disposed at the first metal layer 201 may be modified to be disposed at the second metal layer 203.

The second insulation layer 204 may be implemented over the rear surface 200*b* of the second substrate 200 to cover the second metal layer 203. The second insulation layer 204 according to an embodiment may include an inorganic insulating material.

The third metal layer 205 may be implemented over the second insulation layer 204. The third metal layer 205 according to an embodiment may include a third metal pattern. For example, the third metal layer 205 may be referred to as a third link layer or a pad electrode layer.

The third metal pattern according to an embodiment may have a stacked structure of at least two materials of ITO (or IZO), Mo, Ti, and MoTi. For example, the third metal pattern may have a three-layer structure of any one of ITO/Mo/ITO, ITO/MoTi/ITO, IZO/Mo/ITO, or IZO/MoTi/ITO. The third metal pattern may be used as the second pads 211 of the second pad part 210. For example, the second pads 211 of the second pad part 210 formed of the third metal layer 205 may be electrically coupled to the first metal layer 201 through second substrate pad contact holes formed in the first and second insulation layers 202 and 204 formed over the second substrate.

The third insulation layer 206 may be implemented over the rear surface 200*b* of the second substrate 200 to cover the third metal layer 205. The third insulation layer 206 according to an embodiment may include an organic insulating material. For example, the third insulation layer 206 may include an insulating material such as photo acrylic or the like. The third insulation layer 206 may cover the third metal layer 205 to prevent the third metal layer 205 from being exposed at the outside. The third insulation layer 206 may be referred to as an organic insulation layer, a protection layer, a rear protection layer, an organic protection layer, a rear coating layer, or a rear cover layer.

Each of the plurality of second pads 211 disposed at the second pad part 210 may be electrically coupled to a link line of a link line part 250 made of the first metal layer 201 or the second metal layer 203 disposed at the rear surface 200*b* of the second substrate 200, through a second pad contact hole disposed in the first and second insulation layers 202 and 204. For example, the second data pad may be electrically coupled to one end of a data link line through the second pad contact hole disposed in the first and second insulation layers 202 and 204.

Referring to FIGS. 6, 7, and 9, the coupling member 300 according to an embodiment of present disclosure may be disposed between the first substrate 100 and the second substrate 200. The first substrate 100 and the second substrate 200 may be opposite-bonded to each other by the coupling member 300. The coupling member 300 according to an embodiment may be a transparent adhesive member or a double-sided tape including an optically clear adhesive (OCA), an optically clear resin (OCR), or a pressure sensitive adhesive (PSA). The coupling member 300 according to another embodiment may include a glass fiber.

The coupling member 300 according to an embodiment may be disposed at a whole space between the first substrate 100 and the second substrate 200. For example, all of the second surface 100*b* of the first substrate 100 may be coupled to all of one surface of the coupling member 300, and all of a front surface 200*a* of the second substrate 200 may be coupled to all of the other surface of the coupling member 300.

The coupling member 300 according to another embodiment may be disposed in a pattern structure between the first substrate 100 and the second substrate 200. For example, the coupling member 300 may have a line pattern structure or a mesh pattern structure. The mesh pattern structure may further include a bent portion which discharges an air bubble, occurring between the first substrate 100 and the second substrate 200 in a process of bonding the first substrate 100 to the second substrate 200, to the outside.

Optionally, the coupling member 300 may further include a heat transfer element. In this case, the coupling member 300 may transfer heat, occurring in the first substrate 100, to the second substrate 200 through the heat transfer element to prevent or minimize an increase in temperature of the first substrate 100. The second substrate 200 may act as a temperature lowering member which prevents or minimizes an increase in temperature of the first substrate 100. For example, the heat transfer element may include a plurality of heat transfer particles or a heat transfer layer including a metal material. When the heat transfer element includes a heat transfer layer including a metal material, the heat transfer layer may be electrically grounded or floated, and thus, may act as a noise blocking layer which prevents frequency noise or static electricity, occurring in a driving circuit disposed at the rear surface 200b of the second substrate 200, from flowing into the pixels, the pixel driving lines, and the gate driving circuit 150, which are disposed at the first substrate 100.

Referring to FIGS. 6 and 7, the routing portion 400 according to an embodiment of present disclosure may be disposed to surround an outer surface OS of the first substrate 100 and an outer surface OS of the second substrate 200. For example, the routing portion 400 may be disposed at each of a first outer surface (or one surface) OS1a of the outer surface OS of the first substrate 100 and a first outer surface (or one surface) OS1b of the outer surface OS of the second substrate 200. For example, the routing portion 400 may be referred to as a side line portion, a side routing portion, an edge routing portion, an wiring portion, or the like.

The routing portion 400 according to an embodiment of present disclosure may include a plurality of routing lines 410 which are disposed at each of the first outer surface (or one surface) OS1a of the outer surface OS of the first substrate 100 and the first outer surface (or one surface) OS1b of the outer surface OS of the second substrate 200.

Each of the plurality of routing lines 410 may be formed to surround each of the first outer surface OS1a of the first substrate 100 and the first outer surface OS1b of the second substrate 200. According to an embodiment, each of the plurality of routing lines 410 may be formed by a printing process using a conductive paste. According to another embodiment, each of the plurality of routing lines 410 may be formed by a transfer process that transfers the conductive paste pattern to a transfer pad made of a flexible material and transfers the conductive paste pattern transferred to the transfer pad to the routing portion 400. For example, the conductive paste may be an Ag paste, but embodiments of the present disclosure are not limited thereto.

Each of the plurality of routing lines 410 may be electrically coupled to the first pad part 110 and the second pad part 210 in one-to-one relationship.

Each of the plurality of routing lines 410 may be electrically coupled to each of the secondary pads 113 of the first pad part 110 and each of the second pads 211 of the second pad part 210 in one-to-one relationship.

According to another embodiment, in each of the plurality of routing lines 410, one end portion thereof may surround a first chamfer 100c and the secondary pads 113 of the first pad part 110 disposed at a first periphery portion of the first substrate 100, the other end portion thereof may surround a second chamfer 200c and the second pad 211 of the second pad part 210 disposed at a first periphery portion of the second substrate 200, and a center portion thereof between the one end portion and the other end portion may surround each of the first outer surface OS1a of the first substrate 100 and the first outer surface OS1b of the second substrate 200. For example, the one end portion of each of the plurality of routing lines 410 may directly contact with both the uppermost surface and the side surface of the secondary pads 113. The other end portion of each of the plurality of routing lines 410 may directly contact with both the rearmost surface and the side surface of the second pads 211. For example, in a data routing line 410, one end portion thereof may be implemented to surround the first chamfer 100c and a data secondary pad of the first pad part 110 disposed at the first periphery portion of the first substrate 100, the other end portion thereof may be implemented to surround the second chamfer 200c and a second data pad of the second pad part 210 disposed at a first periphery portion of the second substrate 200, and a center portion thereof between the one end portion and the other end portion may be implemented to surround each of the first outer surface OS1a of the first substrate 100 and the first outer surface OS1b of the second substrate 200.

The plurality of routing lines 410 according to an embodiment of the present disclosure may be grouped (classified) into a plurality of pixel power routing lines 411, a plurality of data routing lines 413, a plurality of reference voltage routing lines 415, a plurality of gate routing lines 417, and a plurality of pixel common voltage routing lines 419.

The plurality of pixel power routing lines 411 may be formed to surround the first pad part 110, the outer surface OS, and the second pad part 210, and may be electrically coupled to the plurality of pixel driving power secondary pads of the first pad part 110 and the plurality of second pixel driving power pads of the second pad part 210 in a one-to-one relationship.

The plurality of data routing lines 413 may be formed to surround the first pad part 110, the outer surface OS, and the second pad part 210, and may be electrically coupled to the plurality of data secondary pads of the first pad part 110 and the plurality of second data pads of the second pad part 210 in a one-to-one relationship.

The plurality of reference voltage routing lines 415 may be formed to surround the first pad part 110, the outer surface OS, and the second pad part 210, and may be electrically coupled to the plurality of reference voltage secondary pads of the first pad part 110 and the plurality of second reference voltage pads of the second pad part 210 in a one-to-one relationship.

The plurality of gate routing lines 417 may be formed to surround the first pad part 110, the outer surface OS, and the second pad part 210, and may be electrically coupled to the plurality of gate secondary pads of the first pad part 110 and the plurality of second gate pads of the second pad part 210 in a one-to-one relationship.

The plurality of pixel common voltage routing lines 419 may be formed to surround the first pad part 110, the outer surface OS, and the second pad part 210, and may be electrically coupled to the plurality of pixel common voltage secondary pads of the first pad part 110 and the plurality of second pixel common voltage pads of the second pad part 210 in a one-to-one relationship.

The display apparatus or the routing portion 400 according to an embodiment of present disclosure may further include an edge coating layer 430.

The edge coating layer 430 may be implemented to cover the routing portion 400. The edge coating layer 430 may be implemented to cover the plurality of routing lines 410. For example, the edge coating layer 430 may be an edge protection layer or an edge insulating layer.

The edge coating layer 430 according to an embodiment may be implemented to cover all of the first periphery portion and the first outer surface OS1a of the first substrate 100 and the first periphery portion and the first outer surface OS1b of the second substrate 200 as well as the plurality of routing lines 410. The edge coating layer 430 may prevent the corrosion of each of the plurality of routing lines 410 including a metal material or electrical short circuit between the plurality of routing lines 410. Also, the edge coating layer 430 may prevent or minimize the reflection of external light caused by the plurality of routing lines 410 and the secondary pads 113 of the first pad part 110. As an embodiment, the edge coating layer 430 may include a light blocking material including black ink.

As another embodiment, the edge coating layer 430 may implement (or configure) the outermost surface (or sidewall) of the display apparatus (or the display panel), and thus, may include an impact absorbing material (or substance) or a ductile material so as to prevent the damage of an outer surface OS of each of the first and second substrates 100 and 200. As another embodiment, the edge coating layer 430 may include a mixed material of a light blocking material and an impact absorbing material.

According to an embodiment, the edge coating layer 430 may be formed to surround one outer surface OS of each of the first and second substrates 100 and 200 on which the routing portion 400 is disposed.

According to another embodiment, as illustrated in FIGS. 6, 7, and 9, the edge coating layer 430 may be formed to surround all of the other outer surfaces OS as well as the one outer surface OS of each of the first and second substrates 100 and 200 on which the routing portion 400 is disposed. For example, the edge coating layer 430 may be formed to surround all outer surfaces OS of each of the first and second substrates 100 and 200. In this case, the one outer surface OS (or a first outer surface, FOS) of each of the first and second substrates 100 and 200 may be surrounded by the plurality of routing lines 410 and the edge coating layer 430. The other outer surfaces OS, which comprise a second outer surface SOS, a third outer surface TOS and a fourth outer surface, FROS (or second to fourth outer surfaces), except the one outer surface OS, of each of the first and second substrates 100 and 200 may be surrounded by only the edge coating layer 430. For example, the first outer surface of each of the first and second substrates 100 and 200 may include the plurality of routing lines 410 and the edge coating layer 430, and the second to fourth outer surfaces, except the first outer surface, of each of the first and second substrates 100 and 200 may include only the edge coating layer 430.

According to an embodiment, when the plurality of routing lines 410 and the edge coating layer 430 disposed at the first outer surface are referred to as a first sidewall structure, and the edge coating layer 430 disposed at the second to fourth outer surfaces are referred to as a second sidewall structure, the first sidewall structure and the second sidewall structure may have different thicknesses (or widths). For example, a thickness (or a width) of the second sidewall structure may be thinner or narrower than a thickness (or a width) of the first sidewall structure by a thickness of the plurality of routing lines 410.

Referring to FIG. 6, the display apparatus according to an embodiment of the present disclosure may further include a driving circuit part 500.

The driving circuit part 500 may drive (or emit light) the pixels P disposed on the first substrate 100 based on digital video data and a timing synchronization signal supplied from a display driving system to allow the display area AA to display an image corresponding to image data. The driving circuit part 500 may be coupled to the at least one third pad part 230 disposed at the rear surface 200b of the second substrate 200 and may output, to the at least one third pad part 230, a data signal, a gate control signal, and a driving power for driving (or emitting light) the pixels P disposed at the first substrate 100.

The driving circuit part 500 according to an embodiment may include a flexible circuit film 510, a driving integrated circuit (IC) 530, a printed circuit board (PCB) 550, a timing controller 570, and a power circuit 590.

The flexible circuit film 510 may be connected to the at least one third pad part 230 disposed at the rear surface 200b of the second substrate 200.

The driving IC 530 may be mounted on the flexible circuit film 510. The driving IC 530 may receive subpixel data and a data control signal provided from the timing controller 570, and convert the subpixel data into an analog data signal based on the data control signal to supply the analog data signal to a corresponding data line DL. The data signal may be supplied to a corresponding third data pads in the at least one third pad part 230 through the flexible circuit film 510.

The driving IC 530 may sense a characteristic value of a driving TFT disposed in the subpixel SP through the plurality of reference voltage lines (or pixel sensing line) RL disposed at the first substrate 100, generate sensing raw data corresponding to a sensing value for each subpixel, and provide the sensing raw data for each subpixel to the timing controller 570.

The PCB 550 may be coupled to the other side periphery portion of the flexible circuit film 510. The PCB 550 may transfer a signal and power between elements of the driving circuit part 500.

The timing controller 570 may be mounted on the PCB 550 and may receive the digital video data and the timing synchronization signal provided from the display driving system through a user connector disposed on the PCB 550. Alternatively, the timing controller 570 may not be mounted on the PCB 550 and may be implemented in the display driving system or may be mounted on a separate control board connected between the PCB 550 and the display driving system.

The timing controller 570 may align the digital video data based on the timing synchronization signal to generate pixel data matching a pixel arrangement structure disposed in the display area AA and may provide the generated pixel data to the driving IC 530.

The timing controller 570 may generate each of the data control signal and the gate control signal based on the timing synchronization signal, control a driving timing of the driving IC 530 based on the data control signal, and control a driving timing of the gate driving circuit 150 based on the gate control signal. For example, the timing synchronization signal may include a vertical synchronization signal, a horizontal synchronization signal, a data enable signal, and a main clock (or a dot clock).

The data control signal according to an embodiment of the present disclosure may include a source start pulse, a source shift clock, and a source output signal, or the like. The data control signal may be supplied to the driving IC 530 through the flexible circuit film 510.

The gate control signal according to an embodiment may include a start signal (or a gate start pulse), and a plurality of shift clocks, or the like. In this case, the plurality of shift clocks may include a plurality of scan clocks where phases thereof are sequentially shifted and a plurality of carry clocks where phases thereof are sequentially shifted. The gate control signal may be supplied to the gate driving circuit 150 through the at least one third pad part 230, the link line part 250, the second pad part 210, the routing portion 400, the first pad part 110, and gate control limes GCL.

The timing controller 570 may drive each of the driving IC 530 and the gate driving circuit 150 based on an external sensing mode during a predetermined external sensing period, generate compensation data of each subpixel for compensating for a characteristic variation of the driving TFT of each subpixel based on the sensing raw data provided from the driving IC 530, and modulate pixel data of each subpixel based on the generated compensation data of each subpixel. For example, the timing controller 570 may drive each of the driving IC 530 and the gate driving circuit 150 based on the external sensing mode for each external sensing period corresponding to a blank period (or a vertical blank period) of the vertical synchronization signal. For example, the external sensing mode may be performed in a process of powering on the display apparatus, a process of powering off the display apparatus, a process of powering off the display apparatus after being driven for a long time, or a blank period of a frame which is set in real time or periodically.

The timing controller 570 according to an embodiment may store the sensing raw data of each subpixel, provided from the driving IC 530, in a storage circuit based on the external sensing mode. Also, in a display mode, the timing controller 570 may correct pixel data which is to be supplied to each subpixel, based on the sensing raw data stored in the storage circuit and may provide corrected pixel data to the driving IC 530. Here, sensing raw data of each subpixel may include sequential variation information about each of a driving TFT and a self-emitting device, which are disposed in a corresponding subpixel. Therefore, in the external sensing mode, the timing controller 570 may sense a characteristic value (for example, a threshold voltage or mobility) of a driving TFT disposed in each subpixel and based thereon, may correct pixel data which is to be supplied to each subpixel, thereby minimizing or preventing the degradation in image quality caused by a characteristic value deviation of driving TFTs of a plurality of subpixels. The external sensing mode of a display apparatus may be technology known to those skilled in the art, and thus, its detailed description is omitted. For example, the display apparatus according to an embodiment of the present disclosure may sense a characteristic value of the driving TFT disposed in each subpixel P based on a sensing mode disclosed in Korean Patent Publication No. 10-2016-0093179, 10-2017-0054654, or 10-2018-0002099.

The power circuit 590 may be mounted on the PCB 550 and may generate various source voltages needed for displaying an image on the pixels P by using an input power supplied from the outside to provide the generated source voltage to a corresponding circuit. For example, the power circuit 590 may generate and output a logic source voltage needed for driving of each of the timing controller 570 and the driving IC 530, the plurality of reference gamma voltages provided to the driving IC 530, and at least one gate driving power and at least one gate common power needed for driving of the gate driving circuit 150. Also, the power circuit 590 may generate and output the pixel driving power and the pixel common voltage, but embodiments of the present disclosure are not limited thereto. For example, the driving IC 530 may generate and output the pixel driving power and the pixel common voltage based on the plurality of reference gamma voltages.

Figure 11:
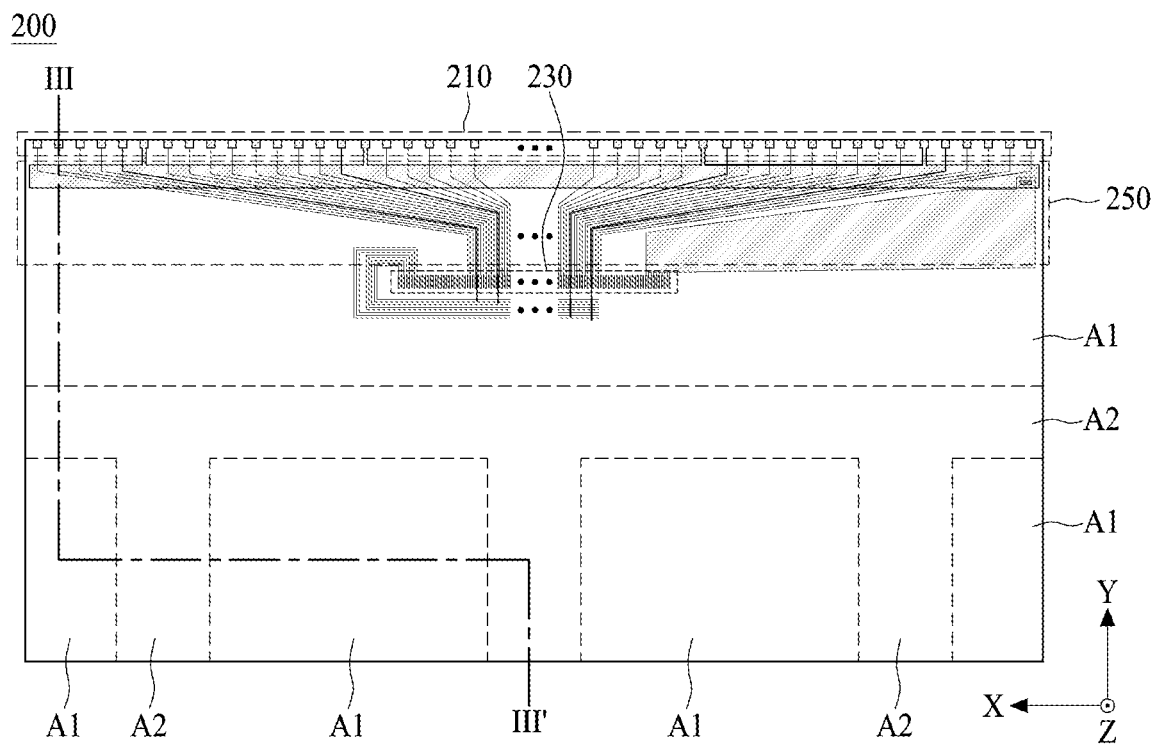
FIG. 11 is a diagram illustrating a second substrate illustrated in FIGS. 6, 7, and 9.
Figure 12:
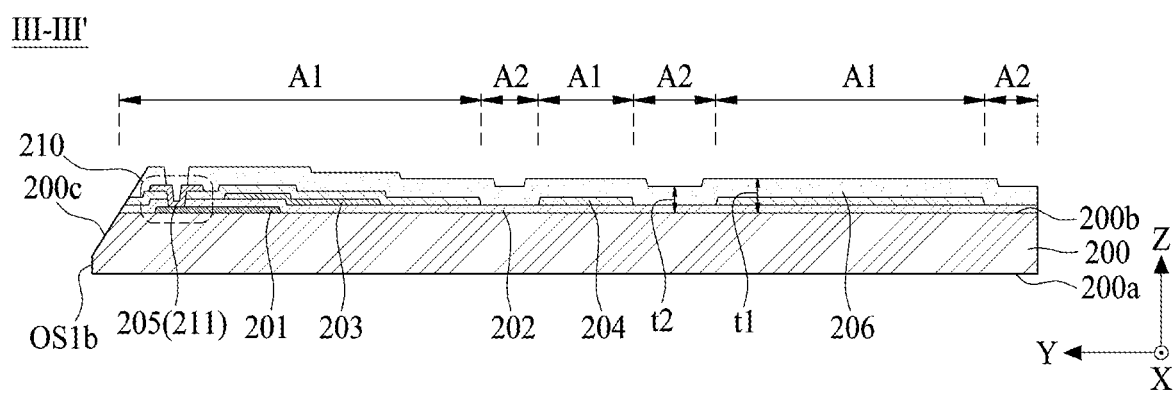
FIG. 12 is another cross-sectional view taken along line III-III' illustrated in FIG. 11.

FIG. 11 is a diagram illustrating a second substrate illustrated in FIGS. 6, 7, and 9, and FIG. 12 is another cross-sectional view taken along line illustrated in FIG. 11. FIGS. 11 and 12 illustrate an embodiment which is implemented to modify the second insulation layer illustrated in FIGS. 7 and 9. In describing FIGS. 11 and 12, elements which are the same or correspond to the elements of FIGS. 6, 7, and 9 are referred to by like reference numerals, and their repetitive descriptions are omitted or will be briefly described below.

Referring to FIGS. 11 and 12, a second substrate 200 according to another embodiment of the present disclosure may include a first area A1 and a second area A2.

The first area A1 and the second area A2 may be disposed or implemented at a rear insulation layer (or a pattern insulation layer) disposed at a rear surface of the second substrate 200.

In order to prevent or minimize a bending phenomenon which occurs in an outer portion of the second substrate 200, the rear insulation layer may include the first area A1 and the second area A2, in which the insulation layer has different thicknesses. For example, the layer in the second area A2 may have a thickness t2 which is thinner than a thickness t1 of the first area A1.

The rear insulation layer according to an embodiment may include an isolation pattern area. In the rear insulation layer, the layer in a non-isolation pattern area may have a first thickness t1, and the layer in the isolation pattern area may have a second thickness t2 which is thinner than the first thickness t1. For example, the isolation pattern area may include only one insulation layer of the first insulation layer 202 and the second insulation layer 204, and thus, may have a thickness which is thinner than the non-isolation pattern area including a stacked structure of all of the first insulation layer 202 and the second insulation layer 204. For example, the non-isolation pattern area may correspond to the first area A1, and the isolation pattern area may correspond to the second area A2. The second area A2 or the isolation pattern area may be referred to as a stepped area, a single-layer inorganic layer area, a stress decrease area, or a bending limitation area.

The first area (or a metal pattern layer) A1 may be disposed at a region including the second pad part 210, the at least one third pad part 230, and the link line part 250, of the rear surface 200b of the second substrate 200. The first area A1 according to an embodiment may include a first insulation layer 202 disposed over the rear surface 200b of the second substrate 200 and a second insulation layer 204 disposed over the first insulation layer 202. The rear insulation layer may insulate the metal pattern layer. The first area A1 may be covered by the third insulation layer 206 including an organic layer. The first area A1 may include a multi-layer inorganic layer structure based on a stacked structure of the first insulation layer 202 and the second insulation layer 204 including an inorganic insulating material.

The second area A2 may be disposed at a region except the first area A1 of the rear surface 200b of the second substrate 200. For example, the second area A2 may be disposed at a partial region of a region between the third pad part 230 and a second outer surface (or the other surface or a second long side), which is parallel to a first outer surface (or one surface or a first long side), of the second substrate 200, and in this case, the first area A1 may be disposed at the other region of the region between the second outer surface of the second substrate 200 and the third pad part 230.

The second area A2 according to an embodiment may include a single inorganic layer by the first insulation layer 202 disposed over the rear surface 200b of the second substrate 200. For example, the second insulation layer 204 may be formed to cover all of the first insulation layer 202 disposed at the rear surface 200b of the second substrate 200, and the second insulation layer 204 disposed at the second area A2 may be removed by a patterning process, whereby the second insulation layer 204 may not be disposed in the second area A2. Therefore, the second area A2 may be surrounded by the first area A1. The first insulation layer 202 disposed at the second area A2 may directly contact the third insulation layer 206 including an organic layer, or may be covered by the third insulation layer 206.

Because the second area A2 includes a single inorganic layer structure by the first insulation layer 202 including an inorganic insulating material, the layer in the second area A2 may have a thickness which is relatively thinner than the first area A1 including a multi-layer inorganic layer structure based on the first insulation layer 202 and the second insulation layer 204. Accordingly, the second area A2 may prevent or minimize the bending of an outer portion of the second substrate 200 in a process of bonding (or laminating) the first substrate to the second substrate by using a coupling member. Also, the second area A2 may prevent or minimize the bending of an outer portion of the second substrate 200 in a process of forming the secondary pads at the first substrate and/or forming the routing portion.

Because a metal pattern is not disposed in a region other than a region between the outer surface OS1b of the second substrate 200 and the third pad part 230, and the second substrate 200 includes a multi-layer inorganic layer structure by the first insulation layer 202 and the second insulation layer 204, the bending of the second substrate 200 may occur due to a stress difference between the second substrate 200 and an inorganic layer. For example, a bending phenomenon may occur in an outer portion of the second substrate 200 due to a compressive stress caused by a stacked inorganic layer disposed at the rear surface 200b of the second substrate 200, and the bending of the second substrate 200 may cause a bonding defect caused by misalignment between the first substrate and the second substrate in the process of bonding (or laminating) the first substrate to the second substrate by using the coupling member.

The second area A2 according to another embodiment of the present disclosure may include the second area A2 having a single inorganic layer by the first insulation layer 202, and thus, may separate (or isolate) a portion of the second insulation layer 204 to decrease a stress to the second substrate 200 caused by an inorganic layer, thereby diffusing a compressive stress applied to the second substrate 200 to prevent or minimize the bending of the outer portion of the second substrate 200.

The second area A2 according to an embodiment may include a first pattern area parallel to a first direction X and a plurality of second pattern areas which protrude from one side of the first pattern area in parallel with a second direction Y.

According to another embodiment, the second area A2 may be disposed or implemented to have a ladder shape, a mesh shape, or an island shape.

Optionally, the second area A2 may include a single inorganic layer by the second insulation layer 204 directly contacting the rear surface 200b of the second substrate 200. For example, the first insulation layer 202 may be formed to cover all of the rear surface 200b of the second substrate 200, and the first insulation layer 202 disposed at the second area A2 may be removed by a patterning process, whereby the first insulation layer 202 may not be disposed at the second area A2. Also, the second insulation layer 204 may be formed on the first insulation layer 202 in the first area A1 and may be formed at the rear surface 200b of the second substrate 200 overlapping the second area A2, and thus, may directly contact the rear surface 200b of the second substrate 200 in the second area A2. Accordingly, the second area A2 may include a single inorganic layer based on the second insulation layer 204, thereby diffusing a compressive stress applied to the second substrate 200 to prevent or minimize the bending of the outer portion of the second substrate 200.

The second area A2 may be referred to as a stepped area, a single-layer inorganic layer area, a stress decrease area, a bending limitation area, or an isolation pattern area.

The second substrate 200 according to another embodiment of the present disclosure may include the first area A1 having a multi-layer inorganic layer structure and the second area A2 having a single-layer inorganic layer structure, and thus, the bending of the outer portion of the second substrate 200 may be prevented or minimized. Therefore, in a display apparatus including the second substrate 200 according to another embodiment of the present disclosure, the bending of the outer portion of the second substrate 200 may be prevented or minimized in the process of bonding (or laminating) the first substrate to the second substrate by using the coupling member, thereby minimizing or preventing a bonding defect caused by misalignment between the first substrate and the second substrate.

FIGS. 13A to 13D are diagrams illustrating a method of forming a pad part and a routing portion in a display apparatus according to an embodiment of the present disclosure.

A method of forming a pad part and a routing portion according to an embodiment of the present disclosure will be described below with reference to FIGS. 13A to 13D.

Figure 13A:
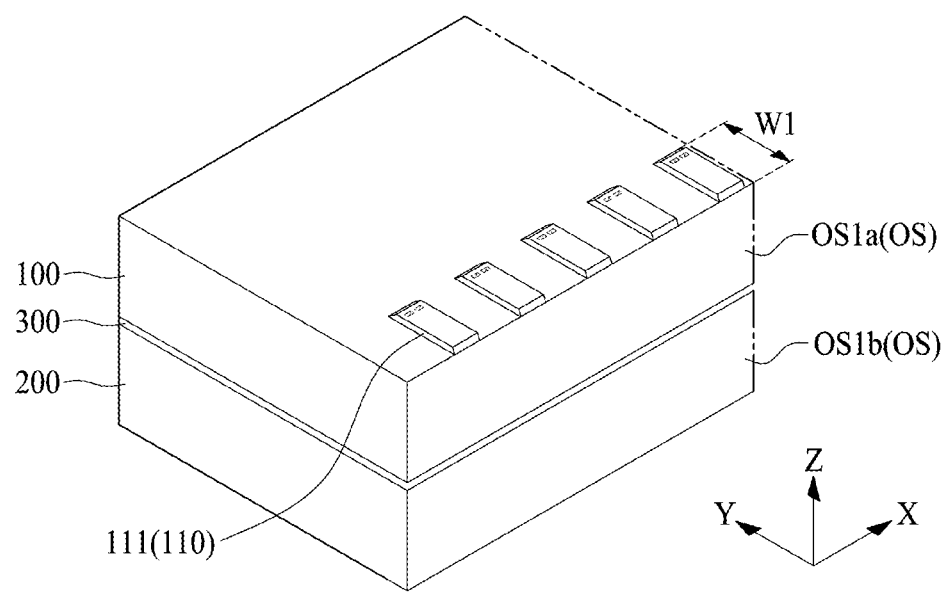
FIGS. 13A to 13D are diagrams illustrating a method of forming a pad part and a routing portion in a display apparatus according to an embodiment of the present disclosure.

As illustrated in FIGS. 6, 7, and 13A, the first substrate 100 including the first pad part 110 including the first pads 111 and the second substrate 200 including the second pads 211 may be manufactured through separate manufacturing processes. Here, the first pads 111 may have a first width (or length) W1 of 50 μm to 100 μm with respect to a lengthwise direction thereof or the second direction Y, but embodiments of the present disclosure are not limited thereto. For example, some of the first pads 111 may be exposed by a pad open process performed after an encapsulation layer is formed.

Subsequently, the first substrate 100 may be opposite-bonded to the second substrate 200 by a coupling member 300.

Figure 13B:
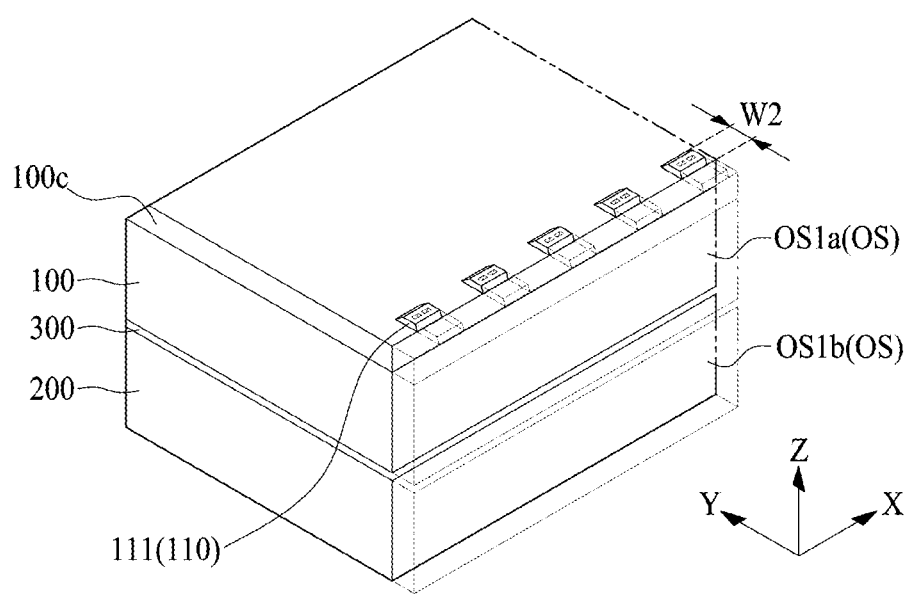

Subsequently, as illustrated in FIGS. 6, 7, and 13B, an outer surface OS1a of the first substrate 100, an outer surface OS1b of the second substrate 200, one side of each of the first pads 111, and one side of each of the second pads 211 may be simultaneously polished through a substrate polishing process. For example, the first pads 111 may have a second width (or length) W2 of 5 μm to 50 μm with respect to a lengthwise direction thereof or the second direction Y, but embodiments of the present disclosure are not limited thereto. In this case, each of the outer surface OS1a of the first substrate 100, the outer surface OS1b of the second substrate 200, the one side of each of the first pads 111, and the one side of each of the second pads 211 may be polished by a difference between the first width W1 and the second width W2 of the first pads 111.

Subsequently, by using a substrate chamfering process using a cutting wheel, a polishing wheel, or a laser, a first chamfer 100c may be formed at a corner portion between a first surface (or a front surface) and the outer surface OS1a of the first substrate 100, and a second chamfer 200c may be formed at a corner portion between a second surface (or a rear surface) and the outer surface OS1b of the second substrate 200. For example, the first chamfer 100c may be formed to be inclined by an angle of 45 degrees between the first surface and the outer surface OS1a of the first substrate 100, and thus, one end of each of the first pads 111 may be formed to be inclined by an angle of 45 degrees, but embodiments of the present disclosure are not limited thereto. Likewise, the second chamfer 200c may be formed to be inclined by an angle of 45 degrees between the second surface and the outer surface OS1b of the second substrate 200, and thus, one end of each of the second pads 211 may be formed to be inclined by an angle of 45 degrees, but embodiments of the present disclosure are not limited thereto.

Figure 13C:
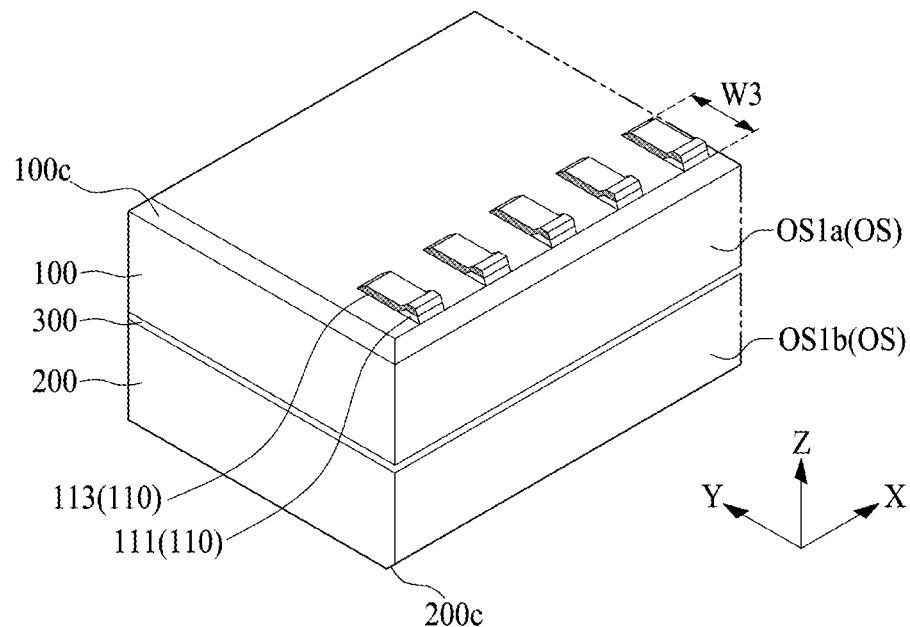

Subsequently, as illustrated in FIGS. 6, 7, and 13C, the plurality of secondary pads 113 may be respectively formed on the first pads 111 disposed on the first substrate 100. For example, the plurality of secondary pads 113 may respectively cover the plurality of first pads 111, and one end of each of the plurality of secondary pads 113 may be electrically and directly coupled to a corresponding first pad 111.

Each of the plurality of secondary pads 113 may have a line shape where the plurality of secondary pads 113 extend long along the second direction Y and are disposed spaced apart from one another along the first direction X or electrically decoupled from one another. For example, each of the plurality of secondary pads 113 may extend toward the inner portion of the display area AA from the outer surface OS of the first substrate 100 along the second direction Y.

Each of the plurality of secondary pads 113 may have a third width W3 which is relatively greater than the second width W2 of a corresponding first pad 111, or may have a length which is relatively longer than the corresponding first pad 111. For example, with respect to the lengthwise direction or the second direction Y, when each of the plurality of first pads 111 has a length of 5 μm to 50 μm, each of the plurality of secondary pads 113 may have a length of 50 μm to 150 μm, but embodiments of the present disclosure are not limited thereto.

Each of the plurality of secondary pads 113 according to an embodiment of the present disclosure may be implemented by a process which does not use a photo process and an etching process. For example, each of the plurality of secondary pads 113 may be implemented by a printing process using a conductive paste, a transfer process of transferring a conductive paste pattern to a transfer pad including a ductile material to transfer a conductive paste pattern, a metal deposition process using a mask, a metal deposition process using a masking member, or a metal deposition process using a mask and a laser scribing process, but embodiments of the present disclosure are not limited thereto.

According to an embodiment of the present disclosure, in a metal deposition process using a mask, the plurality of secondary pads 113 may be formed through a metal deposition process using a mask including a plurality of opening portions respectively overlapping only the plurality of first pads 111.

According to an embodiment of the present disclosure, in a metal deposition process using a masking member, a masking member including a plurality of opening portions respectively overlapping only the plurality of first pads 111 may be attached on the first pad part 110 of the first substrate 100, the plurality of secondary pads 113 may be formed through a metal deposition process using the masking member, and the plurality of secondary pads 113 may be formed through a process of removing (or stripping) the masking member.

According to an embodiment of the present disclosure, in a metal deposition process using a mask and a laser scribing process, a region, other than the first pad part 110, of the first substrate 100 may be covered by a mask, a metal pad layer may be formed on the first pad part 110 of the first substrate 100 through the metal deposition process subsequently, and then, the plurality of secondary pads 113 may be formed by patterning the metal pad layer through the laser scribing process.

Figure 13D:
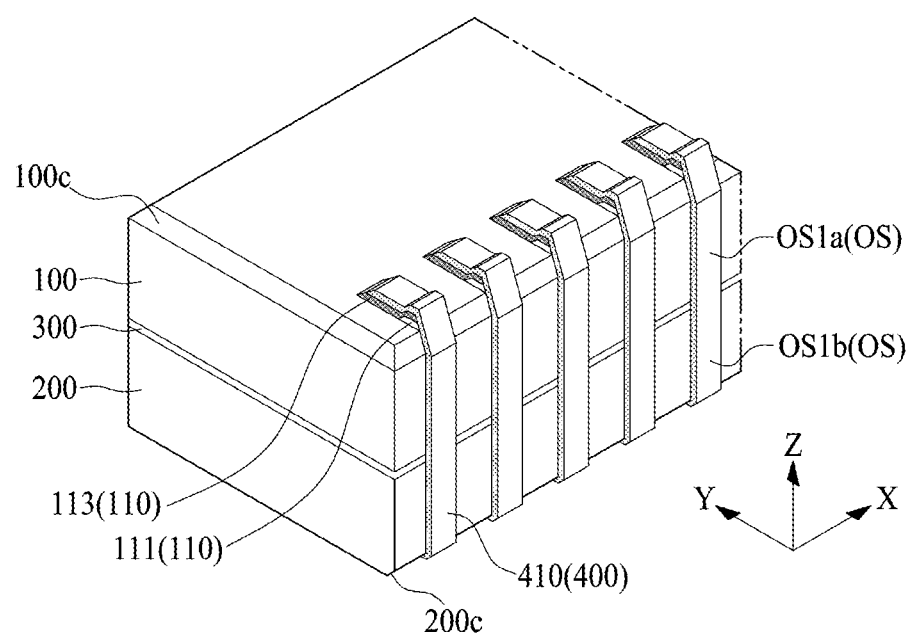

Subsequently, as illustrated in FIGS. 6, 7, and 13D, the plurality of routing lines 410 may be formed through a printing process using a conductive paste or a transfer process of transferring a conductive paste pattern to a transfer pad including a ductile material to transfer a conductive paste pattern.

Each of the plurality of routing lines 410 may be formed to surround each of the first outer surface OS1a of the first substrate 100 and the first outer surface OS1b of the second substrate 200 and may be electrically coupled to each of the secondary pads 113 of the first pad part 110 and each of the second pads 211 of the second pad part 210 in a one-to-one relationship. A description of each of the plurality of routing lines 410 is the same as or similar to a description of the routing portion 400 illustrated in FIGS. 6, 7, and 9, and thus, their repetitive descriptions are omitted.

Subsequently, an edge coating layer surrounding all of the first outer surface OS1a and the first pad part 110 of the first substrate 100, the first outer surface OS1b and the second pad parts of the second substrate 200, and the plurality of routing lines 410 may be further formed. For example, the edge coating layer may be formed to surround only the one outer surface OS1a of the first substrate 100 and the one outer surface OS1b of the second substrate 200 or to surround all outer surfaces OS of each of the first and second substrates 100 and 200, and thus, their repetitive descriptions are omitted.

As described above, because a first pad part is disposed in an outermost pixel disposed at an outermost periphery portion of the first substrate (or a substrate) 100, the display apparatus according to an embodiment of the present disclosure may have an air bezel structure which has a zeroized bezel or where a bezel area is not provided. Also, the display apparatus according to an embodiment of the present disclosure may include a secondary pad electrically coupled to a first pad, a substantial length (or a size) of each of first pads may extend through the secondary pad, and thus, a contact area between the first pad and a routing line may increase in the air bezel structure, thereby preventing a contact defect between the first pad and the routing line.

Figure 14:
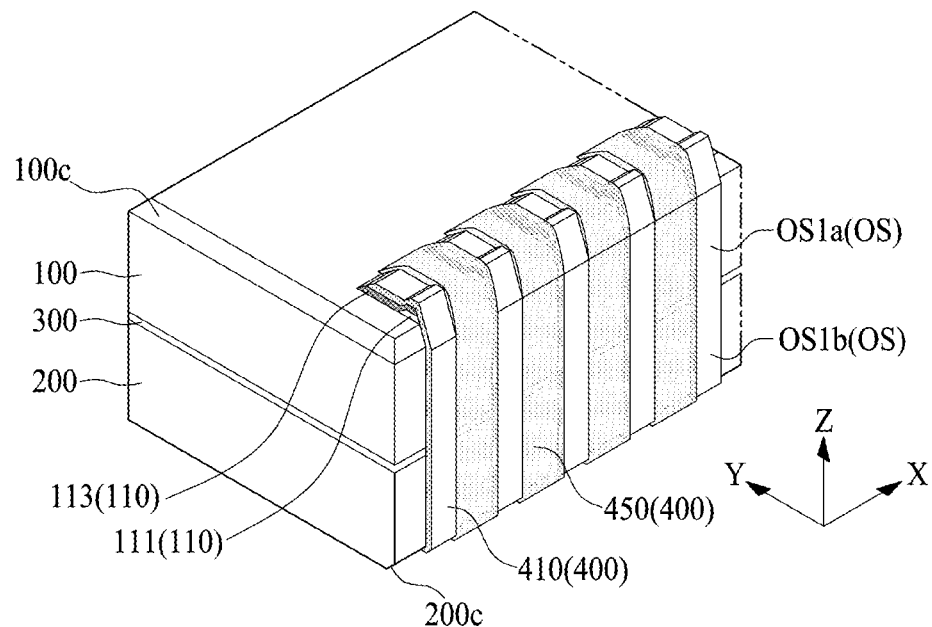
FIG. 14 is a diagram illustrating a display apparatus according to another embodiment of the present disclosure.

FIG. 14 is a diagram for describing a display apparatus according to another embodiment of the present disclosure, and illustrates an embodiment where a partition wall is additionally provided in a routing portion. In the following description, repeated descriptions of elements other than a partition wall and elements relevant thereto are omitted or will be briefly given.

Referring to FIG. 14, the display apparatus or a routing portion 400 according to another embodiment of the present disclosure may further include a plurality of partition walls 450.

The plurality of partition walls 450 may be disposed between the plurality of routing lines 410. For example, the plurality of partition walls 450 may be formed to surround a first outer surface OS1a and a first surface of a first substrate 100 and a second outer surface OS1b and a second surface of a second substrate 200, which are disposed between the plurality of routing lines 410. Each of the plurality of partition walls 450 may prevent electrical short circuit between the plurality of routing lines 410. Also, in a process of forming each of the plurality of routing lines 410, each of the plurality of partition walls 450 may prevent the migration of each of the plurality of routing lines 410, thereby preventing an electrical short circuit between adjacent routing lines 410 caused by the migration of each of the plurality of routing lines 410. For example, each of the plurality of partition walls 450 may be referred to as a side partition wall, a side bank, a line dam, an edge dam, or a side dam, or the like.

The plurality of partition walls 450 according to an embodiment of the present disclosure may have the same thickness (or height) as each of the plurality of routing lines 410, or may have a thickness (or a height) which is thicker than each of the plurality of routing lines 410. For example, a thickness of the routing line 410 may be less than or equal to the partition wall 450. For example, with respect to a lateral direction or a second direction Y of the display apparatus, an uppermost surface of the routing line 410 may be disposed on the same plane as an uppermost surface of the partition wall 450, or may be disposed between the first outer surface OS1a of the first substrate 100 and the uppermost surface of the partition wall 450.

The plurality of partition walls 450 may be formed by a printing process using an insulating paste. According to another embodiment of the present disclosure, each of the plurality of partition walls 450 may be formed by a transfer process of transferring an insulating paste pattern to a transfer pad including a ductile material to transfer an insulating paste pattern. For example, the insulating paste may include at least one of a light blocking material and an impact absorbing material. For example, the insulating paste may include the same material as the edge coating layer 430 described above with reference to FIGS. 7 and 9.

The plurality of partition walls 450 may be formed between a process of forming the secondary pad 113 illustrated in FIG. 13C and a process of forming the routing line 410 illustrated in FIG. 13D.

The plurality of partition walls 450 may be covered by the edge coating layer 430 described above with reference to FIGS. 7 and 9. For example, the edge coating layer 430 may be formed to surround each of the plurality of routing lines 410 and each of the plurality of partition walls 450.

The display apparatus according to another embodiment of the present disclosure may have an air bezel structure like the display apparatus described above with reference to FIGS. 1 to 13C, prevent a contact defect between a first pad and a routing line, and prevent an electrical short circuit defect between adjacent routing lines 410 by the plurality of partition walls 450.

Figure 15:
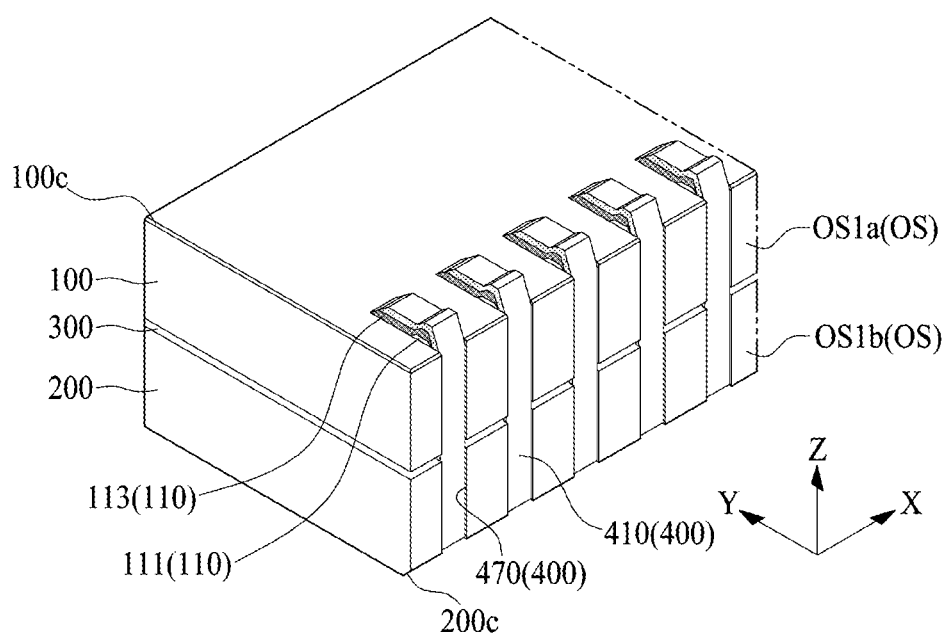
FIG. 15 is a diagram illustrating a display apparatus according to another embodiment of the present disclosure.

FIG. 15 is a diagram for describing a display apparatus according to another embodiment of the present disclosure, and thus, illustrates an embodiment implemented by modifying a configuration of each of a first substrate, a second substrate, and a routing portion. In the following description, repeated descriptions of elements other than modified elements are omitted or will be briefly given.

Referring to FIGS. 6, 7, and 15, the display apparatus according to another embodiment of the present disclosure may further include a plurality of grooves 470 which are disposed in each of an outer surface OS1a of a first substrate 100 and an outer surface OS1b of a second substrate 200.

Each of the plurality of grooves 470 may be formed to be concave from each of the outer surface OS1a of the first substrate 100 and the outer surface OS1b of the second substrate 200 corresponding to a region between a first pad part 110 of the first substrate 100 and a second pad part 210 of the second substrate 200. According to an embodiment of the present disclosure, each of the plurality of grooves 470 may be formed to be concave from each of the outer surface OS1a of the first substrate 100 and the outer surface OS1b of the second substrate 200 to have a first height (or a first depth).

The first substrate 100 may include a round portion (or a round chamfer portion) disposed at a corner portion between each of the plurality of grooves 470 and a first surface. Also, the first substrate 100 may further include a first chamfer 100c disposed at a corner portion between the first surface and the outer surface OS1a between the plurality of grooves 470.

The second substrate 200 may include a round portion (or a round chamfer portion) disposed at a corner portion between each of the plurality of grooves 470 and a second surface. Also, the second substrate 200 may further include a second chamfer 200c disposed at a corner portion between the second surface and the outer surface OS1b between the plurality of grooves 470.

The routing portion 400 according to the present embodiment may include a plurality of routing lines 410 which are disposed at each of the plurality of grooves 470 and are electrically coupled to each of the secondary pads 113 of the first pad part 110 and each of the second pads 211 of the second pad part 210 in a one-to-one relationship Each of the plurality of routing lines 410 may be disposed in or accommodated into a corresponding groove 470. For example, each of the plurality of routing lines 410 may be filled or buried into a corresponding groove 470. One side of each of the plurality of routing lines 410 may be electrically coupled to each of the secondary pads 113 of the first pad part 110. The other side of each of the plurality of routing lines 410 may be electrically coupled to each of the second pads 211 of the second pad part 210.

Each of the plurality of routing lines 410 may have a second height (or a thickness) corresponding to a first height (or a first depth) of each of the plurality of grooves 470. For example, a second height (or a thickness) of each of the plurality of routing lines 410 may be less than or equal to a first height (or a first depth) of each of the plurality of grooves 470. For example, a thickness of the routing line 410 may be less than or equal to a depth of the groove 470. For example, with respect to a lateral direction or a second direction Y of the display apparatus, an uppermost surface of the routing line 410 may be disposed on the same plane as the outer surface OS1a of the first substrate 100, or may be disposed between the outer surface OS1a of the first substrate 100 and a bottom surface of the groove 470.

Each of the outer surface OS1a of the first substrate 100 and the outer surface OS1b of the second substrate 200, exposed between the plurality of routing lines 410, and the plurality of routing lines 410 may be covered by the edge coating layer 430 described above with reference to FIGS. 7 and 9. For example, the edge coating layer 430 may be formed to surround each of the outer surface OS1a of the first substrate 100, the outer surface OS1b of the second substrate 200, and the plurality of routing lines 410.

FIGS. 16A to 16E are diagrams illustrating a method of forming a pad part and a routing portion in a display apparatus according to another embodiment of the present disclosure.

A method of forming a pad part and a routing portion according to another embodiment of the present disclosure will be described below with reference to FIGS. 16A to 16E.

Figure 16A:
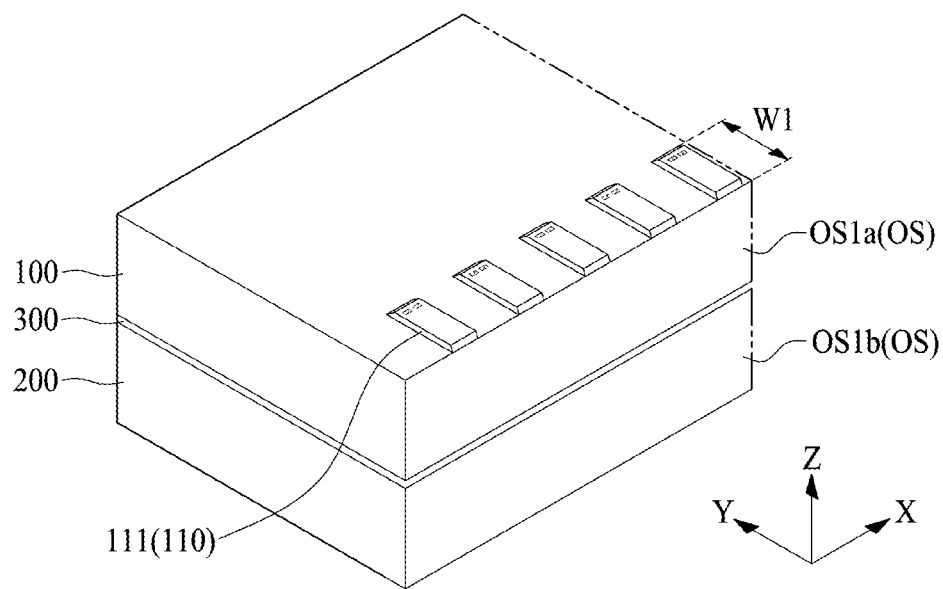
FIGS. 16A to 16E are diagrams illustrating a method of forming a pad part and a routing portion in a display apparatus according to another embodiment of the present disclosure.

As illustrated in FIGS. 6, 7, and 16A, each of a first substrate 100 including a first pad part 110 including a plurality of first pads 111 and a second substrate 200 including a plurality of second pads 211 may be manufactured. Here, the first pads 111 may have a first width (or length) W1 of 50 µm to 100 µm with respect to a lengthwise direction thereof or a second direction Y, but embodiments of the present disclosure are not limited thereto.

Subsequently, the first substrate 100 may be oppositebonded to the second substrate 200 by using a coupling member 300.

Figure 16B:
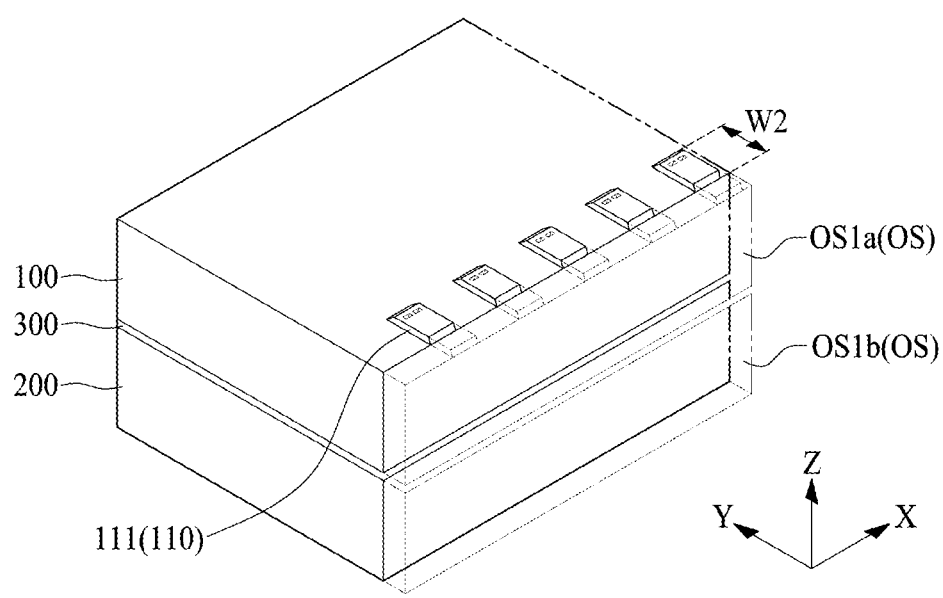

Subsequently, as illustrated in FIGS. 6, 7, and 16B, each of the outer surface OS1a of the first substrate 100, the outer surface OS1b of the second substrate 200, and one side of each of the first pads 111 may be simultaneously polished through a substrate polishing process. For example, the outer surface OS1a of the first substrate 100, the outer surface OS1b of the second substrate 200, and the one side of each of the first pads 111 may be polished so that the first pads 111 have a second width (or length) W2 of 20 µm to 50 µm with respect to a lengthwise direction thereof or the second direction Y, but embodiments of the present disclosure are not limited thereto.

Figure 16C:
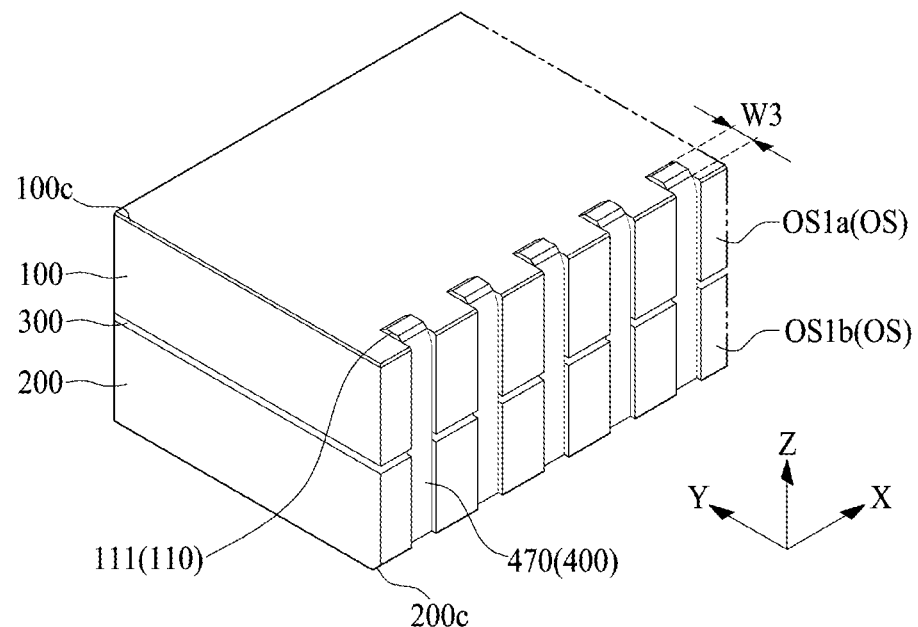

Subsequently, as illustrated in FIGS. 6, 7, and 16C, the plurality of grooves 470 may be formed in each of the outer surface OS1a of the first substrate 100 and the outer surface OS1b of the second substrate 200 corresponding to a region between the first pad part 110 of the first substrate 100 and the second pad part 210 of the second substrate 200 by using a scribing process. Also, each of one side of each of the first pads 111 adjacent to the outer surface OS1a of the first substrate 100 and one side of each of the second pads 211 adjacent to the outer surface OS1b of the second substrate 200 may be removed by using a scribing process. For example, the one side of each of the first pads 111 may be removed by a scribing process performed on a corner portion between the outer surface OS1a and the first surface of the first substrate 100. Likewise, the one side of each of the second pads 211 may be removed by using a scribing process performed on a corner portion between the outer surface OS1b and the second surface of the second substrate 200. For example, each of the one side of each of the first pads 111 and the one side of each of the second pads 211 may include a round portion which is rounded to have a curve shape having a certain curvature from the groove 470.

According to an embodiment of the present disclosure, the first pads 111 may have a third width (or length) W3 of 5 µm to 30 µm with respect to a lengthwise direction thereof or the second direction Y, but embodiments of the present disclosure are not limited thereto. In this case, each of the outer surface OS1a of the first substrate 100, the outer surface OS1b of the second substrate 200, the one side of each of the first pads 111, and the one side of each of the second pads 211 may be removed by a difference between the second width W2 and the third width W3 of the first pads 111 by a scribing process. Therefore, the first substrate 100 may include a round portion (or a round chamfer portion) which is disposed at a corner portion between each of the plurality of grooves 470 and the first surface. Also, the first substrate 100 may further include a first chamfer 100c which is disposed at a corner portion between the first surface and the outer surface OS1a between the plurality of grooves 470.

Additionally, the first chamfer 100c may be formed at a corner portion between a first surface (or a front surface) and the outer surface OS1a of the first substrate 100 exposed at a region between the plurality of grooves 470, and a second chamfer 200c may be formed at a corner portion between a second surface (or a rear surface) and the outer surface OS1b of the second substrate 200. For example, each of the first chamfer 100c and the second chamfer 200c may be formed by a substrate chamfering process using a cutting wheel, a polishing wheel, or a laser.

Figure 16D:
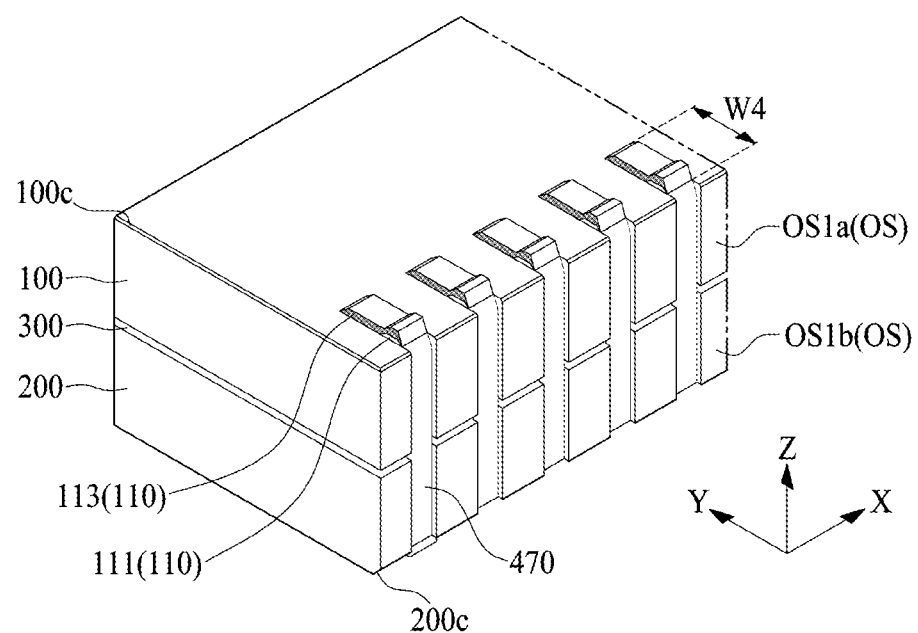

Subsequently, as illustrated in FIGS. 6, 7, and 16D, the plurality of secondary pads 113 may be respectively formed on the first pads 111 disposed on the first substrate 100. For example, the plurality of secondary pads 113 may respectively cover the plurality of first pads 111, and one end of each of the plurality of secondary pads 113 may be electrically and directly coupled to a corresponding first pad 111.

Each of the plurality of secondary pads 113 may have a line shape where the plurality of secondary pads 113 extend long in the second direction Y and are disposed spaced apart from one another in the first direction X or electrically decoupled from one another. For example, each of the plurality of secondary pads 113 may extend toward the inner portion of the display area AA from the outer surface OS of the first substrate 100 in the second direction Y.

Each of the plurality of secondary pads 113 may have a fourth width W4 which is relatively greater than the third width W3 of a corresponding first pad 111, or may have a length which is relatively longer than the corresponding first pad 111. For example, with respect to the lengthwise direction or the second direction Y, when each of the plurality of first pads 111 has a length of 5 µm to 30 µm, each of the plurality of secondary pads 113 may have a length of 50 µm to 150 µm, but embodiments of the present disclosure are not limited thereto.

Each of the plurality of secondary pads 113 according to an embodiment of the present disclosure may be implemented by a process which does not use a photo process and an etching process. For example, each of the plurality of secondary pads 113 may be implemented by a printing process using a conductive paste, a transfer process of transferring a conductive paste pattern to a transfer pad including a ductile material to transfer a conductive paste pattern, a metal deposition process using a mask, a metal deposition process using a masking member, or a metal deposition process using a mask and a laser scribing process described above with reference to FIG. 13C, but embodiments of the present disclosure are not limited thereto.

Figure 16E:
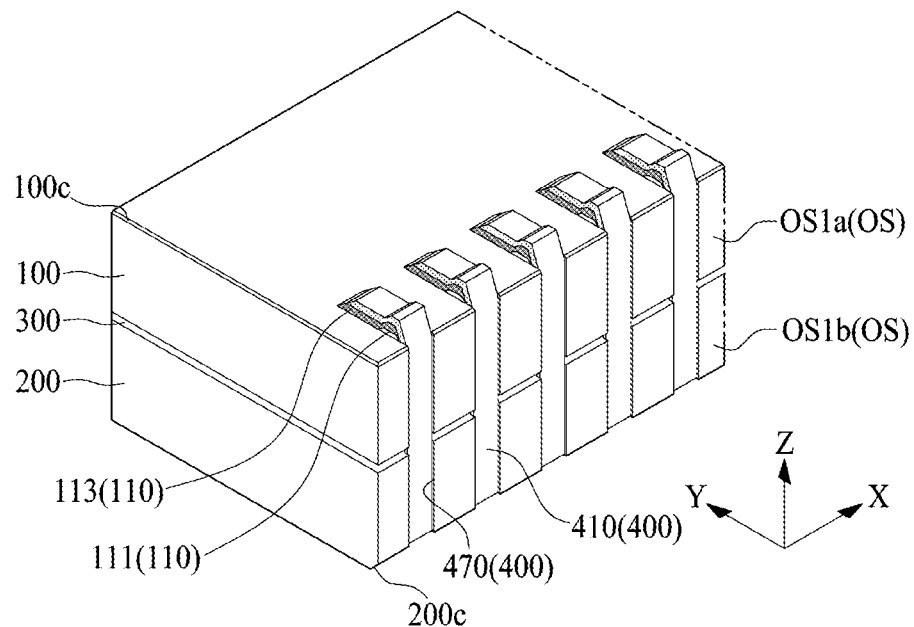

Subsequently, as illustrated in FIGS. 6, 7, and 16E, the plurality of routing lines 410 may be formed through a printing process using a conductive paste or a transfer process of transferring a conductive paste pattern to a transfer pad including a ductile material to transfer a conductive paste pattern.

Each of the plurality of routing lines 410 may be filled or buried into each of the plurality of grooves 470 and may be electrically coupled to each of the secondary pads 113 of the first pad part 110 and each of the second pads 211 of the second pad part 210 in a one-to-one relationship. A description of each of the plurality of routing lines 410 is the same as or similar to a description of the routing portion 400 illustrated in FIGS. 6, 7, and 9, and thus, their repetitive descriptions are omitted.

Subsequently, an edge coating layer surrounding all of the outer surface OS1a and the first pad part 110 of the first substrate 100, the outer surface OS1b and the second pad parts of the second substrate 200, and the plurality of routing lines 410 may be further formed. For example, the edge coating layer may be formed to surround only the one outer surface OS1a of the first substrate 100 and the one outer surface OS1b of the second substrate 200 or to surround all outer surfaces OS of each of the first and second substrates 100 and 200, and thus, their repetitive descriptions are omitted.

As described above, the display apparatus according to an embodiment of the present disclosure may have the air bezel structure like the display apparatus described above with reference to FIGS. 1 to 13C, and because the plurality of routing lines 410 are disposed in the plurality of grooves 470 disposed in each of the outer surface OS1a of the first substrate 100 and the outer surface OS1b of the second substrate 200, an electrical short circuit defect between adjacent routing lines 410 may be prevented and a distance between a center portion of an outermost pixel and the outer surface OS1a of the first substrate 100 may be reduced to less than half of a pixel pitch.

Figure 17:
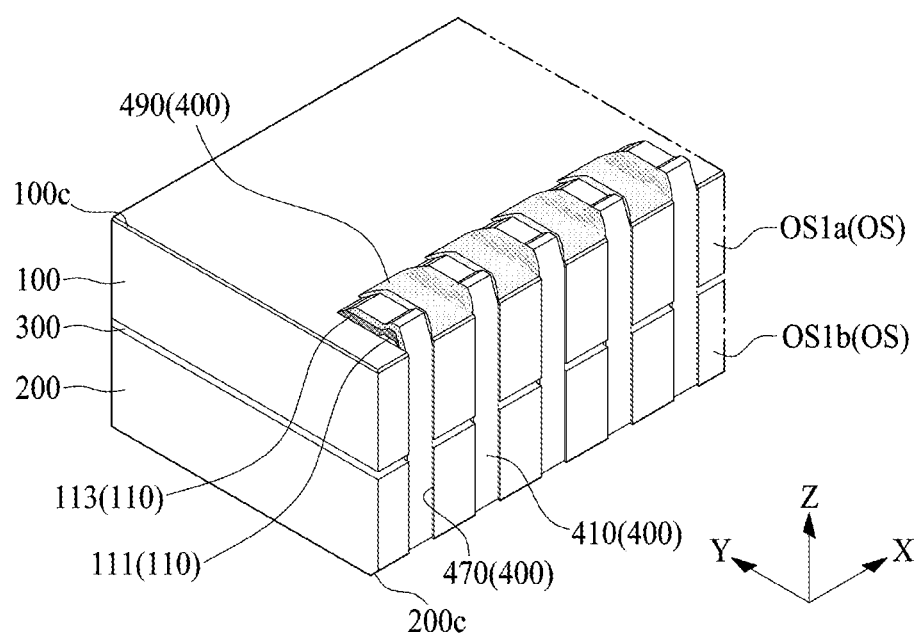
FIG. 17 is a diagram illustrating a display apparatus according to another embodiment of the present disclosure.

FIG. 17 is a diagram for describing a display apparatus according to another embodiment of the present disclosure and illustrates an embodiment implemented by adding a partition wall to a routing portion. In the following description, repeated descriptions of elements other than a partition wall and elements relevant thereto are omitted or will be briefly given.

Referring to FIGS. 6, 7, and 17, the display apparatus or a routing portion 400 according to another embodiment of the present disclosure may further include a plurality of partition walls 490.

The plurality of partition walls 490 may be disposed between the plurality of routing lines 410. For example, the plurality of partition walls 490 may be disposed on a first surface of the first substrate 100 between the plurality of secondary pads 113 disposed on the first surface of the first substrate 100. Each of the plurality of partition walls 490 may prevent electrical short circuit between the plurality of routing lines 410, on the first surface of the first substrate 100. Also, in a process of forming each of the plurality of routing lines 410, each of the plurality of partition walls 490 may prevent the migration of each of the plurality of routing lines 410, thereby preventing an electrical short circuit between adjacent routing lines 410 caused by the migration of each of the plurality of routing lines 410. For example, each of the plurality of partition walls 490 may be referred to as a side partition wall, a side bank, a line dam, an edge dam, or a side dam.

The plurality of partition walls 490 according to an embodiment of the present disclosure may be disposed on a second surface of the second substrate 200 between the plurality of second pads 211 disposed on the second surface of the second substrate 200. In this case, each of the plurality of partition walls 490 may prevent electrical short circuit between the plurality of routing lines 410, on the second surface of the second substrate 200.

The plurality of partition walls 490 according to an embodiment of the present disclosure may have the same thickness (or height) as each of the plurality of routing lines 410, or may have a thickness (or a height) which is thicker than each of the plurality of routing lines 410.

The plurality of partition walls 490 may be formed by a printing process using an insulating paste. According to another embodiment of the present disclosure, each of the plurality of partition walls 490 may be formed by a transfer process of transferring an insulating paste pattern to a transfer pad including a ductile material to transfer an insulating paste pattern. For example, the insulating paste may include at least one of a light blocking material and an impact absorbing material. For example, the insulating paste may include the same material as the edge coating layer 430 described above with reference to FIGS. 7 and 9.

The plurality of partition walls 490 may be formed between a process of forming the secondary pad 113 illustrated in FIG. 16D and a process of forming the routing line 410 illustrated in FIG. 16E.

The plurality of partition walls 490 may be covered by the edge coating layer 430 described above with reference to FIGS. 7 and 9. For example, the edge coating layer 430 may be formed to surround each of the plurality of routing lines 410 and each of the plurality of partition walls 490.

The display apparatus according to another embodiment of the present disclosure may have the air bezel structure like the display apparatus described above with reference to FIGS. 1 to 16D, prevent a contact defect between a first pad and a routing line, and prevent an electrical short circuit defect between adjacent routing lines 410 by the plurality of partition walls 490.

Additionally, in the display apparatus according to an embodiment of the present disclosure described above with reference to FIGS. 6 to 17, the secondary pad 113 and the routing portion 400 are not limited to a display apparatus including a light emitting device layer and may be identically applied to all flat display apparatuses including a liquid crystal display apparatus including a side routing line disposed on an outer surface of a display panel. This is obvious to those skilled in the art, and thus, their repetitive description are omitted.

Figure 18:
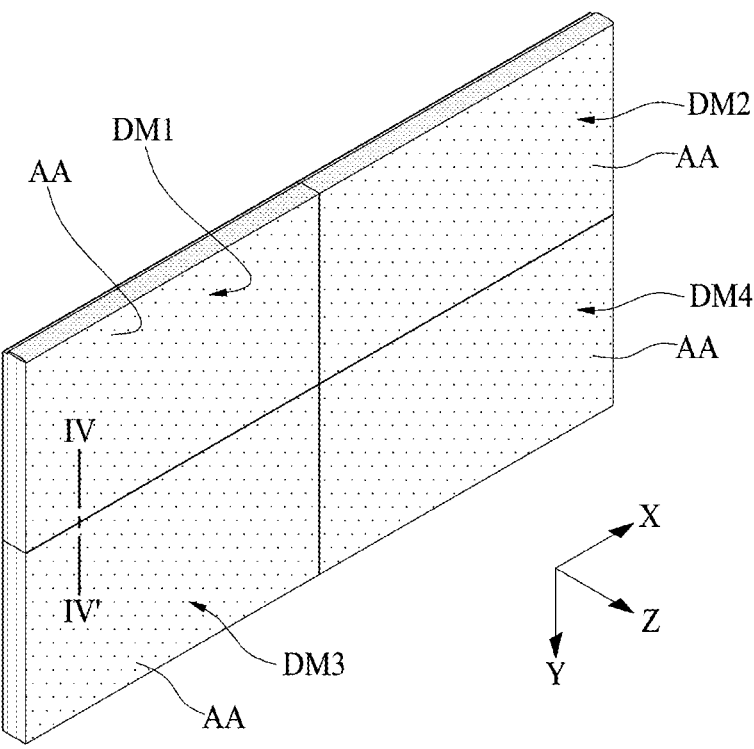
FIG. 18 is a diagram illustrating a multi-screen display apparatus according to an embodiment of the present disclosure.
Figure 19:
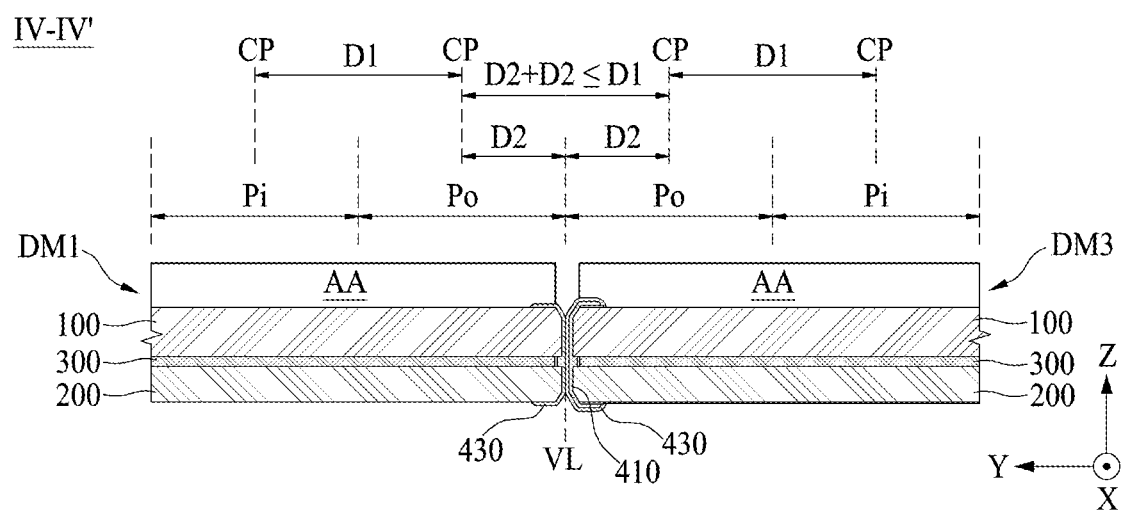
FIG. 19 is a cross-sectional view taken along line IV-IV' illustrated in FIG. 18.

FIG. 18 is a diagram illustrating a multi-screen display apparatus according to an embodiment of the present disclosure, and FIG. 19 is a cross-sectional view taken along line IV-IV' illustrated in FIG. 18. FIGS. 18 and 19 illustrate a multi-screen display apparatus implemented by tiling the display apparatus according to another embodiment of the present disclosure illustrated in FIGS. 1 to 17.

Referring to FIGS. 18 and 19, the multi-screen display apparatus (or a tiling display apparatus) according to an embodiment of the present disclosure may include a plurality of display devices DM1 to DM4.

The plurality of display devices DM1 to DM4 may each display an individual image or may divisionally display one image. Each of the plurality of display devices DM1 to DM4 may include the display apparatus according to an embodiment of the present disclosure illustrated in FIGS. 1 to 17, and thus, their repetitive descriptions are omitted or will be briefly given.

The plurality of display devices DM1 to DM4 may be tiled on a separate tiling frame to contact each other at a lateral surface thereof. For example, the plurality of display devices DM1 to DM4 may be tiled to have an N×M form, thereby implementing a multi-screen display apparatus having a large screen. For example, N is a positive integer of 1 or more and M is a positive integer of 2 or more, but embodiments of the present disclosure are not limited thereto, for example, N is a positive integer of 2 or more and M is a positive integer of 1 or more.

Each of the plurality of display devices DM1 to DM4 may not include a bezel area (or a non-display portion) surrounding all of a display area AA where an image is displayed, and may have an air-bezel structure where the display area AA is surrounded by air. For example, in each of the plurality of display devices DM1 to DM4, all of a first surface of a first substrate 100 may be implemented as the display area AA.

According to the present embodiment, in each of the plurality of display devices DM1 to DM4, a second interval D2 between a center portion CP of an outermost pixel Po and an outermost outer surface OS of the first substrate 100 may be implemented to be half or less of a first interval D1 (or a pixel pitch) between adjacent pixels. Accordingly, in two adjacent display devices DM1 to DM4 coupled to (or contacting) each other at lateral surfaces thereof along the first direction X and the second direction Y based on a lateral coupling manner, an interval "D2+D2" between adjacent outermost pixel areas PAo may be equal to or less than the first interval D1 between two adjacent pixels. Referring to FIG. 19, in first and third display devices DM1 and DM3 coupled to (or contacting) each other at lateral surfaces thereof along the second direction Y, the interval "D2+D2" between a center portion CP of an outermost pixel Po of the first display device DM1 and a center portion CP of an outermost pixel Po of the third display device DM3 may be equal to or less than the first interval D1 (or a pixel pitch) between two adjacent pixels disposed in each of the first and third display devices DM1 and DM3.

Therefore, the interval "D2+D2" between center portions CP of outermost pixels Po of two adjacent display devices DM1 to DM4 coupled to (or contacting) each other at lateral surfaces thereof along the first direction X and the second direction Y may be equal to or less than the first interval D1 between two adjacent pixels disposed in each of the display devices DM1 to DM4, and thus, there may be no seam or boundary portion between two adjacent display devices DM1 to DM4, whereby there may be no dark area caused by a boundary portion provided between the display devices DM1 to DM4. As a result, the image displayed on the multi-screen display apparatus in which the plurality of display devices DM1, DM2, DM3, and DM4 are tiled in an N×M form may be displayed continuously without a sense of disconnection (or discontinuity) at boundary portion between the plurality of display devices DM1, DM2, DM3, and DM4.

In FIGS. 18 and 19, it is illustrated that the plurality of display devices DM1 to DM4 are tiled in a 2×2 form, but embodiments of the present disclosure are not limited thereto, and the plurality of display devices DM1 to DM4 may be tiled in an x×1 form, a 1×y form, or an x×y form. For example, in the x×1 form, x may be a natural number greater than or equal to 2, in the 1×y form, y may be a natural number greater than or equal to 2, and in the x×y form, x and y may be natural numbers greater than or equal to 2 and may be equal to or different from each other. For example, in the x×y form, x may be a natural number greater than or equal to 2 and may be equal to y, or x and y may be natural numbers greater than or equal to 2 with y greater or less than x.

As described above, when display area AA of each of the plurality of display devices DM1 to DM4 is one screen and displays one image, a multi-screen display apparatus according to an embodiment of the present disclosure may display an image which is not disconnected and is continuous at a boundary portion between the plurality of display devices DM1 to DM4, and thus, the immersion of a viewer watching an image displayed by the multi-screen display apparatus may be enhanced.

A display apparatus and multi-screen display apparatus including the same according to an embodiment of the present disclosure will be described below.

A display apparatus according to an embodiment of the present disclosure may comprise a display area including a plurality of pixels arranged at a first substrate along a first direction and a second direction that is different from the first direction, a plurality of pixel driving lines disposed in the display area and coupled respectively to the plurality of pixels, an insulation layer covering the plurality of pixel driving lines, and a first pad part disposed over the insulation layer and electrically coupled to the plurality of pixel driving lines, respectively, wherein the first pad part may comprise a plurality of first pads electrically coupled to each respective pixel driving line of the plurality of pixel driving lines through respective contact holes formed in the insulation layer, and a plurality of secondary pads respectively covering the plurality of first pads.

According to some embodiments of the present disclosure, each of the plurality of secondary pads may be directly coupled to a corresponding first pad and may have a length which is longer than the corresponding first pad in the second direction.

According to some embodiments of the present disclosure, each of the plurality of first pads may have a length of 5 μm to 50 μm in the second direction, and each of the plurality of secondary pads may have a length of 50 μm to 150 μm in the second direction.

According to some embodiments of the present disclosure, the display apparatus may further comprise a routing portion including a plurality of routing lines disposed at an outer surface of the first substrate and electrically coupled to each of the plurality of secondary pads.

According to some embodiments of the present disclosure, the display apparatus may further comprise a second substrate coupled to the first substrate by a coupling member and including a plurality of second pads aligned with each of the plurality of first pads, and a routing portion surrounding an outer surface of the first substrate and an outer surface of the second substrate and including a plurality of routing lines electrically coupled to each of the plurality of secondary pads and the plurality of second pads in a one-to-one relationship.

According to some embodiments of the present disclosure, the display apparatus may further comprise an edge coating layer surrounding the outer surface of the first substrate, the outer surface of the second substrate, and the plurality of routing lines.

According to some embodiments of the present disclosure, a first outer surface of each of the first and second substrates may comprise the plurality of routing lines and the edge coating layer, and second to fourth outer surfaces, other than the first outer surface, of each of the first and second substrates may comprise only the edge coating layer.

According to some embodiments of the present disclosure, the display apparatus may further comprise a partition wall disposed between the plurality of routing lines.

According to some embodiments of the present disclosure, the partition wall may be disposed at the outer surface of the first substrate and the outer surface of the second substrate corresponding to a region between the plurality of routing lines.

According to some embodiments of the present disclosure, a thickness of each of the plurality of routing lines may be less than or equal to a height of the partition wall.

According to some embodiments of the present disclosure, the display apparatus may further comprise an edge coating layer surrounding the plurality of routing lines and the partition wall.

According to some embodiments of the present disclosure, the display apparatus may further comprise a plurality of grooves disposed to be concave from each of the outer surface of the first substrate and the outer surface of the second substrate, the plurality of routing lines may be respectively disposed at the plurality of grooves.

According to some embodiments of the present disclosure, the display apparatus may further comprise a partition wall disposed between the plurality of secondary pads.

According to some embodiments of the present disclosure, the display apparatus may further comprise an edge coating layer surrounding the first outer surface of the first substrate, the first outer surface of the second substrate, the plurality of routing lines, and the partition wall.

According to some embodiments of the present disclosure, the first pad part may be configured to disposed within an outmost pixel of the plurality of pixels.

According to some embodiments of the present disclosure, a size of the display area may be the same as a size of the first substrate.

According to some embodiments of the present disclosure, the second substrate may include a metal pattern layer coupled to the routing portion, and a rear insulation layer insulating the metal pattern layer and including an isolation pattern area.

According to some embodiments of the present disclosure, the rear insulation layer may include a plurality of inorganic insulation layers, and the isolation pattern area may be configured to include a single-layer inorganic layer structure having only one inorganic insulation layer of the plurality of inorganic insulation layers, and a non-isolation pattern area except for the isolation pattern area may be configured to include a multi-layer inorganic layer structure having all of the plurality of inorganic insulation layers.

A multi-screen display apparatus according to an embodiments of the present disclosure may comprise a plurality of display devices disposed along at least one direction of a first direction and a second direction that is different from the first direction, each of the plurality of display devices may comprise the display apparatus, the display apparatus may comprise a display area including a plurality of pixels arranged at a first substrate along the first direction or/and the second direction, a plurality of pixel driving lines disposed in the display area and coupled respectively to the plurality of pixels, an insulation layer covering the plurality of pixel driving lines, and a first pad part disposed over the insulation layer and electrically coupled to the plurality of pixel driving lines, respectively, wherein the first pad part comprises a plurality of first pads electrically coupled to each respective pixel driving line of the plurality of pixel driving lines through respective contact holes formed in the insulation layer, and a plurality of secondary pads respectively covering the plurality of first pads.

According to some embodiments of the present disclosure, in a first display device and a second display device adjacent along each of the first direction and the second direction, a distance between a center portion of an outermost pixel of the first display device and a center portion of an outermost pixel of the second display device may be less than or equal to a pixel pitch, and the pixel pitch may be a distance between center portions of pixels adjacent along the first direction and the second direction.

A display apparatus according to an embodiments of the present disclosure may comprise a first display device and a second display device positioned adjacent to each other along a first direction, each of the first and second display devices includes a display area including a plurality of pixels positioned on a first substrate, the plurality of pixels arraigned having pixels extending in the first direction and pixels extending in a second direction that is different from the first direction; a pixel driving line disposed in the display area and coupled at least some of the plurality of pixels; an insulation layer covering the pixel driving line; a contact hole formed in the insulation layer; and a first pad assembly disposed over the insulation layer and positioned over the contact hole to be electrically coupled to the pixel driving line, wherein the first pad assembly includes a first pad directly coupled to the pixel driving line through contact hole formed in the insulation layer; and a second pad directly coupled to and overlying the first pad.

According to some embodiments of the present disclosure, the pixels are positioned on a first surface of the first substrate and further including a second substrate that has a front surface coupled to a second surface of the first substrate, opposite the first surface of the first substrate.

According to some embodiments of the present disclosure, the pixels are positioned on a first surface of the first substrate; and each of the first display device and the second display device further includes a second substrate that has a front surface coupled to a second surface of the first substrate, opposite the first surface of the first substrate.

According to some embodiments of the present disclosure, each of the first display device and the second display device further includes a first routing line electrically coupled to the second pad on the first display, the routing line extending along a sidewall of the first display device; and a second routing line electrically coupled to the second pad on the second display, the second routing line extending along a sidewall of the second display device, the first routing line and second routing line are directly connected to each other.

According to some embodiments of the present disclosure, each of the first display device and the second display device further includes an second pad assembly positioned on the second substrate; and the first routing line extends from the first pad assembly to the second pad assembly to electrically couple the first and second pad assemblies to each other.

According to some embodiments of the present disclosure, each of the first display device and the second display device further includes a driving circuit coupled to rear surface of the second substrate, the rear surface being opposite the front surface.

According to some embodiments of the present disclosure, each of the first display device and the second display device further includes a dam positioned between an opening area of the outer most pixel and the first pad assembly.

The display apparatus according to an embodiment of the present disclosure may be applied to all electronic devices including a display panel. For example, the display apparatus according to an embodiment of the present disclosure may be applied to mobile apparatuses, video phones, smart watches, watch phones, wearable apparatuses, foldable apparatuses, rollable apparatuses, bendable apparatuses, flexible apparatuses, curved apparatuses, electronic organizers, electronic books, portable multimedia players (PMPs), personal digital assistants (PDAs), MP3 players, mobile medical apparatuses, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, home appliances, etc.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus comprising:
a display area including a plurality of pixels arranged on a first substrate, the plurality of pixels extending in a first direction and in a second direction that is different from the first direction;
a plurality of pixel driving lines disposed in the display area and coupled respectively to the plurality of pixels;
an insulation layer covering the plurality of pixel driving lines;
a first pad part disposed over the insulation layer and electrically coupled to the plurality of pixel driving lines, respectively, wherein the first pad part comprises:
a plurality of first pads electrically coupled to each respective pixel driving line of the plurality of pixel driving lines through respective contact holes formed in the insulation layer; and
a plurality of secondary pads respectively covering the plurality of first pads; and
a routing portion including a plurality of routing lines disposed at a first outer surface of the first substrate and electrically coupled to each of the plurality of secondary pads.

2. The display apparatus of claim 1, wherein each of the plurality of secondary pads is directly coupled to a corresponding first pad and has a length which is longer than the corresponding first pad in the second direction.

3. The display apparatus of claim 1, further comprising:
a second substrate coupled to the first substrate by a coupling member, the second substrate including a plurality of second pads aligned with each of the plurality of first pads,
wherein the routing portion is configured to surround the first outer surface of the first substrate and a first outer surface of the second substrate, and
wherein the plurality of routing lines are electrically coupled to each of the plurality of first pads and each of the plurality of second pads in a one-to-one relationship.

4. The display apparatus of claim 3, further comprising an edge coating layer surrounding the first outer surface of the first substrate, the first outer surface of the second substrate, and the plurality of routing lines.

5. The display apparatus of claim 4,
wherein the first outer surface of each of the first and second substrates includes the plurality of routing lines and the edge coating layer, and
wherein second, third and fourth outer surfaces of each of the first and second substrates includes only the edge coating layer.

6. The display apparatus of claim 3, further comprising a partition wall disposed between the plurality of routing lines on the first outer surface of the first substrate and the first outer surface of the second substrate.

7. The display apparatus of claim 3, further comprising a plurality of grooves disposed to be concave from each of the first outer surface of the first substrate and the first outer surface of the second substrate,
wherein the plurality of routing lines are respectively disposed at the plurality of grooves.

8. The display apparatus of claim 7, further comprising a partition wall disposed between the plurality of secondary pads.

9. The display apparatus of claim 1, wherein the first pad part is configured to be disposed within one or more-outmost pixels of the plurality of pixels.

10. A display apparatus, comprising:
a display area including a plurality of pixels arranged on a first substrate, the plurality of pixels extending in a first direction and in a second direction that is different from the first direction, wherein a width and length of the display area is the same as a width and length of the first substrate;
a plurality of pixel driving lines disposed in the display area and coupled respectively to the plurality of pixels;
an insulation layer covering the plurality of pixel driving lines; and
a first pad part disposed over the insulation layer and electrically coupled to the plurality of pixel driving lines, respectively, wherein the first pad part comprises:
a plurality of first pads electrically coupled to each respective pixel driving line of the plurality of pixel driving lines through respective contact holes formed in the insulation layer; and
a plurality of secondary pads respectively covering the plurality of first pads.

11. The display apparatus of claim 10, further comprising:
a second substrate coupled to the first substrate, the second substrate including:
a metal pattern layer coupled to the routing portion; and
a rear insulation layer insulating the metal pattern layer and including an isolation pattern area.

12. The display apparatus of claim 11,
wherein the rear insulation layer includes a plurality of inorganic insulation layers, and
wherein the isolation pattern area is configured to include a single-layer inorganic layer structure having only one inorganic insulation layer of the plurality of inorganic insulation layers, and wherein a non-isolation pattern area except for the isolation pattern area is configured to include a multi-layer inorganic layer structure having all of the plurality of inorganic insulation layers.

13. A display apparatus comprising:
a first display device and a second display device positioned adjacent to each other along a first direction,
wherein each of the first and second display devices includes:
  a display area including a plurality of pixels positioned on a first substrate, the plurality of pixels arraigned having pixels extending in the first direction and pixels extending in a second direction that is different from the first direction;
  a pixel driving line disposed in the display area and coupled at least some of the plurality of pixels;
  an insulation layer covering the pixel driving line;
  a contact hole formed in the insulation layer; and
  a first pad assembly disposed over the insulation layer and positioned over the contact hole to be electrically coupled to the pixel driving line,
  wherein the first pad assembly includes:
    a first pad directly coupled to the pixel driving line through contact hole formed in the insulation layer; and
    a second pad directly coupled to and overlying the first pad.

14. The display apparatus of claim 13,
wherein in the first display device and the second display device adjacent to each other along the first direction, a distance between a center portion of an outermost pixel of the first display device and a first pixel adjacent to the outermost pixel along the first direction is less than distance between the first pixel and a second pixel that is adjacent to the first pixel along the first direction.

15. The display apparatus of claim 13, wherein the pixels are positioned on a first surface of the first substrate; and
wherein each of the first display device and the second display device further includes a second substrate that has a front surface coupled to a second surface of the first substrate, opposite the first surface of the first substrate.

16. The display apparatus of claim 15, wherein each of the first display device and the second display device further includes:
  a first routing line electrically coupled to the second pad on the first display, the routing line extending along a sidewall of the first display device; and
  a second routing line electrically coupled to the second pad on the second display, the second routing line extending along a sidewall of the second display device,
  wherein the first routing line and second routing line are directly connected to each other.

17. The display apparatus of claim 15, wherein each of the first display device and the second display device further includes:
  a second pad assembly positioned on the second substrate; and
  wherein the first routing line extends from the first pad assembly to the second pad assembly to electrically couple the first and second pad assemblies to each other.

18. The display apparatus of claim 15, wherein each of the first display device and the second display device further includes a driving circuit coupled to a rear surface of the second substrate, the rear surface being opposite the front surface.

19. The display apparatus of claim 13, wherein each of the first display device and the second display device further includes a dam positioned between an opening area of the outer most pixel and the first pad assembly.

20. The display apparatus of claim 10, further comprising:
  a routing portion including a plurality of routing lines disposed at a first outer surface of the first substrate and electrically coupled to each of the plurality of secondary pads.

* * * * *